(12) United States Patent  (10) Patent No.: US 8,884,317 B2
Inoue et al. (45) Date of Patent: Nov. 11, 2014

(54) SEMICONDUCTOR LIGHT-EMITTING DEVICE

(71) Applicant: Panasonic Corporation, Osaka (JP)

(72) Inventors: Akira Inoue, Osaka (JP); Toshiya Yokogawa, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/068,220

(22) Filed: Oct. 31, 2013

(65) Prior Publication Data

US 2014/0054623 A1   Feb. 27, 2014

Related U.S. Application Data

(63) Continuation of application No. PCT/JP2013/003564, filed on Jun. 6, 2013.

(30) Foreign Application Priority Data

Aug. 10, 2012  (JP) ................................. 2012-177944

(51) Int. Cl.
   *H01L 33/00*   (2010.01)
   *H01L 21/00*   (2006.01)
(52) U.S. Cl.
   USPC .............................................. 257/89; 438/31
(58) Field of Classification Search
   USPC .......................................... 438/29–32, 69–72; 257/E33.055–E33.059, 13, 89
   See application file for complete search history.

(56) References Cited

U.S. PATENT DOCUMENTS

| 6,355,946 | B1* | 3/2002 | Ishinaga | ........................ 257/98 |
| 7,429,759 | B2* | 9/2008 | Isokawa | ........................ 257/100 |
| 2006/0163602 | A1 | 7/2006 | Isokawa | |
| 2008/0258156 | A1 | 10/2008 | Hata | |
| 2008/0283492 | A1 | 11/2008 | Takemoto et al. | |

(Continued)

FOREIGN PATENT DOCUMENTS

| JP | 2000-296551 A | 10/2000 | |
| JP | 2003046137 | * 7/2001 | .............. H01L 33/00 |

(Continued)

OTHER PUBLICATIONS

International Search Report for International Application No. PCT/JP2013/003564 dated Aug. 10, 2012.

(Continued)

*Primary Examiner* — Calvin Lee
(74) *Attorney, Agent, or Firm* — Renner, Otto, Boisselle & Sklar, LLP

(57) ABSTRACT

A semiconductor light-emitting device includes: a semiconductor chip having a nonpolar plane as a growth surface and configured to emit polarized light; and a reflector having a reflective surface. When a plane forming an angle of 45° relative to a direction of polarization of the polarized light is a plane $L_{45}$, the reflective surface of the reflector reflects at least a part of light in the plane $L_{45}$ in a normal line direction of the growth surface of the semiconductor light-emitting chip. The reflector includes a plurality of reflective surfaces, the plurality of reflective surfaces are arranged in a shape of a square in plan view, and when an angle between the direction of polarization of the polarized light and one side of the shape formed by the plurality of reflective surfaces is θ2, the angle θ2 is not less than 17° and not more than 73°.

18 Claims, 36 Drawing Sheets

(56) References Cited

U.S. PATENT DOCUMENTS

| | | |
|---|---|---|
| 2009/0001409 A1 | 1/2009 | Takano et al. |
| 2009/0050917 A1 | 2/2009 | Nakagawa et al. |
| 2009/0272978 A1 | 11/2009 | Liu et al. |
| 2011/0073939 A1 | 3/2011 | Mikasa |
| 2011/0211348 A1 | 9/2011 | Kim |
| 2012/0091490 A1 | 4/2012 | Fujikane et al. |
| 2013/0126900 A1 | 5/2013 | Inoue et al. |

FOREIGN PATENT DOCUMENTS

| | | |
|---|---|---|
| JP | 2005-150624 A | 6/2005 |
| JP | 2008-109098 A | 5/2008 |
| JP | 2009-038293 A | 2/2009 |
| JP | 2009-055066 A | 3/2009 |
| JP | 2009-088353 A | 4/2009 |
| JP | 2010-238837 A | 10/2010 |
| JP | 2011-077185 A | 4/2011 |
| WO | WO 2012/020559 A1 | 2/2012 |

OTHER PUBLICATIONS

Written Opinion for International Application No. PCT/JP2013/003564 mailed Jul. 2, 2013.

English translation of International Search Report for International Application No. PCT/JP2013/003564 mailed Jul. 2, 2013 (previously submitted on Oct. 31, 2013).

\* cited by examiner

POLARIZATION DIRECTION OF LIGHT

X-X'

X-X'

POLARIZATION DIRECTION OF LIGHT

*m*-PLANE C2 WITHOUT PROTRUSION/RECESS STRUCTURE (W/sr) *m*-PLANE C2 WITHOUT PROTRUSION/RECESS STRUCTURE

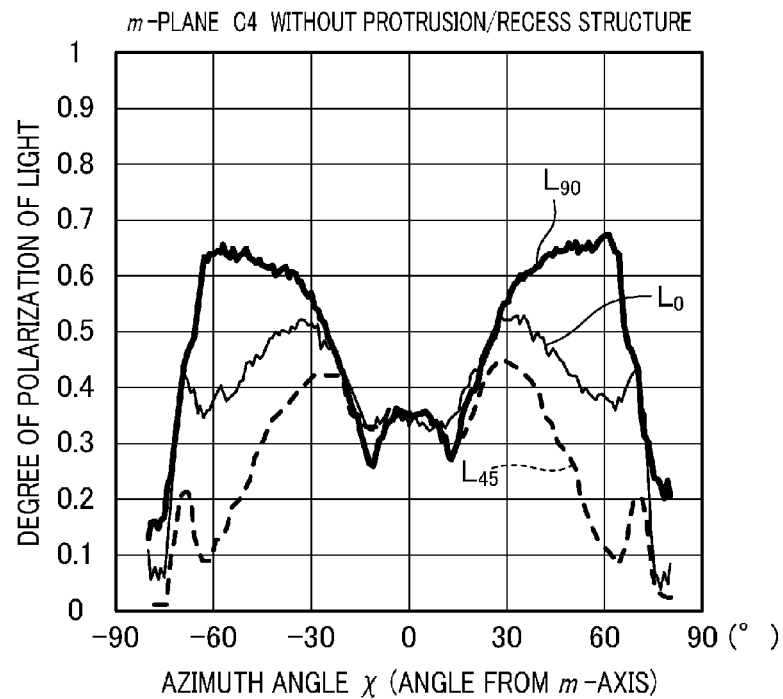
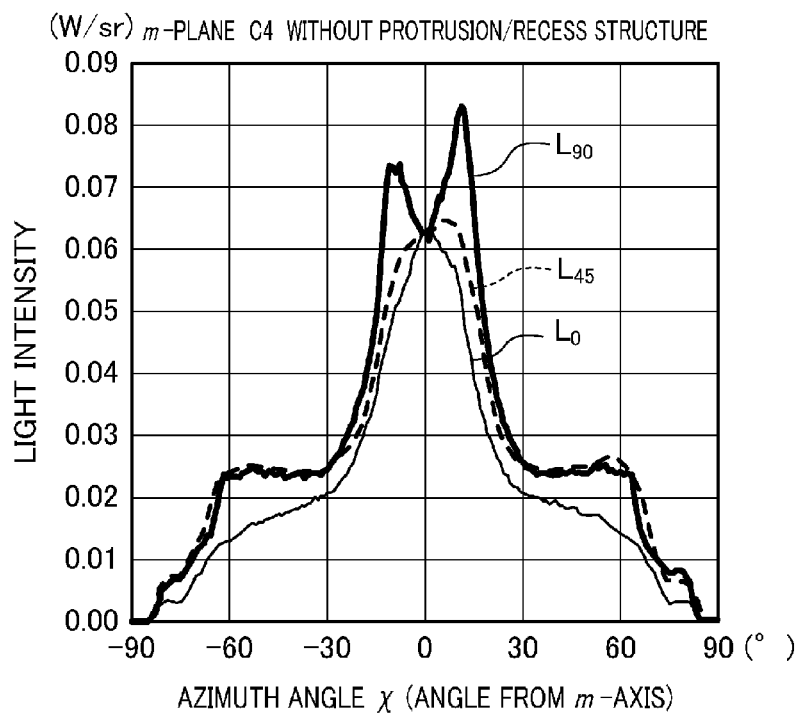

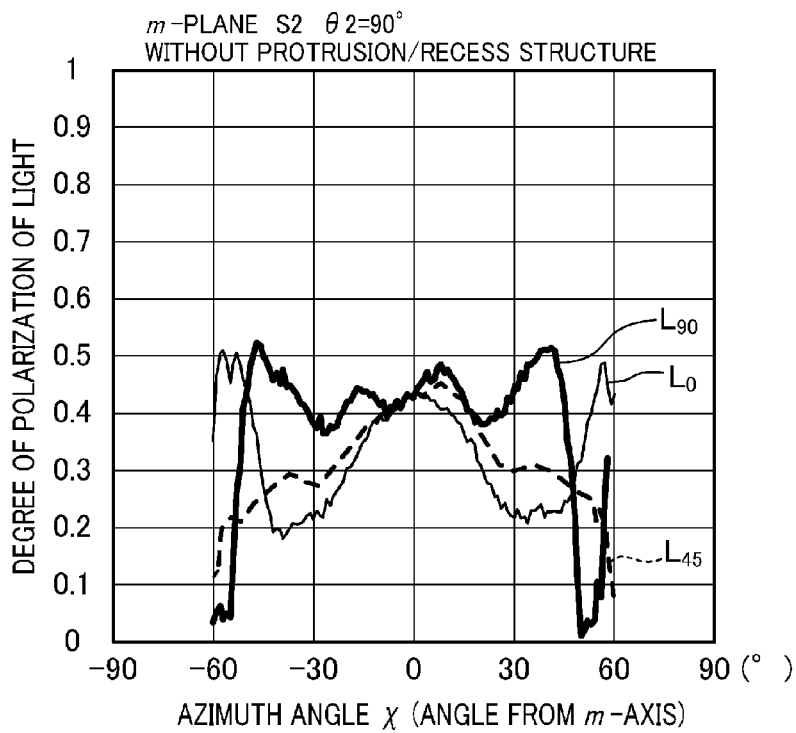
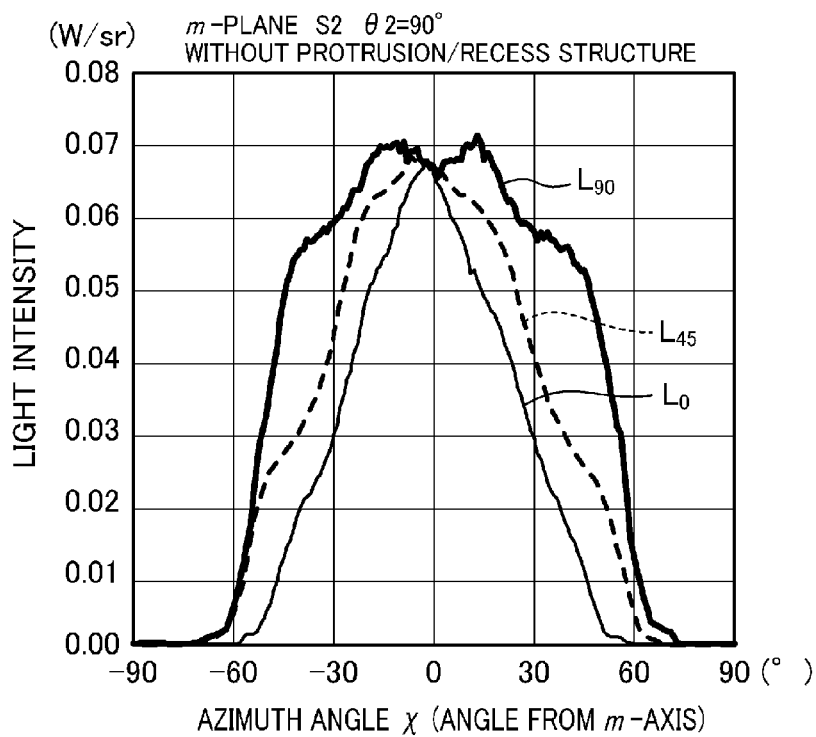

m-PLANE WITHOUT REFLECTOR
WITHOUT PROTRUSION/RECESS STRUCTURE m-PLANE WITHOUT REFLECTOR
WITHOUT PROTRUSION/RECESS STRUCTURE

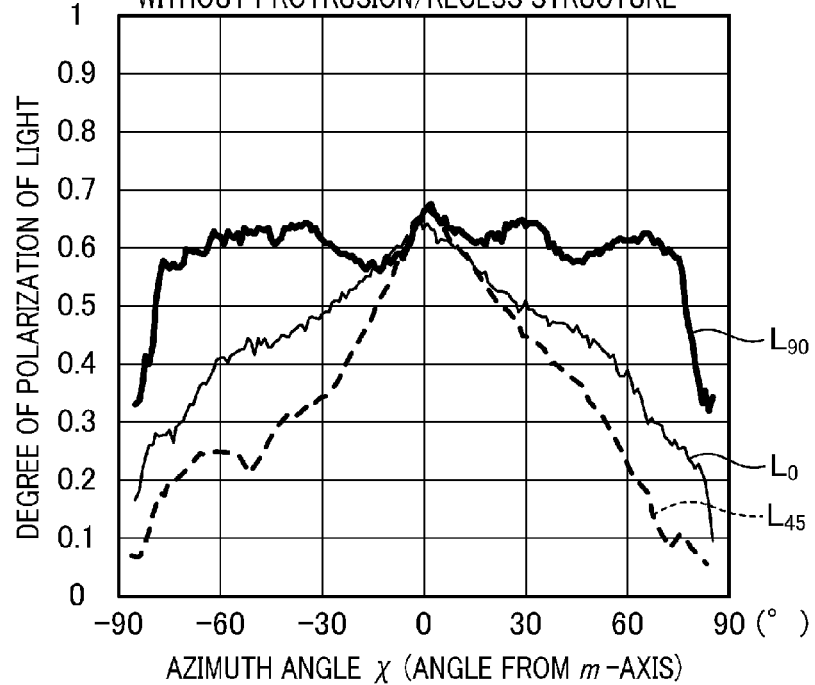
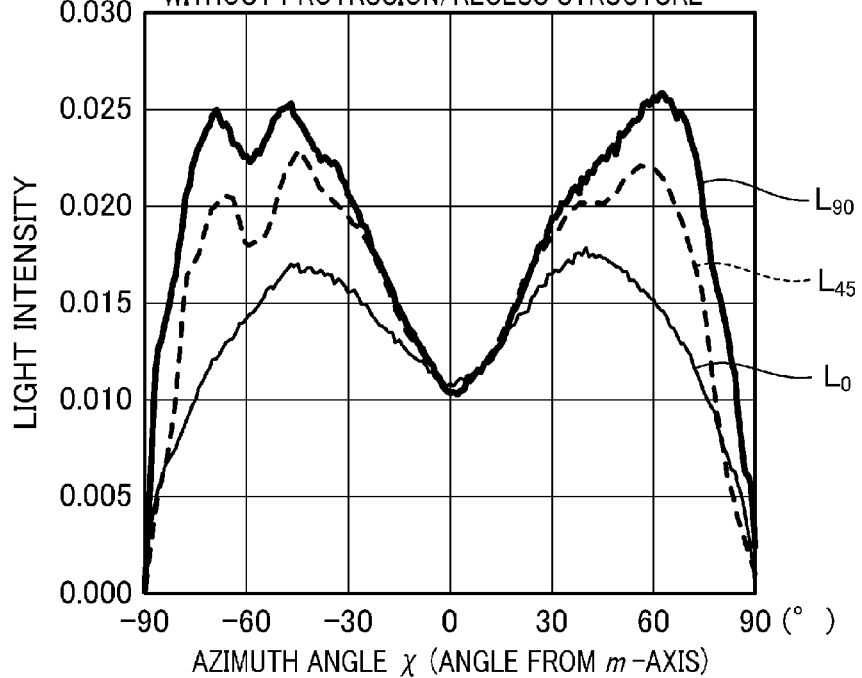

SEMICONDUCTOR LIGHT-EMITTING DEVICE

CROSS-REFERENCE TO RELATED APPLICATIONS

This is a continuation of International Application No. PCT/JP2013/003564 filed on Jun. 6, 2013, which claims priority to Japanese Patent Application No. 2012-177944 filed on Aug. 10, 2012. The entire disclosures of these applications are incorporated by reference herein.

BACKGROUND

The present invention relates to semiconductor light-emitting devices including a semiconductor light-emitting chip having a growth surface of a nonpolar plane or a semipolar plane and which emits polarized light, and a reflection member which has a reflective surface reflecting the polarized light.

Nitride semiconductors containing nitrogen (N) as a group V element have been expected as a material of a short wavelength light-emitting element because of their band gap size. Gallium nitride-based compound semiconductors, in particular, have been actively researched, and blue light-emitting diodes (LEDs), green LEDs, and blue semiconductor laser diodes that use a gallium nitride-based compound semiconductor have been also commercialized.

Gallium nitride-based compound semiconductors include a compound semiconductor obtained by substituting at least one of aluminum (Al) or indium (In) for part of gallium (Ga). Such a nitride semiconductor is represented by the general formula $Al_xGa_yIn_zN$ (where $0 \leq x<1, 0<y \leq 1, 0 \leq z<1$, and $x+y+z=1$). The gallium nitride-based compound semiconductors are hereinafter referred to as GaN-based semiconductors.

When Al is substituted for Ga in a GaN-based semiconductor, this allows the band gap of the GaN-based semiconductor to be wider than that of GaN. When In is substituted for Ga in a GaN-based semiconductor, this allows the band gap of the GaN-based semiconductor to be narrower than that of GaN. Thus, not only short wavelength light, such as blue or green light, but also long wavelength light, such as orange or red light, can be emitted. From such a feature, nitride semiconductor light-emitting elements have been expected to be used for, e.g., image display devices and lighting devices.

Nitride semiconductors have a wurtzite crystal structure. In FIGS. 1A, 1B, and 1C, the plane orientations of the wurtzite crystal structure are expressed in four-index notation (hexagonal indices). In four-index notation, crystal planes and the orientations of the planes are expressed using primitive vectors expressed as a1, a2, a3, and c. The primitive vector c extends in a [0001] direction, and an axis in this direction is referred to as a "c-axis." A plane perpendicular to the c-axis is referred to as a "c-plane" or a "(0001) plane." FIG. 1A illustrates, not only the c-plane, but also an a-plane (=(11-20) plane) and an m-plane (=(1-100) plane). FIG. 1B illustrates an r-plane (=(1-102) plane), and FIG. 1C illustrates a (11-22) plane. Herein, the symbol "-" attached to the left of one of parenthesized numbers indicating the Miller indices expediently indicates inversion of the number.

FIG. 2A illustrates a crystal structure of a GaN-based semiconductor using a ball-and-stick model. FIG. 2B is a ball-and-stick model obtained by observing atomic arrangement in the vicinity of the m-plane surface from an a-axis direction. The m-plane is perpendicular to the plane of the paper of FIG. 2B. FIG. 2C is a ball-and-stick model obtained by observing atomic arrangement of a +c-plane surface from an m-axis direction. The c-plane is perpendicular to the plane of the paper of FIG. 2C. As seen from FIGS. 2A and 2B, N atoms and Ga atoms are located on a plane parallel to the m-plane. On the other hand, as seen from FIGS. 2A and 2C, a layer in which only Ga atoms are located, and a layer in which only N atoms are located are formed on the c-plane.

Conventionally, when a semiconductor element is to be fabricated using a GaN-based semiconductor, a c-plane substrate, i.e., a substrate having a (0001) plane as its principal surface, has been used as a substrate on which a nitride semiconductor crystal is grown. In this case, spontaneous electrical polarization is induced in the nitride semiconductor along the c-axis due to the arrangements of Ga and N atoms. Thus, the "c-plane" is referred to as a "polar plane." As a result of the electrical polarization, a piezoelectric field is generated in a quantum well layer forming a portion of a light-emitting layer of a nitride semiconductor light-emitting element and made of InGaN along the c-axis. Due to the generated piezoelectric field, the distributed electrons and holes in the light-emitting layer are displaced, and the internal quantum efficiency of the light-emitting layer is decreased due to a quantum-confined Stark effect of carriers. In order to reduce the decrease in the internal quantum efficiency of the light-emitting layer, the light-emitting layer formed on the (0001) plane is designed to have a thickness equal to or less than 3 nm.

Furthermore, in recent years, consideration has been made to fabricate a light-emitting element using a substrate having an m- or a-plane called a nonpolar plane, or a –r- or (11-22) plane called a semipolar plane as its principal surface. As illustrated in FIG. 1A, m-planes of the wurtzite crystal structure are parallel to the c-axis, and are six equivalent planes orthogonal to the c-plane. For example, in FIG. 1A, a (1-100) plane perpendicular to a [1-100] direction corresponds to one of the m-planes. The other m-planes equivalent to the (1-100) plane include a (–1010) plane, a (10-10) plane, a (–1100) plane, a (01-10) plane, and a (0-110) plane.

As illustrated in FIGS. 2A and 2B, Ga and N atoms on the m-planes are present on the same atomic plane, and thus, electrical polarization is not induced in directions perpendicular to the m-planes. Therefore, when a light-emitting element is fabricated using a semiconductor stacked structure having an m-plane as its growth surface, a piezoelectric field is not generated in a light-emitting layer, and the problem where the internal quantum efficiency is decreased due to the quantum-confined Stark effect of carriers can be solved. This applies also to the a-plane that is a nonpolar plane except the m-planes, and furthermore, even when, instead of the m-plane, the –r- or (11-22) plane called the semipolar plane is used as the growth surface, similar advantages can be provided.

A nitride semiconductor light-emitting element including an active layer having an m- or a-plane, or a –r- or (11-22) plane as a growth surface has polarization characteristics resulting from the structure of the valence band of the active layer.

For example, Japanese Unexamined Patent Publication No. 2008-109098 (FIGS. 20 and 21) describes a light-emitting diode device including light-emitting diode chips 10 each including a light-emitting layer 12 having a principal surface 12a, and a package 20 having a chip-arrangement surface 21a on which the light-emitting diode chips 10 are arranged, and configured such that light emitted from the principal surface 12a of the light-emitting layer 12 has a plurality of different intensities depending on the in-plane azimuth angle of the principal surface 12a of the light-emitting layer 12, and at least either of the light-emitting diode chips 10 or the package 20 reduces variations in the intensity of light exiting from the package 20 due to the differences among the in-plane azimuth angles of the chip-arrangement surface 21a, in order to reduce the variations in the intensity of light exiting from the package due to the differences among the in-plane azimuth angles of the chip-arrangement surface.

Japanese Unexamined Patent Publication No. 2009-38293 describes a light-emitting device configured such that, in order to prevent diffusion of polarized light, at least part of an inner surface of a mounting base on which a light-emitting element is mounted forms a specular surface.

Japanese Unexamined Patent Publication No. 2009-88353 describes a light-emitting device including a light-emitting element and a package, in order to provide a light-emitting device emitting polarized light with a high polarization ratio. The light-emitting element has a first end surface from which first polarized light is emitted, and a second end surface from which second polarized light is emitted. The package has a first inner wall surface that faces the first end surface and extends in parallel with the first end surface, and a second inner wall surface off which second polarized light is reflected toward the first inner wall surface.

SUMMARY

The conventional nitride semiconductor light-emitting device including an active layer having a nonpolar or semipolar plane as a growth surface has required more appropriate control over the luminous intensity distribution of outgoing light and the degree of polarization thereof.

It is therefore an object of the present disclosure to more appropriately control the luminous intensity distribution while reducing the degree of polarization of light.

In order to solve the problem, a semiconductor light-emitting device according to an aspect of the present disclosure includes: a semiconductor light-emitting chip having a growth surface that is a nonpolar or semipolar plane, and emitting polarized light; and a reflection member having a reflective surface off which the polarized light is reflected, wherein the reflective surface reflects at least a part of light in a plane $L_{45}$ in a normal line direction of the growth surface of the semiconductor light-emitting chip, where the plane $L_{45}$ represents a plane oriented at an angle of 45° to a polarization direction of the polarized light, the reflective surface of the reflection member includes a plurality of reflective surfaces, and the plurality of reflective surfaces are arranged such that a shape formed by the reflective surfaces when viewed in plan is square, and an angle θ2 is not less than 17° and not more than 73°, where the angle θ2 is an angle between the direction of polarization of the polarized light and a side of the shape formed by the reflective surfaces.

According to the semiconductor light-emitting device of the present disclosure, the luminous intensity distribution and the degree of polarization of light can be more appropriately controlled. The light distribution angle, in particular, can be controlled, and the degree of polarization of light, in particular, can be reduced.

BRIEF DESCRIPTION OF THE DRAWINGS

FIG. 27A is a graph illustrating the degree of polarization of the semiconductor light-emitting device including the circular reflector C4 according to the first example. FIG. 27B is a graph illustrating the luminous intensity distribution of the semiconductor light-emitting device including the circular reflector C4 according to the first example.

FIG. 43A is a graph illustrating the degree of polarization of light from the semiconductor light-emitting device including the rectangular reflector S2 in which the angle $\theta 2$ is 90°. FIG. 43B is a graph illustrating the luminous intensity distribution of the semiconductor light-emitting device including the rectangular reflector S2 in which the angle $\theta 2$ is 90°.

FIG. 49A is a graph illustrating the degree of polarization of light from a semiconductor light-emitting device according to a third comparative example FIG. 49B is a graph illustrating the luminous intensity distribution of the semiconductor light-emitting device according to the third comparative example.

DETAILED DESCRIPTION

Figure 1A:
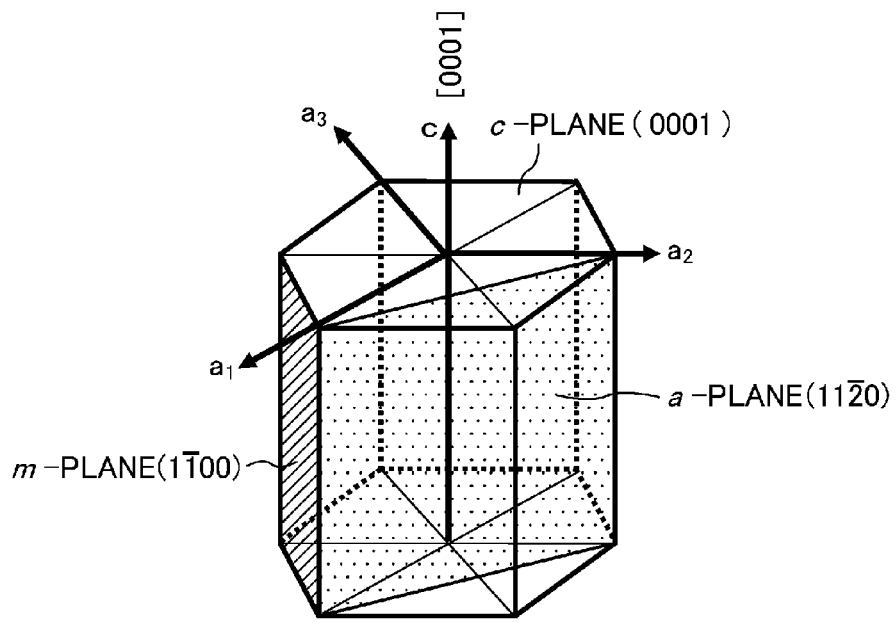
FIG. 1A is a perspective view illustrating primitive vectors $a_1$, $a_2$, $a_3$, and c, and a-, c-, and m-planes of a wurtzite crystal structure.
Figure 1B:
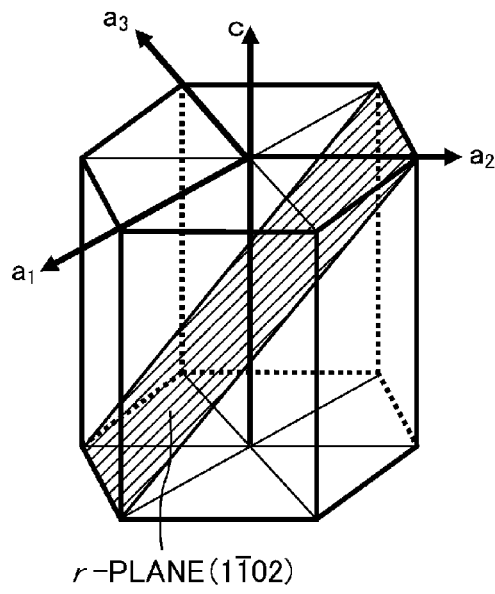
FIG. 1B is a perspective view illustrating an r-plane of the wurtzite crystal structure.
Figure 1C:
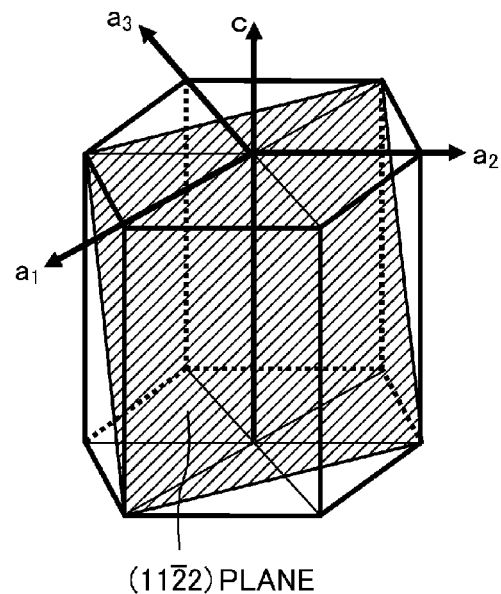
FIG. 1C is a perspective view illustrating a (11-22) plane of the wurtzite crystal structure.
Figure 2A:
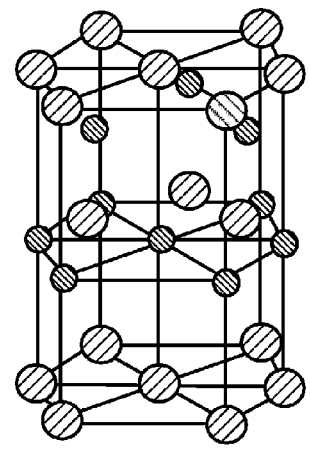
FIGS. 2A-2C are diagrams illustrating a crystal structure of a GaN-based semiconductor using a ball-and-stick model.
Figure 2B:
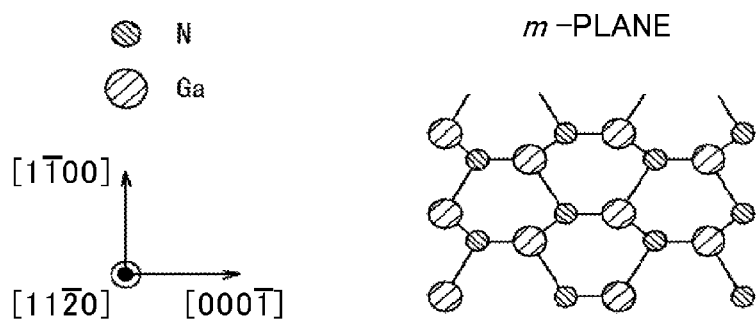
Figure 2C:
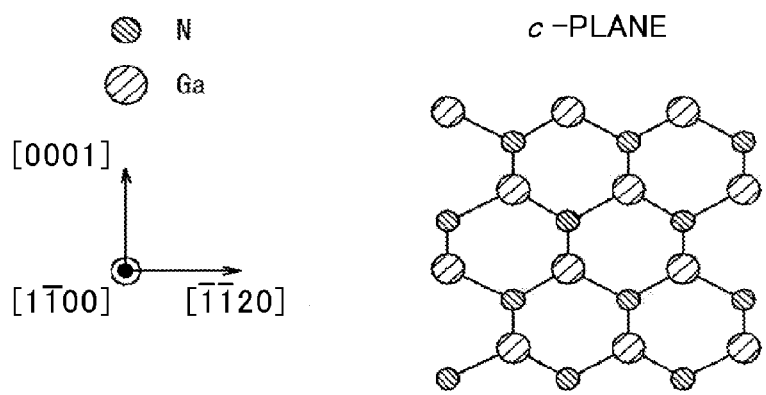

A semiconductor light-emitting device according to an embodiment of the present disclosure includes: a semiconductor light-emitting chip having a growth surface that is a nonpolar or semipolar plane, and emitting polarized light; and a reflection member having a reflective surface off which the polarized light is reflected, wherein the reflective surface reflects at least a part of light in a plane $L_{45}$ in a normal line direction of the growth surface of the semiconductor light-emitting chip, where the plane $L_{45}$ represents a plane oriented at an angle of 45° to a polarization direction of the polarized light.

In an embodiment, the reflective surface may have a circular or elliptical shape when viewed in plan, and the reflection member may have a configuration in which the reflective surface reflects emitted light having an azimuth angle $\chi$ within the range from 40° to 80°, where the azimuth angle $\chi$ is an angle formed between a direction of the light emitted from the semiconductor light-emitting chip and the normal line direction of the growth surface of the semiconductor light-emitting chip.

In this case, the reflection member may have a configuration in which the reflective surface reflects emitted light having an azimuth angle $\chi$ within the range from 50° to 80°.

In an embodiment, the reflective surface may have a circular or elliptical shape when viewed in plan, the cross section of the reflective surface taken along a direction perpendicular to the growth surface of the semiconductor light-emitting chip may include a line, a curve, or a combination thereof, and an arithmetic average inclination angle $\Delta\theta 1$ may be not less than 20° and not more than 40°, where the arithmetic average inclination angle $\Delta\theta 1$ represents an angle between the reflective surface and the direction of the normal line to the growth surface of the semiconductor light-emitting chip when the reflective surface is viewed in cross section.

In this case, the arithmetic average inclination angle $\Delta\theta 1$ may be not less than 25° and not more than 40°.

In an embodiment, the reflective surface may have a circular or elliptical shape when viewed in plan, and may be a reflective surface configured such that the light intensity in the direction of the normal line to the growth surface of the semiconductor light-emitting chip is five or more times as high as the light intensity obtained in the case where the reflective surface is not provided.

In an embodiment, the reflection member may have a plurality of reflective surfaces, which are arranged such that a shape formed by the reflective surfaces when viewed in plan is square, and θ2 may be not less than 17° and not more than 73°, where θ2 represents an angle between the polarization direction of the polarized light and a side of the shape formed by the reflective surfaces when viewed in plan.

In this case, the angle θ2 may be not less than 30° and not more than 60°.

In an embodiment, the reflection member may have a plurality of reflective surfaces, which are arranged such that a shape formed by the reflective surfaces when viewed in plan is rectangle, and θ2 may be not less than 20° and not more than 70°, where θ2 represents an angle between the polarization direction of the polarized light and a long side of the shape formed by the reflective surfaces when viewed in plan.

In this case, the angle θ2 may be not less than 35° and not more than 55°.

In an embodiment, the cross section of the reflective surface taken along a direction perpendicular to the growth surface of the semiconductor light-emitting chip may include a line, a curve, or a combination thereof, and an arithmetic average inclination angle $\Delta\theta 1$ may be not less than 20° and not more than 40°, where the arithmetic average inclination angle $\Delta\theta_1$ represents an angle between the reflective surface and the direction of the normal line to the growth surface of the semiconductor light-emitting chip when the reflective surface is viewed in cross section.

In an embodiment, corner portions of the shape formed by the reflective surfaces when viewed in plan may have a curved surface, and a curvature R of the curved surface is less than a length of each of sides of the semiconductor light-emitting chip.

In an embodiment, the semiconductor light-emitting chip may include at least two semiconductor light-emitting chips, and the at least two semiconductor light-emitting chips may be arranged such that directions of polarization of light from the at least two semiconductor light-emitting chips are identical.

In an embodiment, the semiconductor light-emitting chip may include at least four semiconductor light-emitting chips, the at least four semiconductor light-emitting chips may be arranged in a matrix such that directions of polarization of light from the at least four semiconductor light-emitting chips are identical, and D2 may be less than D1, where D1 represents a distance between adjacent two of the at least four semiconductor light-emitting chips arranged in a direction perpendicular to the directions of polarization of the light, and D2 represents a distance between adjacent two of the at least four semiconductor light-emitting chips arranged in a direction parallel to the directions of polarization of the light.

In an embodiment, a protrusion/recess structure may be formed on a light extraction surface of the semiconductor light-emitting chip.

The semiconductor light-emitting device of the embodiment may further include: a light-transmissive member covering the semiconductor light-emitting chip.

The semiconductor light-emitting device according to the embodiment may further include: a wavelength conversion member covering the semiconductor light-emitting chip.

In an embodiment, a linear reflectivity of the reflective surface may be higher than a diffuse reflectivity of the reflective surface.

In an embodiment, a surface roughness of the reflective surface may be not more than 100 nm.

Incidentally, a nitride semiconductor active layer having an m-plane as a growth surface emits light having a high electric field intensity principally along the a-axis. When a light-emitting element emits polarized light, it is theoretically predicted that the light emitted from the light-emitting element will exhibit the luminous intensity distribution where the intensity of the emitted light increases in a direction perpendicular to the polarization direction of the light. In other words, the light emitted from the light-emitting element exhibits an uneven radiation pattern (luminous intensity distribution). Furthermore, it is theoretically predicted that light having a high electric field intensity along a specific crystal direction of a nitride semiconductor will be emitted also from each of semipolar planes, such as –r-, (20-21), (20-2-1), (10-

1-3), and (11-22) planes, and other nonpolar planes, such as a-planes, and the emitted light will exhibit the luminous intensity distribution where the intensity of the emitted light increases in a direction perpendicular to the polarization direction of the light.

The polarization direction of light from a nitride semiconductor active layer having an a-plane as a growth surface has been known to be along the m-axis. Therefore, it is predicted that the light will exhibit the luminous intensity distribution where the intensity of the emitted light increases in a direction perpendicular to the m-axis.

The polarization direction of light from a nitride semiconductor active layer having a (20-2-1) or (20-21) plane that is a semipolar plane as a growth surface has been known to correspond to the [−12-10] direction. Therefore, it is predicted that the light will exhibit the luminous intensity distribution where the intensity of the emitted light increases in a direction perpendicular to the [−12-10] direction.

When the In content of a nitride semiconductor active layer having a (10-1-3) plane that is a semipolar plane as a growth surface is high, the polarization direction of light from the nitride semiconductor active layer has been known to correspond to the [−12-10] direction, and when the In content of the nitride semiconductor active layer is low, the polarization direction of the light has been known to correspond to the [11-23] direction. Therefore, it is predicted that the light will exhibit the luminous intensity distribution where when the In content of the active layer is high, the intensity of the emitted light increases in a direction perpendicular to the [−12-10] direction, and when the In content of the active layer is low, the intensity of the emitted light increases in a direction perpendicular to the [11-23] direction.

When the In content of a nitride semiconductor active layer having a (11-22) plane that is a semipolar plane as a growth surface is high, the polarization direction of light from the nitride semiconductor active layer has been known to be along the m-axis, and when the In content of the nitride semiconductor active layer is low, the polarization direction of the light has been known to correspond to the [−1-123] direction. Therefore, it is predicted that the light will exhibit the intensity distribution where when the In content of the active layer is high, the intensity of the emitted light increases in a direction perpendicular to the m-axis, and when the In content of the active layer is low, the intensity of the emitted light increases in a direction perpendicular to the [−1-123] direction.

Light having a high electric field intensity along a specific direction is herein referred to as "polarized light." For example, light having a high electric field intensity along an X-axis is referred to as "polarized light along the X-axis," and in this case, a direction along the X-axis is referred to as a "polarization direction." The "polarized light along the X-axis" does not mean only linearly polarized light along the X-axis, and may include linearly polarized light along other axes. More specifically, the "polarized light along the X-axis" means light including a light component that transmits through a "polarizer having a polarization transmission axis along the X-axis" and has higher intensity (electric field intensity) than a light component transmitting through a "polarizer having a polarization transmission axis along another axis." Therefore, the "polarized light along the X-axis" includes incoherent light including not only linearly polarized light and elliptically polarized light along the X-axis, but also linearly polarized light and elliptically polarized light in various directions.

When the polarization transmission axis of a polarizer is rotated about the optical axis, the degree of polarization of light is defined by the following expression (A):

$$\text{Degree of Polarization} = |I\max - I\min|/|I\max + I\min| \tag{A}$$

where Imax is the highest electric field intensity of light transmitting through the polarizer, and Imin is the lowest electric field intensity thereof.

When the polarization transmission axis of the polarizer is parallel to the X-axis, the electric field intensity of "light polarized along the X-axis" and transmitting through the polarizer is Imax, and when the polarization transmission axis of the polarizer is parallel to the Y-axis, the electric field intensity of the light transmitting through the polarizer is Imin. The electric field intensity Imin of completely linearly polarized light is equal to 0, and thus, the degree of polarization is equal to one. By contrast, the difference between the electric field intensity Imax of completely depolarized light and the electric field intensity Imin thereof is equal to zero, and thus, the degree of polarization is equal to zero.

A nitride semiconductor light-emitting element including an active layer having an m-plane as a growth surface emits polarized light principally along the a-axis as described above. In this case, the nitride semiconductor light-emitting element emits also polarized light along the c-axis and polarized light along the m-axis. However, the intensity of each of the polarized light along the c-axis and the polarized light along the m-axis is lower than that of the polarized light along the a-axis.

Herein, an active layer having an m-plane as a growth surface is used as an example, and attention is focused on polarized light along the a-axis. However, also when a semipolar plane, such as a −r-, (20-21), (20-2-1), (10-1-3), or (11-22) plane, or another nonpolar plane, such as an a-plane, is used as the growth surface, similar statements apply to polarized light in a specific crystal direction.

Herein, "m-planes" include not only planes completely parallel to the m-planes, but also planes inclined at an angle of about ±5° or less from the m-planes. The "m-planes" herein also include step-like surfaces each including a plurality of m-plane regions parallel to the m-planes. Planes inclined slightly from the m-planes are much less affected by spontaneous electrical polarization. Furthermore, the planes inclined slightly from the m-planes microscopically have properties similar to those of step-like surfaces including many m-plane regions that are not inclined from the m-planes. In addition, in some cases, in a crystal growth technique, a semiconductor layer is more easily epitaxially grown on a substrate having a crystal orientation inclined slightly from a desired orientation than on a substrate having a crystal orientation exactly identical with the desired orientation. Therefore, it may be useful to slightly incline a crystal plane in order to improve the crystal quality of the semiconductor layer to be epitaxially grown or increase the crystal growth rate of the semiconductor layer while reducing the influence of spontaneous electrical polarization to a sufficient level.

Similar statements apply to "a-planes," "(20-21) planes," "(20-2-1) planes," "(10-1-3) planes," "−r-planes," and "(11-22) planes," and thus, the "a-planes," the "(20-21) planes," the "(20-2-1) planes," the "(10-1-3) planes," the "−r-planes," and the "(11-22) planes" herein each include not only planes completely parallel to corresponding ones of the "a-planes," the "(20-21) planes," the "(20-2-1) planes," the "(10-1-3) planes," the "−r-planes," and the "(11-22) planes," but also planes inclined at an angle of about ±5° or less from the corresponding ones of the "a-planes," the "(20-21) planes," the "(20-2-1) planes," the "(10-1-3) planes," the "-r-planes," and the "(11-22) planes."

A nitride semiconductor light-emitting device includes a semiconductor light-emitting chip made of a nitride semiconductor, and a reflector. The reflector may be referred to as a cavity. The nitride semiconductor light-emitting device is placed on a mounting substrate. The mounting substrate may be referred to as a package. A surface of the mounting substrate on which the semiconductor light-emitting chip is held is referred to as a mounting surface. The reflector has a reflective surface configured to change the direction of light emitted from the semiconductor light-emitting chip.

Conventionally, the azimuth angle dependence of the luminous intensity distribution of a semiconductor light-emitting chip emitting polarized light and the azimuth angle dependence of the degree of polarization of light from the semiconductor light-emitting chip have not been examined to an adequate degree; therefore, the influence of a reflective surface of a reflector on the luminous intensity distribution and the degree of polarization of light has not been revealed.

Japanese Unexamined Patent Publication No. 2008-109098 describes a method for placing a semiconductor light-emitting chip, and the shape of each of a mounting surface and a reflector surface, in order to reduce the asymmetry of the luminous intensity distribution. However, no consideration has been given to the degree of polarization of light.

Japanese Unexamined Patent Publication No. 2009-38293 describes a reflector having a reflective surface serving as a specular surface, in order to maintain the degree of polarization of light. However, no consideration has been given to the luminous intensity distribution.

Japanese Unexamined Patent Publication No. 2009-88353 describes a reflector structure configured to allow the polarization direction of light emitted from a second end surface of a nitride semiconductor light-emitting chip to be identical with the polarization direction of light emitted from a first end surface thereof, in order to increase the degree of polarization of light. However, no consideration has been given to the luminous intensity distribution.

<Degree of Polarization of Light From Semiconductor Light-Emitting Chip Emitting Polarized Light and Luminous Intensity Distribution of Semiconductor Light-Emitting Chip>

Prior to description of embodiments, the degree of polarization of light from a semiconductor light-emitting chip emitting polarized light and the luminous intensity distribution of the semiconductor light-emitting chip will be described.

First, definitions of directions of light emitted from a semiconductor light-emitting chip 100 made of a nitride semiconductor, and a method for measuring the luminous intensity distribution and the degree of polarization of the light will be described with reference to FIGS. 3A-3D. First, the direction perpendicular to an m-plane that is a growth surface of an active layer of the semiconductor light-emitting chip 100 corresponds to a Z-axis, the polarization direction of light emitted from the active layer corresponds to an X-axis, and the direction perpendicular to both the Z-axis and the X-axis corresponds to a Y-axis. The Z-axis is referred to also as the normal line direction. When the growth surface of the active layer is an m-plane, the Z-axis corresponds to the m-axis, the X-axis corresponds to the a-axis, and the Y-axis corresponds to the c-axis.

A plane L perpendicularly intersecting the active layer 106 is defined. The angle between the plane L and the polarization direction of light, i.e., the X-axis, is defined as $\phi$, and when the angle $\phi$ is a specific value $\phi 1$ (unit: degree [°]), the plane L is defined as a plane $L_{\phi 1}$. Furthermore, in the plane $L_{\phi 1}$, the angle between the Z-axis (the normal line direction) and emitted light is defined as an azimuth angle $\chi$. A plane used to measure the luminous intensity distribution is defined by the plane $L_{\phi 1}$, and the azimuth angle within which the luminous intensity distribution is measured is defined by the azimuth angle $\chi$. A cross-sectional view taken along the plane $L_{\phi 1}$ is referred to as the "cross-sectional view along the plane $L_{\phi 1}$."

Figure 3A:
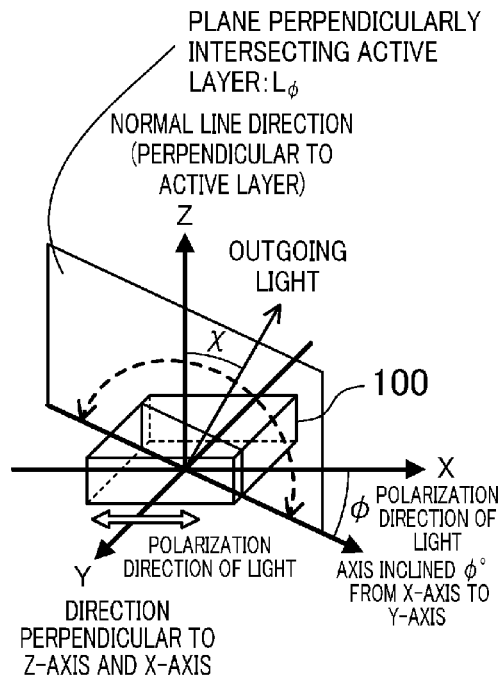
FIG. 3A is a perspective view illustrating the relationship among the polarization direction of light from a semiconductor light-emitting chip, a measurement plane L, and the azimuth angle χ of the light in connection with measurement of the degree of polarization of the light and the luminous intensity distribution.
Figure 3B:
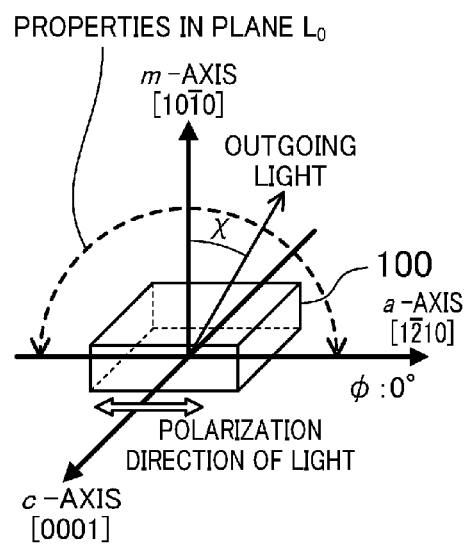
FIG. 3B is a perspective view illustrating the relationship among the polarization direction of light in a plane $L_0$, the measurement plane L, and the azimuth angle χ of the light, where the normal line to a growth surface of the semiconductor light-emitting chip is along the m-axis.
Figure 3C:
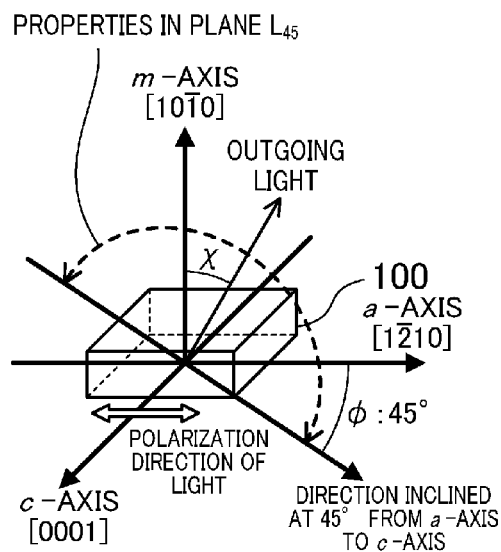
FIG. 3C is a perspective view illustrating the relationship among the polarization direction of light in a plane $L_{45}$, the measurement plane L, and the azimuth angle χ of the light, where the normal line is along the m-axis.
Figure 3D:
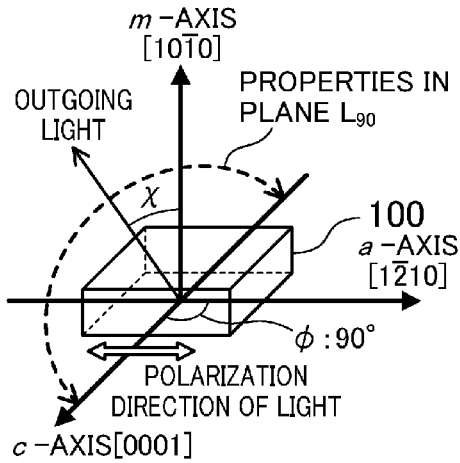
FIG. 3D is a perspective view illustrating the relationship among the polarization direction of light in a plane $L_{90}$, the measurement plane L, and the azimuth angle χ of the light, where the normal line is along the m-axis.

FIGS. 3B, 3C, and 3D illustrate specific examples in each of which the growth surface of the active layer is an m-plane.

FIG. 3B illustrates measurement axes along which the luminous intensity distribution in a plane $L_0$ and the degree of polarization of light therein are measured, where the growth surface of the active layer is an m-plane. In this case, the plane $L_0$ corresponds to the plane defined by the m-axis and the a-axis.

FIG. 3C illustrates measurement axes along which the luminous intensity distribution in a plane $L_{45}$ and the degree of polarization of light therein are measured, where the growth surface of the active layer is an m-plane. In this case, the plane $L_{45}$ includes the m-axis, and corresponds to a plane inclined at an angle of 45° from the a-axis.

FIG. 3D illustrates a measurement axis along which the luminous intensity distribution in a plane $L_{90}$ and the degree of polarization of light therein are measured when the growth surface of the active layer is an m-plane. In this case, the plane $L_{90}$ corresponds to the plane defined by the m-axis and the c-axis.

The luminous intensity distribution of the semiconductor light-emitting chip 100 including the active layer emitting polarized light and the profile indicating the degree of polarization of light emitted from the semiconductor light-emitting chip 100 vary among the measurement planes, i.e., the plane $L_0$, the plane $L_{45}$, and the plane $L_{90}$. This phenomenon will be described in detail in comparative examples described below.

The luminous intensity distribution in the plane $L_{45}$ is similar to that in the plane $L_{90}$, and when the azimuth angle $\chi$ is in the range from −80° to −10° or the range from 10° to 80°, the light intensity is much higher than when the azimuth angle $\chi$ is equal to 0°, i.e., the intensity of light emitted along the normal line direction.

When the azimuth angle $\chi$ is in the range from −80° to +80°, the intensity of light in the plane $L_{90}$ is high, and a high degree of polarization of light in the plane $L_{90}$ is maintained. When the azimuth angle $\chi$ is 0°, the degree of polarization of light in the plane $L_0$ is highest, and when the absolute value of the azimuth angle $\chi$ is greater than 80, the degree of polarization of the light gently decreases. Similarly to the degree of polarization of the light in the plane $L_0$, when the azimuth angle $\chi$ is 0°, the degree of polarization of light in the plane $L_{45}$ is highest. However, when the absolute value of the azimuth angle $\chi$ is greater than 80, the degree of polarization of light in the plane $L_{45}$ significantly decreases, and when the azimuth angle $\chi$ is in the range from −40° to 40°, the degree of polarization of the light therein is reduced to substantially one half or less of that obtained when the azimuth angle $\chi$ is equal to 0°. Furthermore, when the azimuth angle $\chi$ is −50° or less and 50° or more, the degree of polarization of light in the plane $L_{45}$ is reduced to substantially one third or less of that obtained when the azimuth angle $\chi$ is equal to 0°. The azimuth angle dependence of each of the luminous intensity distribution and the degree of polarization of light has not been known.

The present inventors arrived at the following embodiments based on new characteristics, i.e., the azimuth angle dependence of each of the luminous intensity distribution and the degree of polarization of light. That is, the present inventors focused attention on the following properties: the intensity of light emitted in the plane $L_{45}$ to have an azimuth angle $\chi$ within the range from −80° to −40° or within the range from 40° to 80° is extremely high, and the degree of polarization of the light is low.

Specifically, when light emitted in the plane $L_{45}$ to have an azimuth angle $\chi$ within the range from −80° to −40° or within the range from 40° to 80° is concentrated in the normal line direction, the degree of polarization of the light in the normal line direction can be reduced while the intensity of the light in the normal line direction is increased. Alternatively, when light emitted in the plane $L_{45}$ to have an azimuth angle $\chi$ within the range from −80° to −50° or within the range from 50° to 80° is concentrated in the normal line direction, the degree of polarization of the light in the normal line direction can be further reduced while the intensity of the light in the normal line direction is increased.

First Embodiment

A semiconductor light-emitting device according to a first embodiment of the present disclosure will be described with reference to FIGS. 4A and 4B.

Figure 4A:
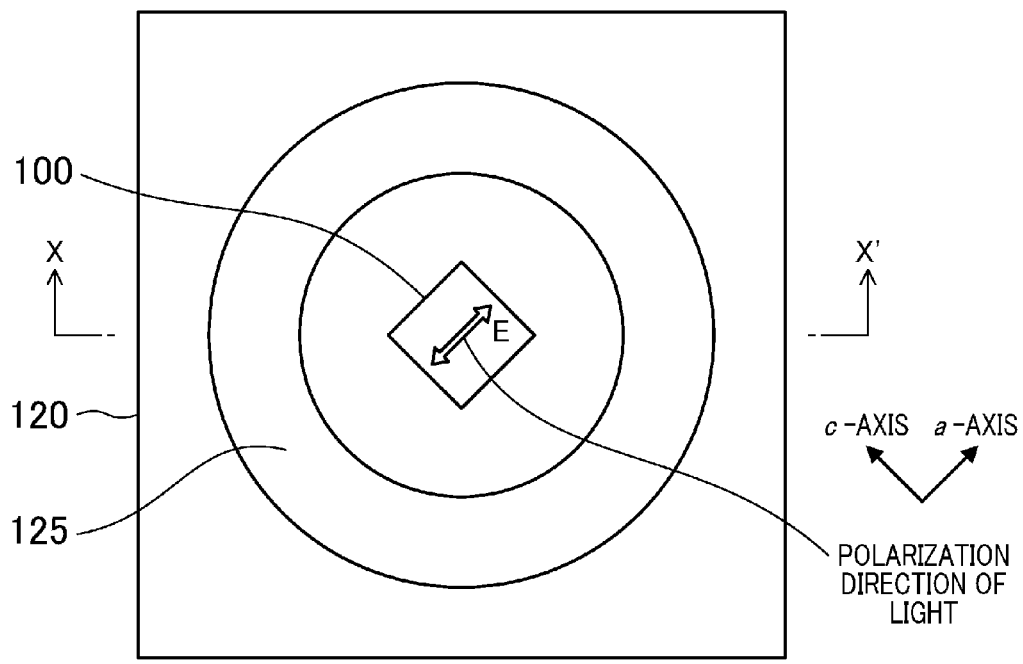
FIG. 4A is a schematic plan view illustrating a semiconductor light-emitting device according to a first embodiment.
Figure 4B:
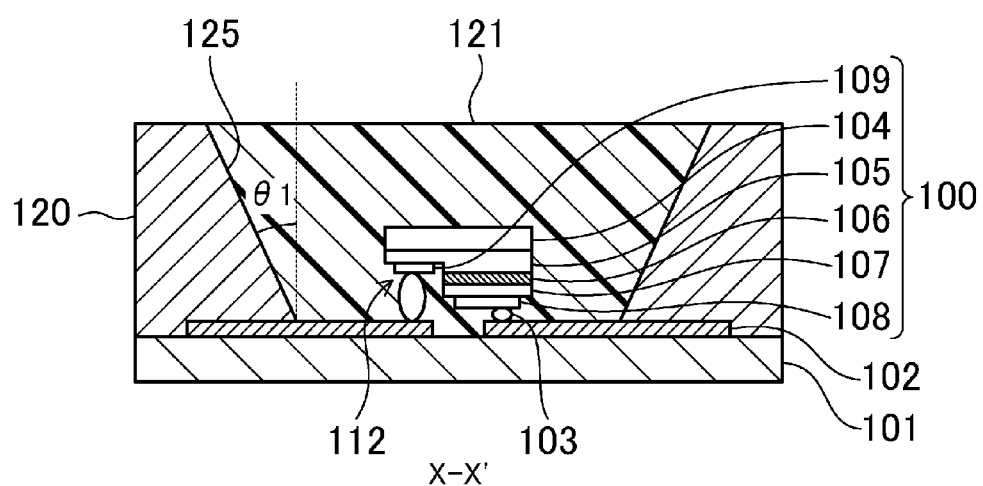
FIG. 4B is a cross-sectional view taken along the line X-X' in FIG. 4A.

FIG. 4A is a plan view illustrating a configuration of the semiconductor light-emitting device according to the first embodiment, and FIG. 4B is a cross-sectional view illustrating the configuration along the line X-X' in FIG. 4A. The cross section along the line X-X' corresponds to the plane $L_{45}$. The semiconductor light-emitting device according to this embodiment includes a mounting substrate 101, a semiconductor light-emitting chip 100 mounted on the mounting substrate 101 and emitting polarized light, a reflector 120 that is a reflection member having reflective surfaces surrounding the semiconductor light-emitting chip 100, and a light-transmissive member 121 covering the semiconductor light-emitting chip 100 and filling the interior of the reflector 120.

As illustrated in FIG. 4B, the nitride semiconductor light-emitting chip 100 includes a substrate 104 having a GaN layer having an m-plane as the principal surface and the growth surface (hereinafter referred to as the m-plane GaN layer), an n-type nitride semiconductor layer 105 formed on the principal surface of the GaN layer of the substrate 104, an active layer 106 formed on the n-type nitride semiconductor layer 105 and made of a nitride semiconductor, a p-type nitride semiconductor layer 107 formed on the active layer 106, a p-side electrode 108 formed on and in contact with the p-type nitride semiconductor layer 107, and an n-side electrode 109 formed on and in contact with an exposed region of the n-type nitride semiconductor layer 105. The active layer 106 has a nonpolar or semipolar plane as the growth surface, and emits polarized light. In this embodiment, a light-emitting diode (LED) chip can be used as the semiconductor light-emitting chip 100. Similar statements apply to the following variations and other embodiments.

The growth surface of each of the n-type nitride semiconductor layer 105, the active layer 106, and the p-type nitride semiconductor layer 107 is substantially parallel to m-planes. In other words, the layers 105, 106, and 107 are stacked along the m-axis. Another layer may be formed between the n-type nitride semiconductor layer 105 and the active layer 106. Furthermore, another layer may be formed between the active layer 106 and the p-type nitride semiconductor layer 107. Here, a GaN-based semiconductor will be described as an example nitride semiconductor. The GaN-based semiconductor includes a semiconductor represented by the general expression $Al_xIn_yGa_zN$ (where 0≤x<1, 0≤y<1, 0<z≤1, and x+y+z=1).

The semiconductor light-emitting chip 100 is mounted such that its p-side electrode 108 and its n-side electrode 109 each face a corresponding one of interconnect electrodes 102 placed on a surface of the mounting substrate 101. Specifically, the semiconductor light-emitting chip 100 is electrically connected through bumps 103 to the interconnect electrodes 102 on the mounting substrate 101, and is held on the interconnect electrodes 102 with the bumps 103 interposed therebetween. Such a structure is referred to as the flip-chip structure. One of the interconnect electrodes 102 is connected to the p-side electrode 108, and the other one thereof is connected to the n-side electrode 109. An insulative material, such as alumina (aluminum oxide), aluminum nitride (AlN), or a glass epoxy resin, a metal material containing, e.g., aluminum (Al), copper (Cu), or tungsten (W), a semiconductor material, such as silicon (Si) or germanium (Ge), or a composite of the materials can be used as the principal material forming the mounting substrate 101. Metal, such as aluminum (Al), silver (Ag), gold (Au), or copper (Cu), can be used as a material of the interconnect electrodes 102.

The substrate 104 may be made of only a GaN layer, or may include a layer except a GaN layer. The layer except the GaN layer may be an m-plane GaN substrate, an m-plane SiC substrate, an r-plane sapphire substrate, an m-plane sapphire substrate, or an a-plane sapphire substrate. Furthermore, the substrate 104 may be removed.

The n-type nitride semiconductor layer 105 is made of, e.g., n-type $Al_uGa_vIn_wN$ (where 0≤u≤1, 0≤v≤1, 0≤w≤1, and u+v+w=1). For example, silicon (Si) can be used as an n-type dopant.

The active layer 106 includes a plurality of barrier layers made of $In_YGa_{1-Y}N$ (where 0≤Y<1), and at least one well layer vertically interposed between an adjacent pair of the barrier layers and made of $In_XGa_{1-X}N$ (where 0<X≤1). The well layer included in the active layer 106 may be a single layer. Alternatively, the active layer 106 may have a multiple quantum well (MQW) structure in which well layers and barrier layers are alternately stacked. The wavelength of light emitted from the semiconductor light-emitting chip 100 depends on the In content ratio x of an $In_xGa_{1-x}N$ semiconductor that is a semiconductor composition of the well layer.

The p-type nitride semiconductor layer 107 is made of, e.g., a p-type $Al_sGa_tN$ (where 0≤s≤1, 0≤t≤1, and s+t=1) semiconductor. For example, magnesium (Mg) can be used as a p-type dopant. As the p-type dopant, instead of Mg, zinc (Zn) or beryllium (Be), for example, may be used. The Al content ratio s of the p-type nitride semiconductor layer 107 may be uniform along the thickness thereof, or may vary along the thickness thereof in a continuous or stepwise manner. The thickness of the p-type nitride semiconductor layer 107 is, e.g., about 0.05-2 μm. The Al content ratio s of a portion of the p-type nitride semiconductor layer 107 near an upper surface thereof, i.e., a portion thereof near the interface between the p-type nitride semiconductor layer 107 and the p-side electrode 108, may be zero. In other words, the portion of the p-type nitride semiconductor layer 107 near the upper surface thereof may be a GaN layer. In this case, the GaN layer may contain a high concentration of p-type impurities, and may function as a contact layer with the p-side electrode 108.

The p-side electrode 108 may cover substantially the entire surface of the p-type nitride semiconductor layer 107. The p-side electrode 108 is made of, e.g., a layered structure (Pd/Pt) in which a palladium (Pd) layer and a platinum (Pt) layer are stacked. In order to increase the reflectivity of emitted light, a layered structure (Ag/Pt) in which a silver (Ag) layer and a platinum (Pt) layer are stacked, or a layered structure (Pd/Ag/Pt) in which a Pd layer, an Ag layer, and a Pt layer are sequentially stacked may be used as the p-side electrode 108.

The n-side electrode 109 is made of, e.g., a layered structure (Ti/Pt) in which a titanium (Ti) layer and a platinum (Pt) layer are stacked. In order to increase the reflectivity of emitted light, a layered structure (Ti/Al/Pt) in which a Ti layer, an Al layer, and a Pt layer are sequentially stacked may be used.

The semiconductor light-emitting chip 100 is one of pieces into which a wafer including stacked semiconductor layers is singulated along the a- and c-axes and which are square or rectangular when viewed in plan. In this case, a c-plane of a nitride semiconductor is easily cleaved, and thus, a singulation process step can be simplified. Alternatively, the semiconductor light-emitting chip 100 may be one of pieces into which the wafer is singulated along directions inclined at an angle of not less than 0° and not more than 45° from the a- and c-axes. In this case, planes that are difficult to be cleaved are exposed on the side surfaces of the semiconductor light-emitting chip 100. This exposure tends to cause the side surfaces of the semiconductor light-emitting chip 100 to be uneven. The uneven surfaces improve the light extraction efficiency at which emitted light is extracted from the uneven surfaces.

An epoxy resin or a silicone resin can be used as a material of the light-transmissive member 121. Alternatively, the light-transmissive member 121 may contain a color conversion material excited by light from the active layer 106 to generate light having a longer wavelength than the light from the active layer 106. The surface of the light-transmissive member 121 may be flat, or may have a shape different from the flat shape.

In this embodiment, the reflective surfaces 125 of the reflector 120 improve the symmetry of the luminous intensity distribution, and play a significant role in controlling the degree of polarization of light. The reflector 120 has a portion of the reflective surface 125 configured to reflect light emitted from the semiconductor light-emitting chip 100.

Here, the reflective surface 125 may have a circular shape when viewed in plan. A shape such as the circular shape having a high degree of symmetry easily reduces the asymmetry of the luminous intensity distribution. Moreover, when the reflective surface has the circular shape, the positional relationship relative to the reflector does not change even when the semiconductor light-emitting chip 100 rotates during its mounting process. Thus, the advantages provided by the present embodiment can be ensured.

When light output from the semiconductor light-emitting chip 100 in the direction of the azimuth angle $\chi$ has an angle $\theta 1$ which is one half of the azimuth angle $\chi$, the light is reflected off the reflective surface 125 in the normal line direction, where the angle $\theta 1$ represents an angle formed between the reflective surface 125 and the direction of the normal line to the active layer when viewed in cross section. Therefore, in order to reflect emitted light having an azimuth angle $\chi$ within the range from 40° to 80° in the normal line direction, the angle $\theta 1$ can be within the range from 20° to 40°. Furthermore, in order to reflect emitted having an azimuth angle $\chi$ within the range from 50° to 80° in the normal line direction, the angle $\theta 1$ can be within the range from 25° to 40°.

Moreover, when the reflective surface 125 has a cross-sectional structure improving the light intensity in the normal line direction of the growth surface of the active layer so that the light intensity is 5.5 or more times as high as the light intensity obtained in the case without the reflective surface 125, the degree of polarization of light in the normal line direction can be reduced to one half or less.

A metal material such as silver (Ag) or aluminum (Al) can be used as a material of the reflective surface 125. Alternatively, a white resin material may be used. When the linear reflectivity of the reflection property on the reflective surface 125 is high, the light distribution angle is easily controlled. Moreover, when the diffuse reflectivity of the reflection property on the reflective surface 125 is high, the degree of polarization is easily reduced. In the present embodiment, even when a material having a high linear reflectivity is used, the asymmetry of the luminous intensity distribution is reduced, and the degree of polarization is also reduced.

FIGS. 5-10 illustrate cross-sectional configurations along the Z-axis of the semiconductor light-emitting device according to variations of the first embodiment.

(First Variation of First Embodiment)

Figure 5:
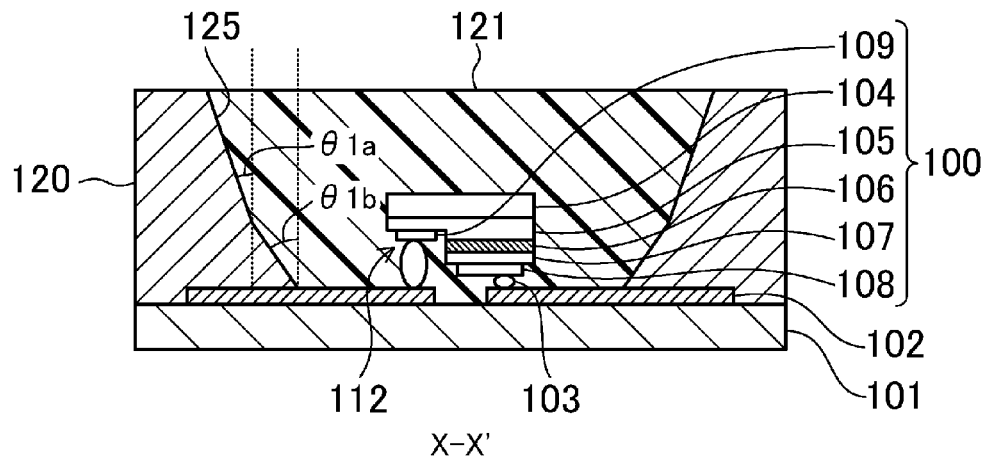
FIG. 5 is a cross-sectional view illustrating a semiconductor light-emitting device according to a first variation of the first embodiment.

FIG. 5 illustrates a semiconductor light-emitting device according to a first variation of the first embodiment. As illustrated in FIG. 5, the angle $\theta 1$ at the cross section of a reflective surface 125 of a reflector 120 according to the first variation is not one type, but includes a plurality of angles $\theta 1a$ and $\theta 1b$. When reflective surfaces having different angles are combined, the light distribution angle can be more suitably controlled. In the present variation, the angles $\theta 1a$ and $\theta 1b$ can be set within the range from 20° to 40°. Alternatively, the angles $\theta 1a$ and $\theta 1b$ can be set within the range from 25° to 40°.

(Second Variation of First Embodiment)

Figure 6:
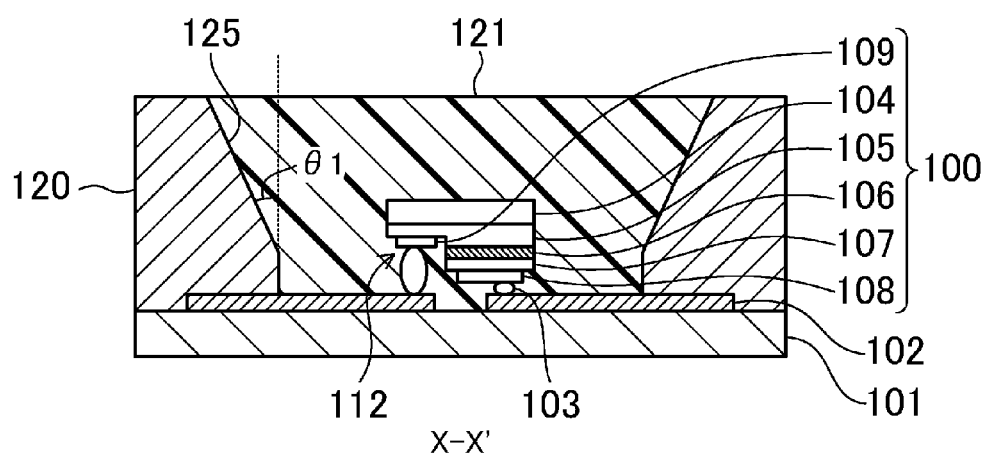
FIG. 6 is a cross-sectional view illustrating a semiconductor light-emitting device according to a second variation of the first embodiment.

FIG. 6 illustrates a semiconductor light-emitting device according to a second variation of the first embodiment. As illustrated in FIG. 6, a reflector 120 according to the second variation is formed to have a portion having an angle $\theta 1$ greater than or equal to 0° and less than 20° in a cross-sectional shape near a connection portion of a reflective surface 125 to the mounting substrate 101. FIG. 6 illustrates an example in which the reflector 120 has a portion forming an angle $\theta 1$ of 0° near the connection portion of the reflective surface 125 to the mounting substrate 101. The intensity of light emitted in the plane $L_{45}$ to have an azimuth angle $\chi$ greater than 80° is low, and thus, the portion of the reflector 120 near the connection portion of the reflective surface 125 to the mounting substrate 101 has a small effect on the luminous intensity distribution and the degree of polarization. That is, the portion of the reflective surface 125 near the connection portion to the mounting substrate 101 has a small effect on the luminous intensity distribution and the degree of polarization. Thus, even when the reflective surface 125 has a portion having an angle $\theta 1$ greater than or equal to 0° and less than 20° near the connection portion of the reflective surface 125 to the mounting substrate 101, it is possible to reduce the degree of polarization of light in the normal line direction.

(Third Variation of First Embodiment)

Figure 7:
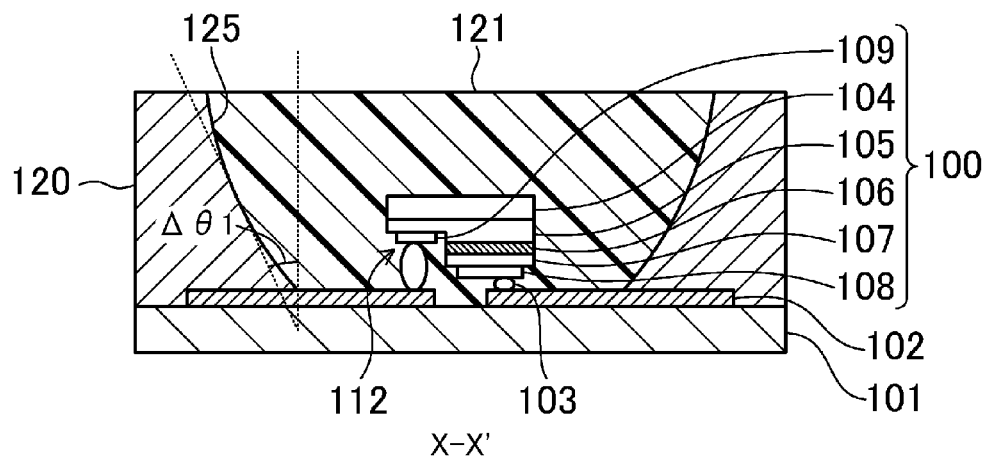
FIG. 7 is a cross-sectional view illustrating a semiconductor light-emitting device according to a third variation of the first embodiment.

FIG. 7 illustrates a semiconductor light-emitting device according to a third variation of the first embodiment. As illustrated in FIG. 7, a reflective surface 125 of a reflector 120 of the third variation has a curved cross-sectional shape.

In this variation, the angle $\Delta\theta 1$ can be set within the range from 20° to 40°, where $\Delta\theta 1$ represents the arithmetic average inclination angle $\Delta\theta 1$ of each of the reflective surfaces 125 relative to the direction of the normal line to the growth surface of a semiconductor light-emitting chip 100. Furthermore, the angle $\Delta\theta 1$ can be set within the range from 25° to 40°. Here, while the definition of the arithmetic average inclination angle $\Delta\theta 1$ herein is similar to that defined in Japanese Industrial Standard (JIS) B0601-1994, the reference direction of the angle herein is different from that of the angle defined in JIS B0601-1994. In other words, while the arithmetic average inclination angle RΔa defined in JIS is an angle relative to a horizontal direction, the arithmetic average inclination angle Δθ1 herein is an angle relative to the normal line direction. Specifically, the arithmetic average inclination angle Δθ1 herein is given by the following expression 1:

$$\Delta\theta 1 = \frac{1}{n-1}\sum_{i=1}^{n-1}\left\{\tan^{-1}\left|\left(\frac{\Delta X}{\Delta D_i}\right)\right|\right\}$$ [Expression 1]

$$= \frac{1}{n-1}\sum_{i=1}^{n-1}\left\{90° - \tan^{-1}\left|\left(\frac{\Delta D_i}{\Delta X}\right)\right|\right\}$$

$$= 90° - R\Delta a$$

where ΔDi represents a deviation from the normal line direction when the curved surface is sectioned at regular intervals ΔX in a lateral direction (a direction perpendicular to the normal line direction).

In order to actually measure the arithmetic average inclination angle Δθ1, the arithmetic average inclination angle RΔa of a reflective surface 125 is measured using a laser microscope, and the measured value is subtracted from 90° to obtain the arithmetic average inclination angle Δθ1 herein. Specifically, even when a region of the reflective surface 125 has an angle θ1 that is not within the range from 20° to 40° relative to the normal line direction, the effect of reducing the degree of polarization of light herein can be obtained as long as regions of the reflective surface 125 have an average angle within the range from 20° to 40° relative to the normal line direction.

As such, each of reflective surfaces 125 does not need to be linear when viewed in cross section. A plurality of lines may be combined together to form the reflective surface 125, or the reflective surface 125 may be curved. Alternatively, a line and a curve may be combined together.

Furthermore, even when a region of the reflective surfaces 125 having an angle Δθ1 greater than or equal to 0° and less than 20° is located near the mounting substrate 101, it is possible to reduce the degree of polarization of light in the normal line direction.

(Fourth Variation of First Embodiment)

Figure 8:
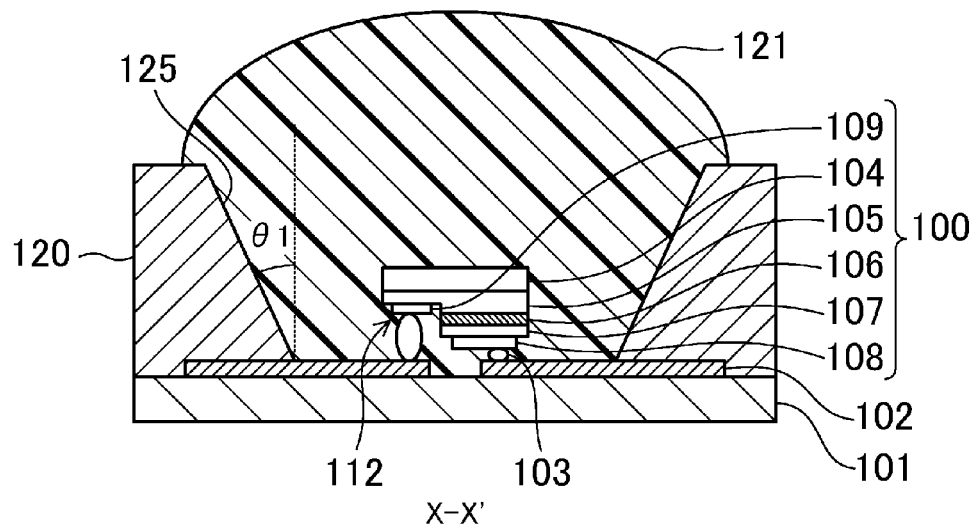
FIG. 8 is a cross-sectional view illustrating a semiconductor light-emitting device according to a fourth variation of the first embodiment.

FIG. 8 illustrates a semiconductor light-emitting device according to a fourth variation of the first embodiment. As illustrated in FIG. 8, the surface of a light-transmissive member 121 according to the fourth variation is not flat, but is convex. In this variation, the luminous intensity distribution of light having a degree of polarization reduced by reflective surfaces 125 can be controlled by the surface shape of the light-transmissive member 121.

For example, when the surface of the light-transmissive member 121 is convex, this can further reduce the light distribution angle. In contrast, although not specifically shown, when the surface of the light-transmissive member 121 is concave, this can increase the light distribution angle. Alternatively, although not specifically shown, when microscopic protrusions/recesses are formed on the surface of the light-transmissive member 121 to scatter light, it is possible to further reduce the degree of polarization of light.

(Fifth Variation of First Embodiment)

Figure 9:
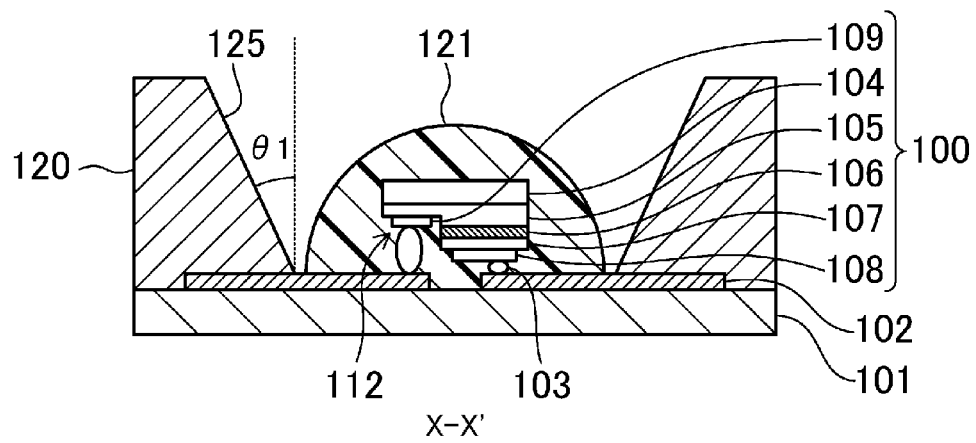
FIG. 9 is a cross-sectional view illustrating a semiconductor light-emitting device according to a fifth variation of the first embodiment.

FIG. 9 illustrates a semiconductor light-emitting device according to a fifth variation of the first embodiment. As illustrated in FIG. 9, in the fifth variation, a light-transmissive member 121 on a mounting substrate 101 does not cover reflective surfaces 125 of a reflector 120, but covers a semiconductor light-emitting chip 100. This configuration enables the formation of the reflector 120 after the formation of the light-transmissive member 121.

Moreover, when the surface of the light-transmissive member 121 is convex as in the fourth variation, this can reduce the light distribution angle. In contrast, although not specifically shown, when the surface of the light-transmissive member 121 is concave, this can increase the light distribution angle. Alternatively, although not specifically shown, when microscopic protrusions/recesses are formed on the surface of the light-transmissive member 121 to scatter light, it is possible to further reduce the degree of polarization of light.

(Sixth Variation of First Embodiment)

Figure 10:
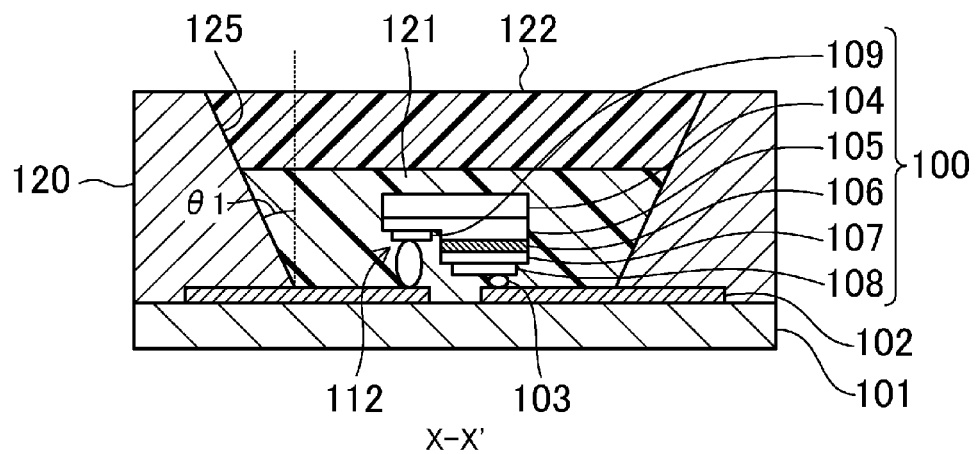
FIG. 10 is a cross-sectional view illustrating a semiconductor light-emitting device according to a sixth variation of the first embodiment.

FIG. 10 illustrates a semiconductor light-emitting device according to a sixth variation of the first embodiment. As illustrated in FIG. 10, in the sixth variation, a wavelength conversion member 122 is further formed on a light-transmissive member 121. The wavelength conversion member 122 converts the wavelength of at least one part of light emitted from a semiconductor light-emitting chip 100. The wavelength conversion member 122 can be made of a resin material or glass containing phosphors configured to convert the light wavelength. Alternatively, it may be made of a sintered object having phosphors configured to convert the light wavelength as the main ingredient.

(Seventh Variation of First Embodiment)

Figure 11A:
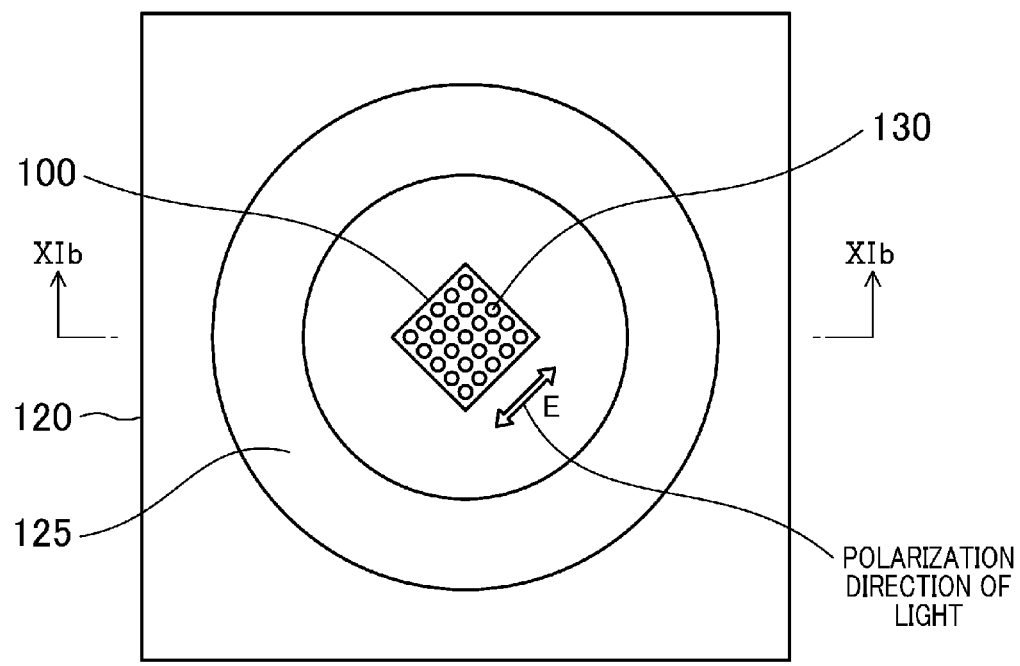
FIG. 11A is a schematic plan view illustrating a semiconductor light-emitting device according to a seventh variation of the first embodiment.
Figure 11B:
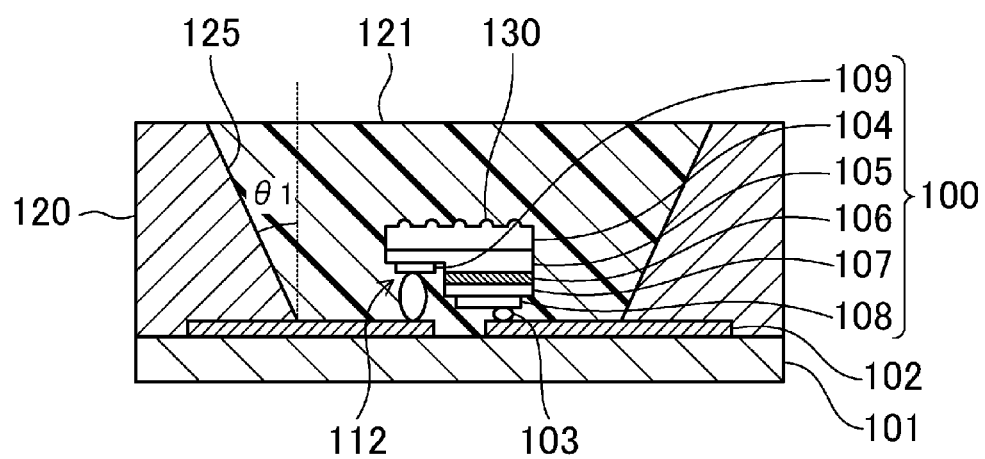
FIG. 11B is a cross-sectional view taken along the line XIb-XIb in FIG. 11A.

FIGS. 11A and 11B respectively illustrate a plan configuration and a cross-sectional configuration of a semiconductor light-emitting device according to a seventh variation of the first embodiment. As illustrated in FIGS. 11A and 11B, a protrusion/recess structure 130 is formed on a light extraction surface of a semiconductor light-emitting chip 100 according to the seventh variation. In the present variation, the protrusion/recess structure 130 is formed on the light extraction surface of the semiconductor light-emitting chip 100, so that it is possible to further reduce the degree of polarization of light in the normal line direction. The size of each of protrusions or each of recesses of the protrusion/recess structure 130 can be not less than 100 nm and not more than 10 μm.

(Eighth Variation of First Embodiment)

Figure 12:
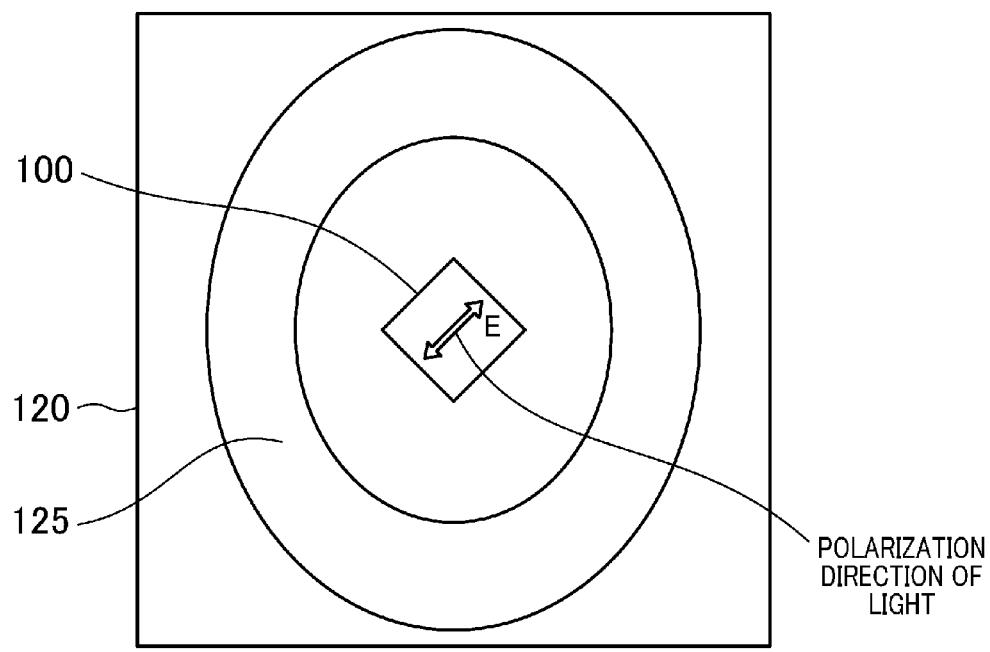
FIG. 12 is a schematic plan view illustrating a semiconductor light-emitting device according to an eighth variation of the first embodiment.

FIG. 12 illustrates a plan configuration of a semiconductor light-emitting device according to an eighth variation of the first embodiment. As illustrated in FIG. 12, a reflective surface 125 of a reflector 120 according to the eighth variation has an elliptical shape when viewed in plan. Also in the present variation, the cross-sectional shape of the reflective surface 125 may be configured such that light emitted in the plane $L_{45}$ to have an azimuth angle χ within the range from 40° to 80° is concentrated in the normal line direction. Therefore, the shape of the reflective surface 125 when viewed in plan is not necessarily perfectly circular, but may be elliptic. However, when the ellipticity of an ellipse is high, the luminous intensity distribution in the major axial direction of the ellipse and the luminous intensity distribution in the minor axial direction of the ellipse are significantly asymmetric. Thus, in order to reduce the asymmetry of the luminous intensity distribution, the length of the major axis of the ellipse can be two or less times as long as the length of the minor axis of the ellipse.

(Ninth Variation of First Embodiment)

Figure 13:
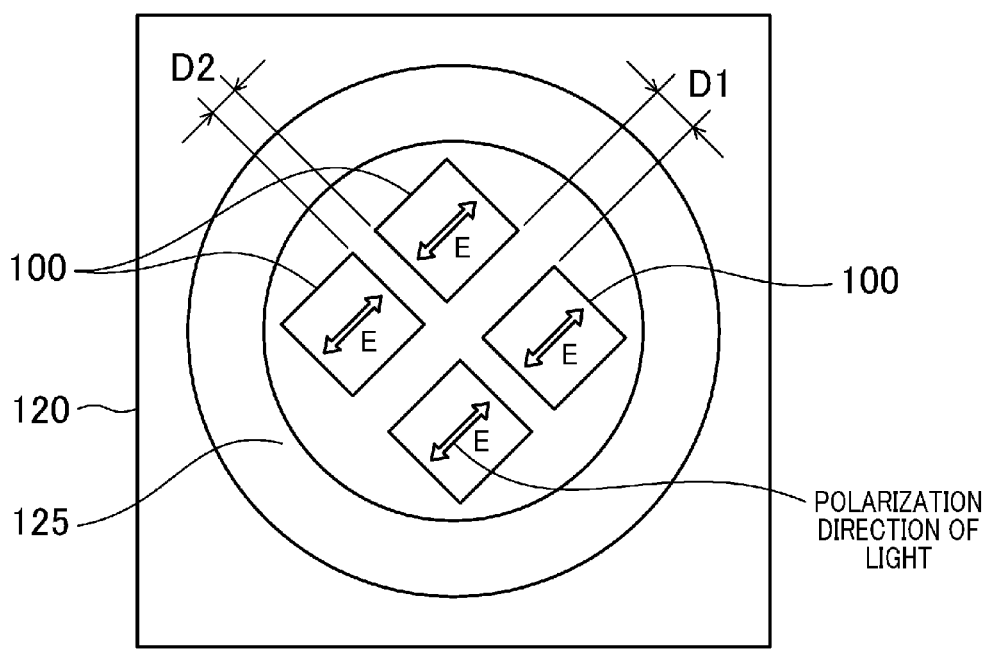
FIG. 13 is a schematic plan view illustrating a semiconductor light-emitting device according to a ninth variation of the first embodiment.

FIG. 13 illustrates the configuration of a semiconductor light-emitting device according to a ninth variation of the first embodiment when viewed in plan. As illustrated in FIG. 13, the semiconductor light-emitting device according to the present variation includes a plurality of semiconductor light-emitting chips 100, four semiconductor light-emitting chips

100 here, arranged on a mounting substrate 101 such that the polarization directions of light from the semiconductor light-emitting chips 100 are identical. The distance D2 can be less than the distance D1, where D1 represents the distance between two of the semiconductor light-emitting chips 100 adjacent to each other in a direction perpendicular to the polarization direction of the light (along the c-axis when the growth surface of an active layer is an m-plane), and D2 represents the distance between two of the semiconductor light-emitting chips 100 adjacent to each other in a direction identical with the polarization direction of the light (along the a-axis when the growth surface of the active layer is an m-plane). The distance D2 can be less than the distance D1 because a comparison between the luminous intensity distribution in the direction perpendicular to the polarization direction of the light (the luminous intensity distribution in the plane $L_{90}$) and the luminous intensity distribution in the direction identical with the polarization direction of the light (the luminous intensity distribution in the plane $L_0$) shows that in the luminous intensity distribution in the direction perpendicular to the polarization direction of the light (the luminous intensity distribution in the plane $L_{90}$), even when the absolute value of the azimuth angle χ is great, the light intensity is high. Specifically, when the distance D2 is less than the distance D1, this can prevent light beams emitted from the adjacent semiconductor light-emitting chips 100 from interfering with each other.

(Tenth Variation of First Embodiment)

Figure 14:
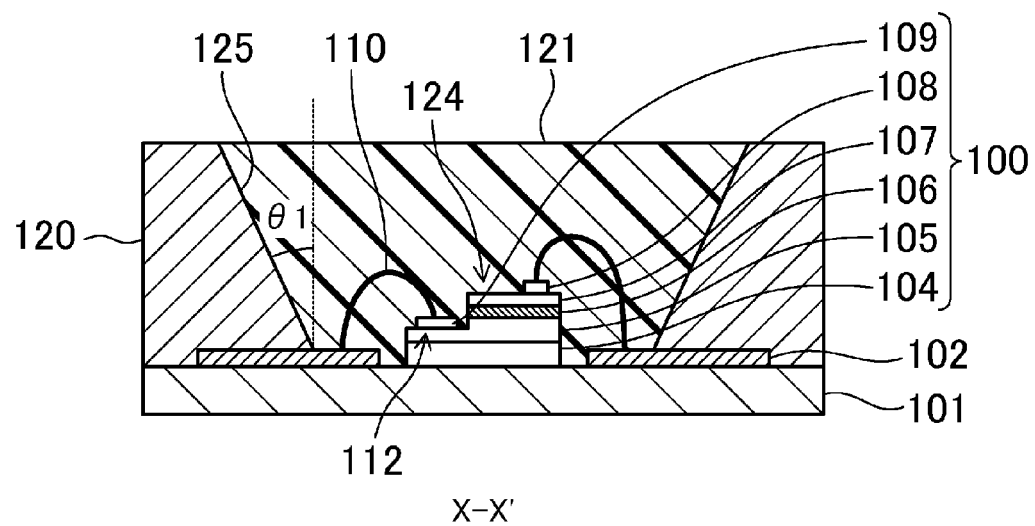
FIG. 14 is a cross-sectional view illustrating a semiconductor light-emitting device according to a tenth variation of the first embodiment.

FIG. 14 illustrates the cross-sectional configuration of a semiconductor light-emitting device according to a tenth variation of the first embodiment. As illustrated in FIG. 14, a semiconductor light-emitting chip 100 according to the tenth variation is mounted on a mounting substrate 101 by wire bonding. Specifically, the semiconductor light-emitting chip 100 is held with a substrate 104 facing a mounting surface of the mounting substrate 101. A p-side electrode 108 and an n-side electrode 109 are each electrically connected to a corresponding one of interconnect electrodes 102 on the mounting substrate 101 through a corresponding one of wires 110 made of gold (Au) or aluminum (Al). A p-type nitride semiconductor layer 107 has a light extraction surface 124. The substrate 104 may be conductive, or may be nonconductive. The substrate 104 may be, for example, an insulative substrate, such as a sapphire substrate.

(Eleventh Variation of First Embodiment)

Figure 15:
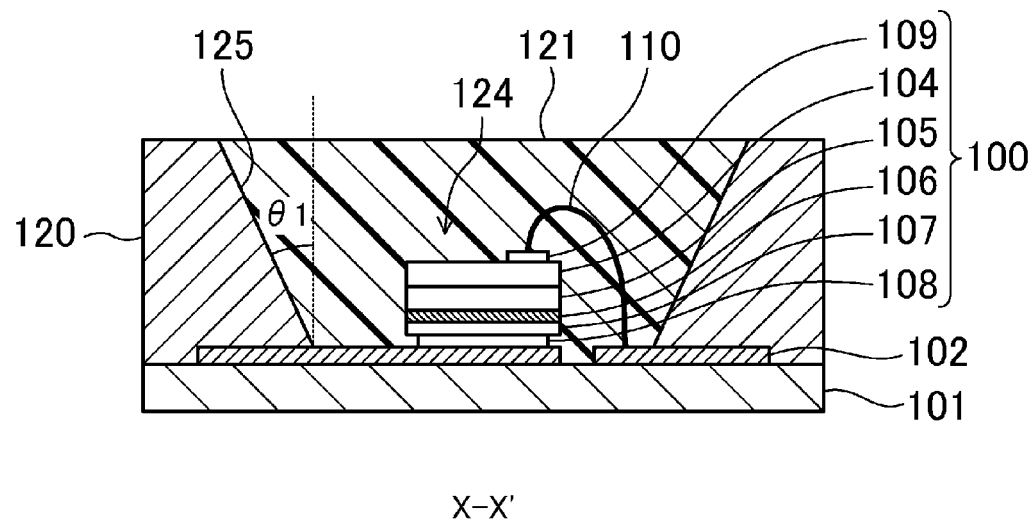
FIG. 15 is a cross-sectional view illustrating a semiconductor light-emitting device according to an eleventh variation of the first embodiment.

FIG. 15 illustrates the cross-sectional configuration of a semiconductor light-emitting device according to an eleventh variation of the first embodiment. As illustrated in FIG. 15, a semiconductor light-emitting chip 100 according to the eleventh variation is mounted on a mounting substrate 101 by wire bonding. Specifically, the semiconductor light-emitting chip 100 is held with a p-side electrode 108 facing a mounting surface of the mounting substrate 101. The p-side electrode 108 is electrically connected to a corresponding one of interconnect electrodes 102 on the mounting substrate 101 with solder of, e.g., gold-tin (AuSn). An n-side electrode 109 is electrically connected to a corresponding one of the interconnect electrodes 102 on the mounting substrate 101 through a wire 110 made of gold (Au) or silver (Ag). A substrate 104 has a light extraction surface 124. In this case, the substrate 104 is conductive.

As such, processes for connecting each of the p-side electrode 108 and the n-side electrode 109 and a corresponding one of the interconnect electrodes 102 on the mounting substrate 101 together vary between flip-chip bonding and wire bonding. However, other configurations of the semiconductor light-emitting chip 100 mounted by wire bonding are substantially similar to those of the semiconductor light-emitting chip 100 mounted by flip-chip bonding, and operational advantages of a semiconductor light-emitting device including the semiconductor light-emitting chip 100 mounted by wire bonding are also similar to those of the semiconductor light-emitting device including the semiconductor light-emitting chip 100 mounted by flip-chip bonding according to the first embodiment.

When an active layer 106 emits polarized light, the first embodiment and its variations allow the polarization characteristics to be reduced. Therefore, also when the active layer 106 has a nonpolar plane, such as an m-plane or an a-plane, or a semipolar plane, such as –r-plane, a (11-22) plane, or a (20-2-1) plane, as a growth surface, this embodiment and its variations can improve the luminous intensity distribution, and allows the degree of polarization of light to be reduced.

Also in each of the tenth and eleventh variations of the first embodiment, a reflector 120 having a cross-sectional shape illustrated in any one of FIGS. 5-7 can be used.

A light-transmissive member 121 having a surface with the shape illustrated in any one of FIGS. 8 and 9 can be combined with each of the tenth and eleventh variations.

The wavelength conversion member 122 illustrated in FIG. 10 can be combined with each of the tenth and eleventh variations.

(Fabrication Method)

A method for fabricating a semiconductor light-emitting device according to the first embodiment will be described hereinafter with reference to FIGS. 4A and 4B.

First, an n-type nitride semiconductor layer 105 is epitaxially grown on the principal surface of a substrate 104 having an m-plane as its principal surface and made of n-type GaN by metal organic chemical vapor deposition (MOCVD) or any other method. Specifically, for example, silicon (Si) is used as an n-type dopant, trimethylgallium (TMG ($Ga(CH_3)_3$)) being a gallium (Ga) source, and ammonia ($NH_3$) being a nitrogen (N) source are supplied to the substrate 104, and the about 1-3-μm-thick n-type nitride semiconductor layer 105 made of GaN is formed at a growth temperature approximately 900-1100° C. In this stage, the substrate 104 is a substrate at the wafer level, and a plurality of light-emitting structures forming semiconductor light-emitting devices can be fabricated at once.

Next, an active layer 106 made of a nitride semiconductor is grown on the n-type nitride semiconductor layer 105. The active layer 106 has an InGaN/GaN multiple quantum well (MQW) structure in which, for example, 3-15-nm-thick well layers made of $In_{1-x}Ga_xN$ and 6-30-nm-thick barrier layers made of GaN are alternately stacked. When the well layers made of $In_{1-x}Ga_xN$ are formed, the growth temperature may be decreased to about 700-800° C. to ensure incorporation of indium (In) into the well layers being grown. The wavelength of emitted light is selected based on the intended use of the semiconductor light-emitting device, and the In content ratio x is determined based on the wavelength. For example, when the wavelength is 450 nm (blue light wavelength), the In content ratio x can be determined to be 0.25-0.27. When the wavelength is 520 nm (green light wavelength), the In content ratio x can be determined to be 0.40-0.42. When the wavelength is 630 nm (red light wavelength), the In content ratio x can be determined to be 0.56-0.58.

Next, a p-type nitride semiconductor layer 107 is epitaxially grown on the active layer 106. Specifically, for example, $Cp_2Mg$ (bis(cyclopentadienyl) magnesium) is used as p-type impurities, TMG and $NH_3$ are supplied, as materials, to the substrate 104, and the about 50-500-nm-thick p-type nitride semiconductor layer 107 made of p-type GaN is formed on the active layer 106 at growth temperature approximately 900-1100° C. The p-type nitride semiconductor layer 107 may contain an about 15-30-nm-thick p-type AlGaN layer. The formation of the p-type AlGaN layer can reduce the overflow of electrons that are carriers. An undoped GaN layer may be formed between the active layer 106 and the p-type nitride semiconductor layer 107.

Next, in order to activate Mg with which the p-type nitride semiconductor layer 107 is doped, the p-type nitride semiconductor layer 107 is thermally treated at temperatures of about 800-900° C. for about 20 minutes.

Next, a semiconductor stacked structure including the substrate 104, the n-type nitride semiconductor layer 105, the active layer 106, and the p-type nitride semiconductor layer 107 is partially etched by lithography and dry etching using a chlorine ($Cl_2$) gas. Thus, a recess 112 is formed by removing a portion of the p-type nitride semiconductor layer 107, a portion of the active layer 106, and a portion of the n-type nitride semiconductor layer 105 to expose a region of the n-type nitride semiconductor layer 105.

Next, an n-side electrode 109 is selectively formed on and in contact with the exposed region of the n-type nitride semiconductor layer 105. Here, for example, a multilayer film (Ti/Pt layer) of titanium (Ti) and platinum (Pt) is formed as the n-side electrode 109.

Next, a p-side electrode 108 is selectively formed on and in contact with the p-type nitride semiconductor layer 107. For example, a multilayer film (Pd/Pt layer) of palladium (Pd) and platinum (Pt) is formed as the p-side electrode 108. Thereafter, heat treatment is performed to alloy a region between the Ti/Pt layer and the n-type nitride semiconductor layer 105 and a region between the Pd/Pt layer and the p-type nitride semiconductor layer 107. The order in which the n-side electrode 109 and the p-side electrode 108 are formed is not particularly limited.

Next, a (back) surface of the substrate 104 opposite to the n-type nitride semiconductor layer 105 is polished to reduce the thickness of the substrate 104 by a predetermined amount.

The wafer-level substrate 104 is singulated into individual semiconductor light-emitting chips 100 corresponding to a plurality of semiconductor light-emitting devices fabricated as above. Examples of this singulation process include various processes, such as laser dicing and cleavage. The individual semiconductor light-emitting chips 100 into which the substrate 104 has been singulated are mounted on a mounting surface of a mounting substrate 101.

Examples of a method for forming a reflector 120 include a method in which a recess is formed in the mounting substrate 101 itself, and a method in which a separately fabricated reflector 120 is bonded to the mounting substrate 101.

Processes of the method in which a recess is formed in the mounting substrate 101 itself vary depending on the principal material of the mounting substrate 101. When the principal material of the mounting substrate 101 is a metal material containing, e.g., aluminum (Al), silver (Ag), copper (Cu), or tungsten (W), the recess can be formed by pressing with dies. When the principal material of the mounting substrate 101 is a sintered material, such as alumina (aluminum oxide) or aluminum nitride (AlN), the previous formation of protrusions/recesses on the inner surfaces of dies enables the formation of a predetermined recess after sintering. When the principal material of the mounting substrate 101 is a semiconductor material, such as silicon (Si) or germanium (Ge), or a composite of the materials, a predetermined recess can be formed by etching after the formation of a mask.

When a reflector 120 is bonded to the mounting substrate 101, the semiconductor light-emitting chip 100 may be mounted on the mounting substrate 101 before the reflector 120 is bonded to the mounting substrate 101. Alternatively, after the reflector 120 has been bonded to the mounting substrate 101, the semiconductor light-emitting chip 100 may be mounted on the mounting substrate 101. When a reflector 120 is bonded to the mounting substrate 101, the principal material of the reflector 120 can be different from the principal material of the mounting substrate 101. For example, when the reflector 120 is made of a metal material containing, e.g., aluminum (Al), silver (Ag), copper (Cu), or tungsten (W), the reflector 120 can be manufactured by pressing with dies. When the reflector 120 is made of a resin material or a plastic material, the reflector 120 can be manufactured by, e.g., injection molding or machining. In this case, a metal material containing, e.g., aluminum (Al), silver (Ag), copper (Cu), or tungsten (W), an insulative material, such as alumina (aluminum oxide) or aluminum nitride (AlN), a semiconductor material, such as silicon (Si) or germanium (Ge), or a composite of the materials can be used as the principal material of the mounting substrate 101.

In order to increase the reflectivity of the reflector 120, Al or Ag, for example, may be deposited on the reflective surface 125 by vapor deposition or plating. Alternatively, a high-reflectivity resin material containing titanium dioxide ($TiO_2$) particles may be deposited on the reflective surface 125.

A metal film for forming interconnect electrodes is formed on the surface of the mounting substrate 101 through a film formation process, such as sputtering or plating. Thereafter, a desired resist pattern is formed on the formed metal film by, e.g., lithography. Thereafter, the resist pattern is transferred to the metal film by dry etching or wet etching to form interconnect electrodes 102 each having a desired electrode shape.

Next, a plurality of bumps 103 are formed on predetermined portions of the interconnect electrodes 102. Gold (Au) is preferably used as a constituent material of the bumps 103. The bumps 103 each having a diameter of about 40-80 μm can be formed with a bump bonder. The bumps 103 can be formed by Au plating instead of with a bump bonder. Subsequently, the interconnect electrodes 102 on which the plurality of bumps 103 are formed and the electrodes of the semiconductor light-emitting chip 100 are electrically connected together by, e.g., ultrasonic welding.

As such, the semiconductor light-emitting device according to the first embodiment can be obtained.

Second Embodiment

Figure 16A:
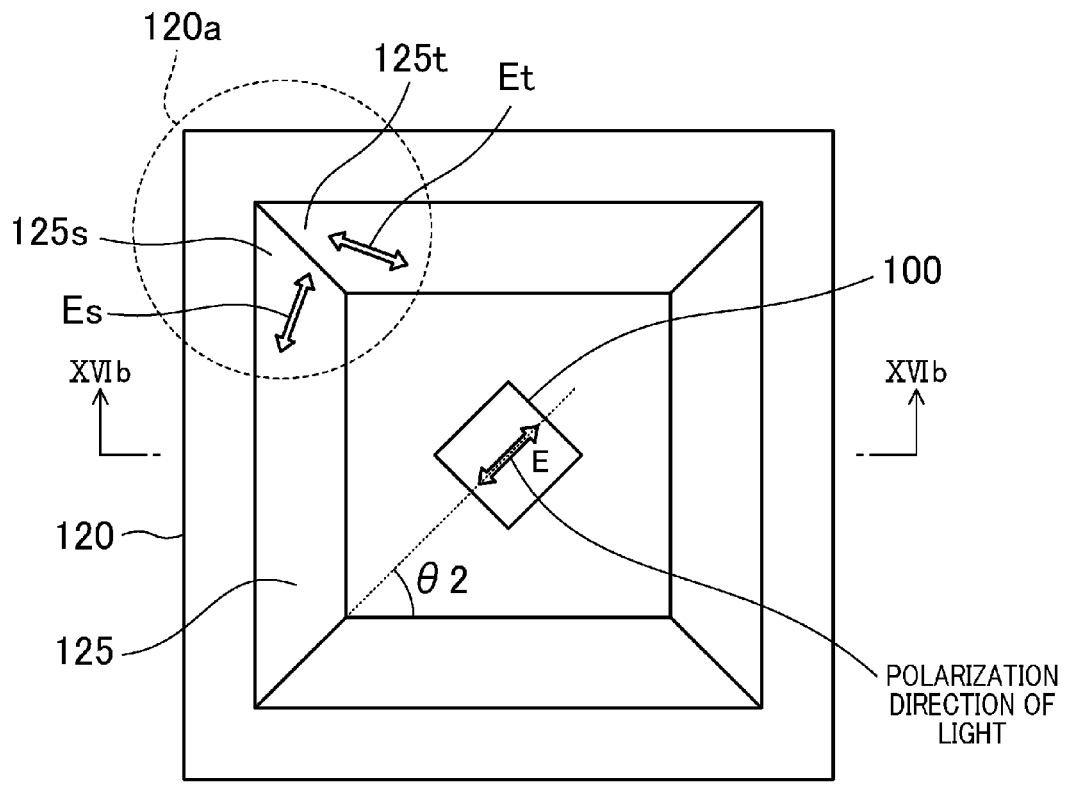
FIG. 16A is a schematic plan view illustrating a semiconductor light-emitting device according to a second embodiment.
Figure 16B:
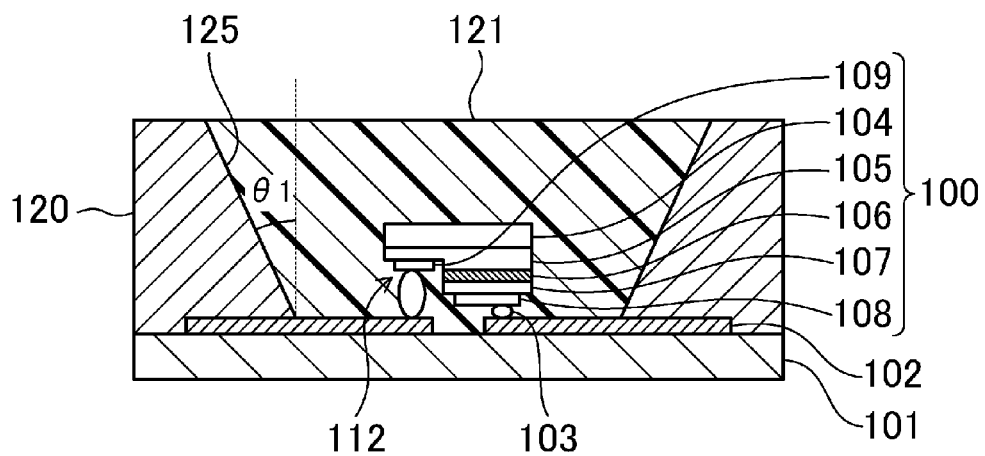
FIG. 16B is a cross-sectional view taken along the line XVIb-XVIb in FIG. 16A.

A semiconductor light-emitting device according to a second embodiment of the present disclosure will be described hereinafter with reference to FIGS. 16A and 16B. In FIGS. 16A and 16B, the same characters as those in FIGS. 4A and 4B are used to represent equivalent components, and thus, description thereof is omitted. Here, the difference between the first and second embodiments will be described.

FIG. 16A illustrates the configuration of the semiconductor light-emitting device according to the second embodiment when viewed in plan. FIG. 16B illustrates a cross-sectional configuration taken along the line XVIb-XVIb in FIG. 16A. The cross section taken along the line XVIb-XVIb corresponds to the plane $L_{45}$. A plurality of reflective surfaces 125 of a reflector 120 are arranged such that a shape formed by the reflective surfaces 125 when viewed in plan is square. The angle θ2 of not less than 17° and not more than 73° allows the normalized degree of polarization to be reduced to one half or less, where θ2 represents the angle between a side of the square shape formed by the reflective surfaces 125 and the polarization direction of light from a semiconductor light-emitting chip 100. The angle θ2 of not less than 30° and not more than 60° allows the normalized degree of polarization to be reduced to one fifth or less. The angle θ2 of an angle 45° allows the normalized degree of polarization to be reduced to one tenth. The normalized degree of polarization of light is a value obtained by normalizing the value relative to the polarity of a configuration in which the reflector 120 is not provided, i.e., the configuration of a first comparative example which will be described later.

When the shape formed by the reflective surfaces 125 when viewed in plan is square, and one side of the square and the direction of polarization of light form the angle θ2, another side adjacent to the one side of the square and the direction of polarization of light form an angle obtained by subtracting θ2 from 90.

When the reflector 120 has a quadrangular shape when viewed in plan, and light is reflected off each corner of the quadrangle formed the reflective surfaces 125, the polarization direction of the reflected light rotates. That is, the phenomenon of rotation of the plane of polarization occurs. When attention is focused on a corner 120a of the square formed by the reflective surfaces 125, a polarization direction Es of first reflected light on a first reflective surface 125s rotates anti-clockwise relative to the polarization direction of light from the semiconductor light-emitting chip 100. On the other hand, on a second reflective surface 125t adjacent to the first reflective surface 125s, a polarization direction Et of second reflected light rotates clockwise relative to the polarization direction of the light from the semiconductor light-emitting chip 100. Thus, composite light of the first reflected light and the second reflected light is elliptically polarized, so that the degree of polarization of the light is reduced. Moreover, when attention is focused on the plane $L_{45}$, emitted light having a high light intensity and a low degree of polarization is concentrated in the normal line direction. As a result, the degree of polarization of light in the normal line direction can be sufficiently reduced.

As described in the first embodiment, each of the reflective surfaces 125 does not need to be linear when viewed in cross section. A plurality of lines may be combined together to form the reflective surface 125, or the reflective surface 125 may be curved. Alternatively, a line and a curve may be combined together. In this case, the reflective surface 125 can be determined to have a portion forming an angle Δθ1 of not less than 20° and not more than 40°, where the arithmetic average inclination angle Δθ1 represents the angle between the reflective surface 125 and the direction of the normal line to the growth surface of each of the semiconductor light-emitting chips 100. Furthermore, also when a portion of the reflective surface 125 having an angle Δθ1 greater than or equal to 0° and less than 20° is located near the mounting substrate 101, the degree of polarization of light in the normal line direction can be reduced.

(First Variation of Second Embodiment)

Figure 17:
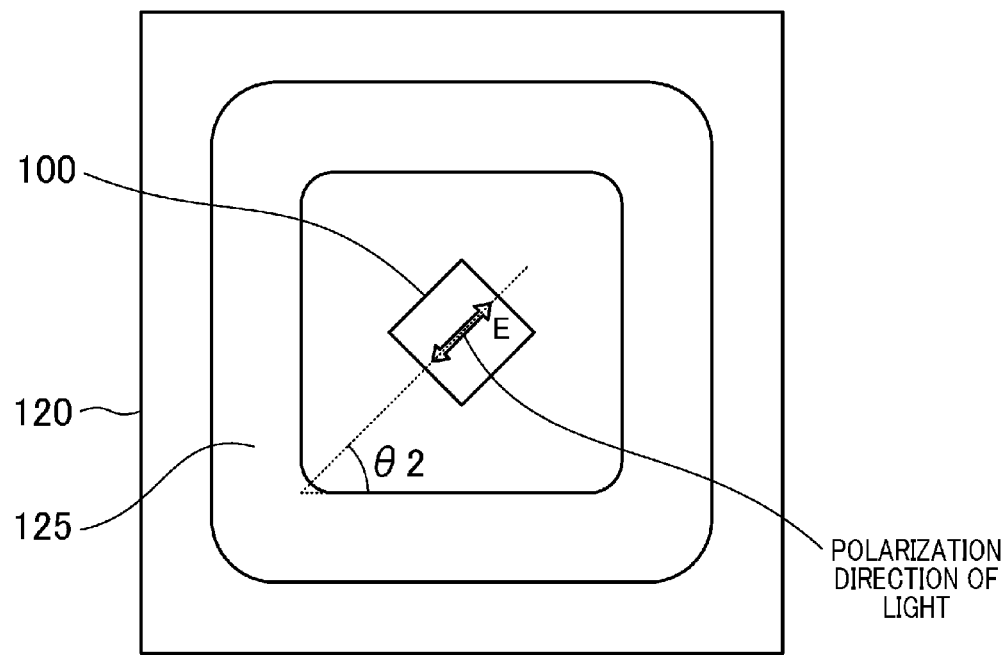
FIG. 17 is a schematic plan view illustrating a semiconductor light-emitting device according to a first variation of the second embodiment.

FIG. 17 illustrates the plan configuration of a semiconductor light-emitting device according to a first variation of the second embodiment. As illustrated in FIG. 17, a reflector 120 of the semiconductor light-emitting device according to the present variation has a reflective surface 125 having corner portions each with a curved surface. The curvature R of the curved surface can be less than the length of each of sides of the semiconductor light-emitting chip 100.

(Second Variation of Second Embodiment)

Figure 18:
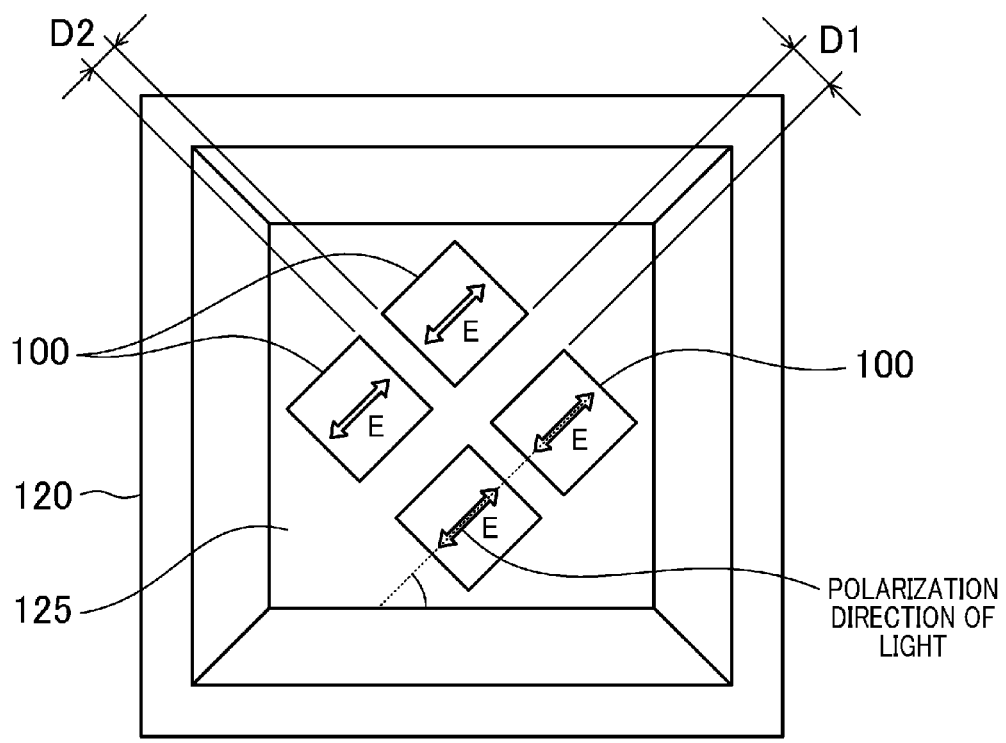
FIG. 18 is a schematic plan view illustrating a semiconductor light-emitting device according to a second variation of the second embodiment.

FIG. 18 illustrates the plan configuration of a semiconductor light-emitting device according to a second variation of the second embodiment. As illustrated in FIG. 18, the semiconductor light-emitting device according to the present variation includes a plurality of semiconductor light-emitting chips 100, four semiconductor light-emitting chips 100 here, arranged on a mounting substrate 101 such that the directions of polarization of light from the semiconductor light-emitting chips 100 are identical. The distance D2 can be less than the distance D1, where D1 represents the distance between two of the semiconductor light-emitting chips 100 adjacent to each other in a direction perpendicular to the direction of polarization of the light, that is, along the c-axis when the growth surface of an active layer is an m-plane, and D2 represents the distance between two of the semiconductor light-emitting chips 100 adjacent to each other in a direction identical with the direction of polarization of the light, that is, along the a-axis when the growth surface of the active layer is an m-plane. The distance D2 can be less than the distance D1 because a comparison between the luminous intensity distribution in the direction perpendicular to the direction of polarization of the light (the luminous intensity distribution in the plane $L_{90}$) and the luminous intensity distribution in the direction identical with the direction of polarization of the light (the luminous intensity distribution in the plane $L_0$) shows that in the luminous intensity distribution in the direction perpendicular to the direction of polarization of the light (the luminous intensity distribution in the plane $L_{90}$), even when the azimuth angle χ is large, the light intensity is high. Specifically, when the distance D2 is less than the distance D1, this can prevent light beams emitted from the adjacent semiconductor light-emitting chips 100 from interfering with each other.

Although, in the second embodiment and its variations, only a flip-chip structure was described, a wire bonding structure as illustrated in FIGS. 14 and 15 can also be used.

Alternatively, the light-transmissive member 121 having any surface form illustrated in FIGS. 8 and 9 can be combined with the present embodiment.

Alternatively, the wavelength conversion member 122 illustrated in FIG. 10 can be combined with the present embodiment.

Moreover, when an active layer 106 emits polarized light, the present embodiment and its variations allow the polarization characteristics to be reduced. Therefore, also when the active layer 106 has a nonpolar plane, such as an m-plane or an a-plane, or a semipolar plane, such as –r-plane, a (11-22) plane, or a (20-2-1) plane, as a growth surface, this embodiment and its variations can improve the luminous intensity distribution, and allow the degree of polarization of light to be reduced.

Third Embodiment

Figure 19A:
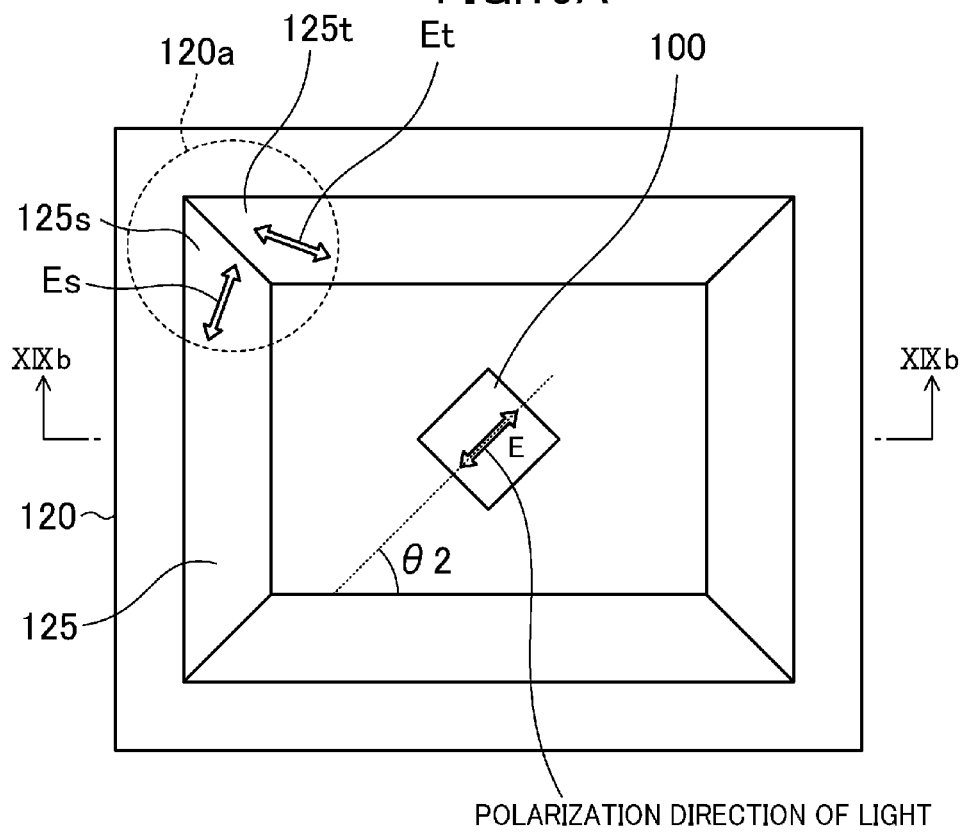
FIG. 19A is a schematic plan view illustrating a semiconductor light-emitting device according to a third embodiment.
Figure 19B:
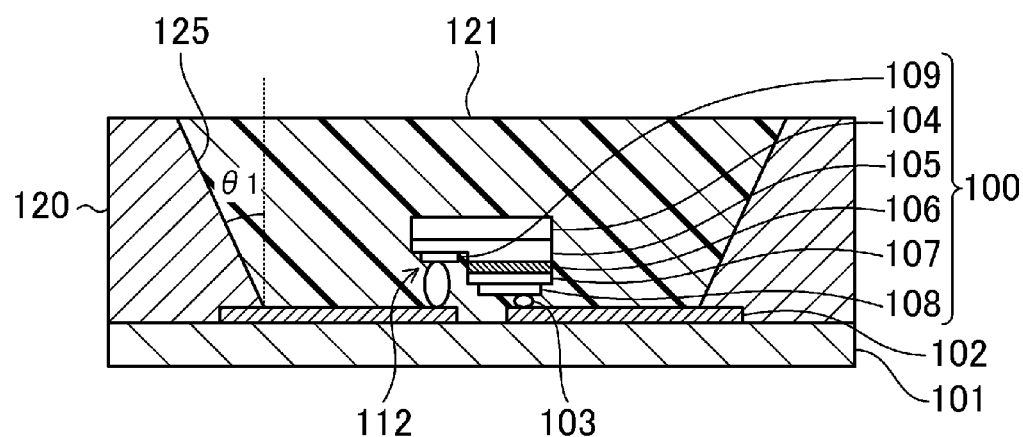
FIG. 19B is a cross-sectional view taken along the line XIXb-XIXb in FIG. 19A.

A semiconductor light-emitting device according to a third embodiment of the present disclosure will be described hereinafter with reference to FIGS. 19A and 19B. In FIGS. 19A and 19B, the same characters as those in FIGS. 4A and 4B are used to represent equivalent components, and thus, description thereof is omitted. Here, the difference between the first and second embodiments will be described.

FIG. 19A illustrates the configuration of the semiconductor light-emitting device according to the third embodiment when viewed in plan. FIG. 19B illustrates a cross-sectional configuration taken along the line XIXb-XIXb in FIG. 19A. The cross section taken along the line XIXb-XIXb corresponds to the plane $L_{45}$. A plurality of reflective surfaces 125 of a reflector 120 are arranged such that a shape formed by the reflective surfaces 125 when viewed in plan is rectangular. The angle θ2 of not less than 20° and not more than 70° allows the normalized degree of polarization to be reduced to one half or less, where θ2 represents the angle between a long side of the rectangular shape formed by the reflective surfaces 125 and the polarization direction of light from a semiconductor light-emitting chip 100. The angle θ2 of not less than 35° and not more than 55° allows the normalized degree of polarization to be reduced to one third or less.

As described in the second embodiment, when the plurality of reflective surfaces 125 of the reflector 120 are arranged such that the shape formed by the reflective surfaces 125 when viewed in plan is quadrangular, and light is reflected off each of corners of the quadrangle formed by the reflective surfaces 125, the phenomenon of rotation of the polarization direction of the reflected light (rotation of the plane of polarization) occurs. Thus, composite light of first reflected light and second reflected light is elliptically polarized, thereby reducing the degree of polarization of light. However, since the degree of the symmetry at the corner in the third embodiment is lower than that in the second embodiment, the effect of the second reflective surface 125t serving as a reflective surface extending in the long side direction is more significant than that of the first reflective surface 125s serving as a reflective surface extending in a short side direction. Thus, the effect of reducing the degree of polarization at each corner of the quadrangle is small, compared to that of the case where a square shape is formed by the reflective surfaces 125. However, emitted light having a high light intensity and having a low degree of polarization in the plane $L_{45}$ is concentrated in the normal line direction, so that it becomes possible to sufficiently reduce the degree of polarization of the light in the normal line direction.

Moreover, as described in the first embodiment, each reflective surface 125 does not need to be linear when viewed in cross section. A plurality of lines may be combined together to form the reflective surface 125, or the reflective surface 125 may be curved. Alternatively, a line and a curve may be combined together. In this case, when the angle between the reflective surface 125 and the direction of the normal to the growth surface of each of the semiconductor light-emitting chips 100 is defined by the arithmetic average inclination angle Δθ1, the reflective surface 125 can be determined such that the angle Δθ1 include an angle of not less than 20° and not more than 40°. Even when the reflective surface 125 having an angle Δθ1 of not less than 0° and less than 20° is formed near a portion of the reflective surface 125 connected to the mounting substrate 101, the degree of polarization of light in the normal direction tends to be reduced.

(First Variation of Third Embodiment)

Figure 20:
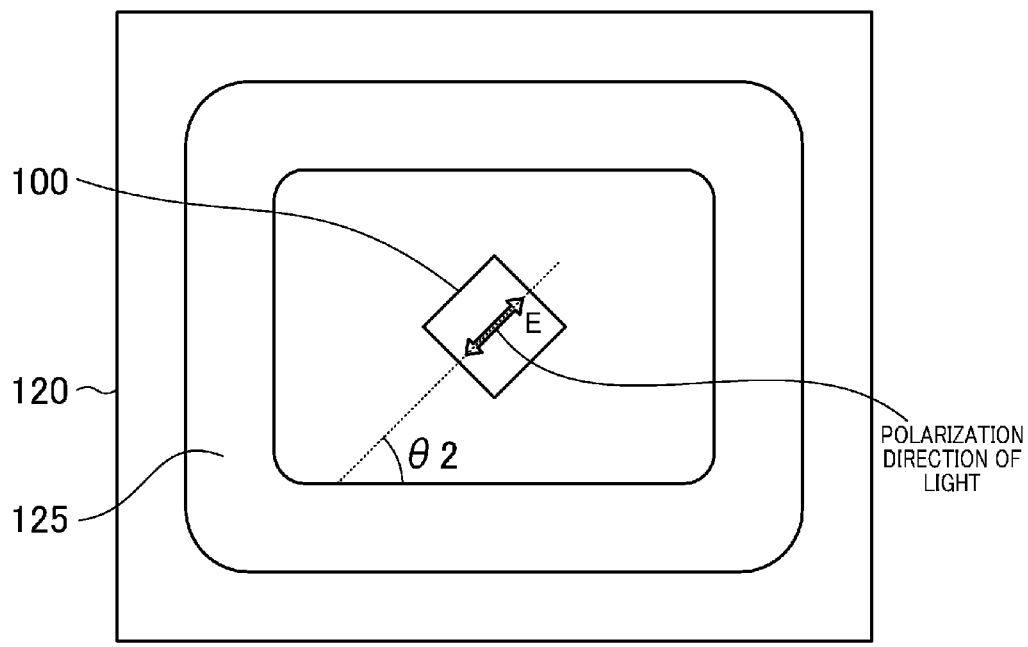
FIG. 20 is a schematic plan view illustrating a semiconductor light-emitting device according to a first variation of the third embodiment.

FIG. 20 illustrates the plan configuration of a semiconductor light-emitting device according to a first variation of the third embodiment. As illustrated in FIG. 20, a reflector 120 of the semiconductor light-emitting device according to the first variation has a reflective surface 125 having corner portions each with a curved surface. The curvature R of the curved surface can be less than the length of each of sides of the semiconductor light-emitting chip 100.

(Second Variation of Third Embodiment)

Figure 21:
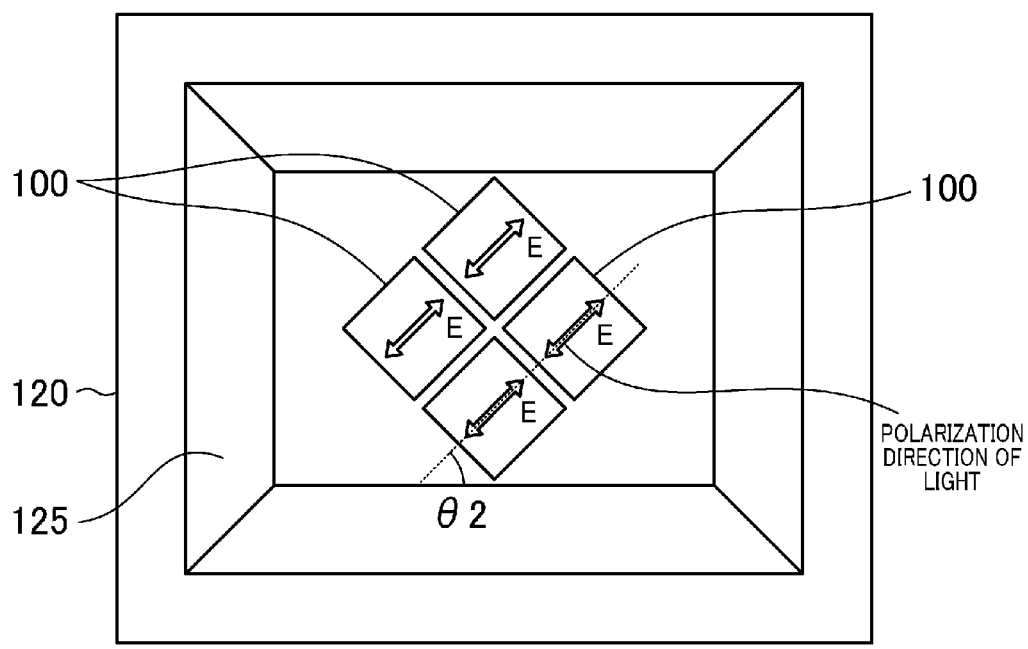
FIG. 21 is a schematic plan view illustrating a semiconductor light-emitting device according to a second variation of the third embodiment.
Figure 22A:
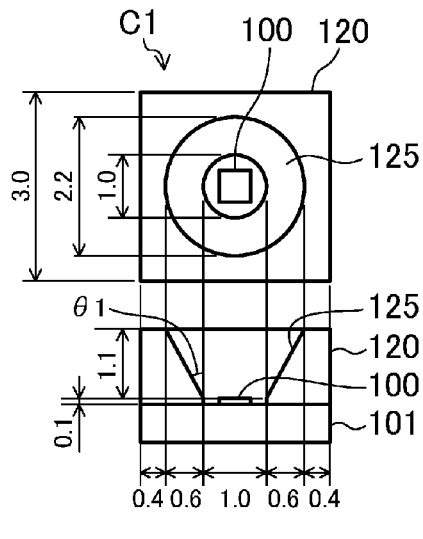
FIG. 22A shows a plan view and a cross-sectional view illustrating a semiconductor light-emitting device including a circular reflector C1 according to an example.
Figure 22B:
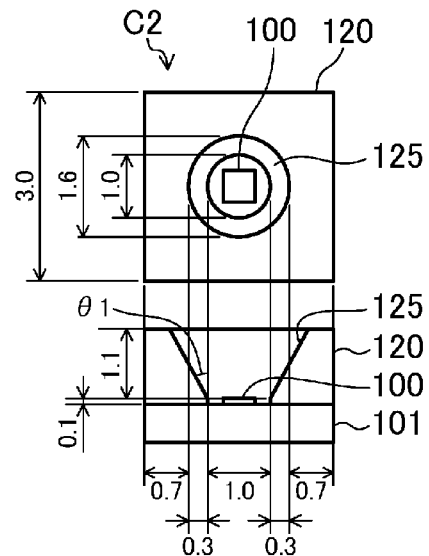
FIG. 22B shows a plan view and a cross-sectional view illustrating a semiconductor light-emitting device including a circular reflector C2 according to an example.
Figure 22C:
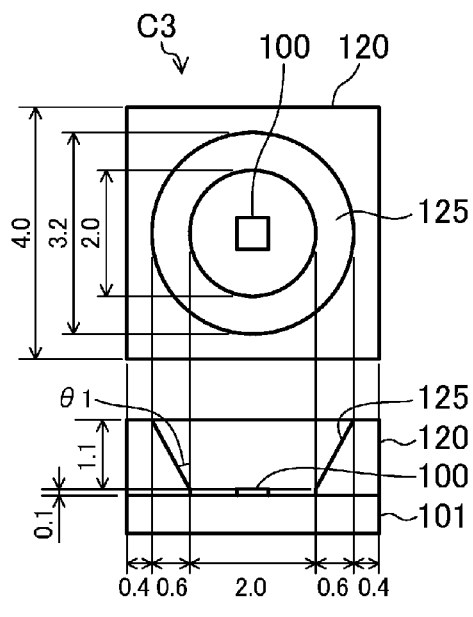
FIG. 22C shows a plan view and a cross-sectional view illustrating the shape of a semiconductor light-emitting device including a circular reflector C3 according to an example.
Figure 22D:
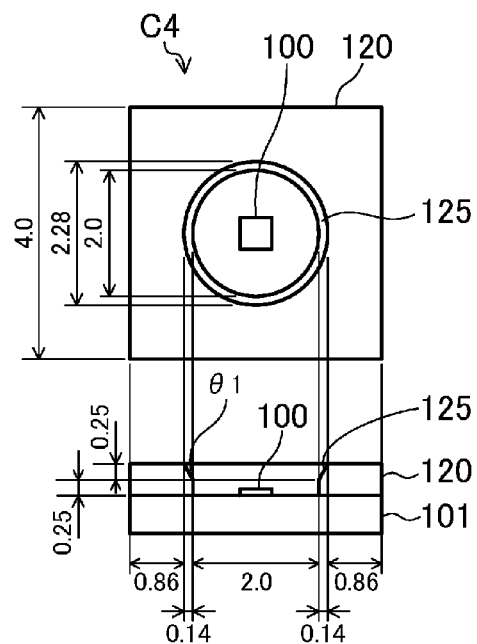
FIG. 22D shows a plan view and a cross-sectional view illustrating the shape of a semiconductor light-emitting device including a circular reflector C4 according to an example.

FIG. 21 illustrates the plan configuration of a semiconductor light-emitting device according to a second variation of the third embodiment. As illustrated in FIG. 21, the semiconductor light-emitting device according to the second variation includes a plurality of semiconductor light-emitting chips 100, four semiconductor light-emitting chips 100 here, arranged on a mounting substrate 101 in a matrix such that the directions of polarization of light from the semiconductor light-emitting chips 100 are identical. The distance D2 can be less than the distance D1, where D1 represents the distance between two of the semiconductor light-emitting chips 100 adjacent to each other in a direction perpendicular to the direction of polarization of the light, that is, along the c-axis when the growth surface of an active layer is an m-plane, and D2 represents the distance between two of the semiconductor light-emitting chips 100 adjacent to each other in a direction identical with the direction of polarization of the light, that is, along the a-axis when the growth surface of the active layer is an m-plane. The distance D2 can be less than the distance D1 because a comparison between the luminous intensity distribution in the direction perpendicular to the direction of polarization of the light (the luminous intensity distribution in the plane $L_{90}$) and the luminous intensity distribution in the direction identical with the direction of polarization of the light (the luminous intensity distribution in the plane $L_0$) shows that in the luminous intensity distribution in the direction perpendicular to the direction of polarization of the light (the luminous intensity distribution in the plane $L_{90}$), even when the azimuth angle χ is large, the light intensity is high. Specifically, when the distance D2 is less than the distance D1, this can prevent light beams emitted from the adjacent semiconductor light-emitting chips 100 from interfering with each other.

Although, in the second embodiment and its variations, only a flip-chip structure was described, a wire bonding structure as illustrated in FIGS. 14 and 15 can also be used.

A light-transmissive member 121 having a surface with the shape illustrated in any one of FIGS. 8 and 9 can be combined with each of this embodiment.

The wavelength conversion member 122 illustrated in FIG. 10 can also be combined with each of this embodiment.

Furthermore, when an active layer 106 emits polarized light, this embodiment and its variations allow the degree of polarization of light to be reduced. Therefore, also when the active layer 106 has a nonpolar plane, such as an m-plane or an a-plane, or a semipolar plane, such as –r-plane, a (11-22) plane, or a (20-2-1) plane, as a growth surface, this embodiment and its variations can improve the luminous intensity distribution, and allow the degree of polarization of light to be reduced.

EXAMPLES

First Example

A semiconductor light-emitting device according to a first example will be described hereinafter with reference to FIGS. 22A-22D. The dimensions in FIGS. 22A-22D are expressed in units of millimeters (mm). The same characters as those in the first embodiment are used to represent equivalent components. The same applies to the following examples.

First, a method for fabricating a semiconductor light-emitting chip 100 forming a portion of the semiconductor light-emitting device according to the first example and including an active layer having a growth surface that is an m-plane will be schematically described.

First, a 2-μm-thick n-type nitride semiconductor layer made of n-type GaN, an active layer having a three-period quantum well structure including a quantum well layer made of InGaN and a barrier layer made of GaN, and a 0.5-μm-thick p-type nitride semiconductor layer made of p-type GaN were formed on a wafer-level n-type GaN substrate having an m-plane as its principal surface by, e.g., MOCVD.

A Ti/Al layer was formed as an n-side electrode, and an Ag layer was formed as a p-side electrode. Thereafter, the back surface of the n-type GaN substrate was polished to reduce the thickness of the n-type GaN substrate to a thickness of 100 μm.

Subsequently, grooves having a depth of about several tens of μm from the surface of the wafer were formed in the wafer including light-emitting structures along the c-axis, i.e., the [0001] direction, and the a-axis, i.e., the [11-20] direction, with laser beams. Thereafter, the wafer was broken into semiconductor light-emitting chips 100 made of an m-plane GaN-based semiconductor and having sides each having a length of 450 μm.

Subsequently, one of the fabricated semiconductor light-emitting chips 100 was mounted on a mounting substrate 101 made of AlN by flip-chip mounting. The thickness of the mounting substrate 101 made of AlN is about 0.7 mm. Interconnect electrodes 102 each having a thickness of about 4 μm and made of silver (Ag) were formed on the mounting substrate 101.

As such, a semiconductor light-emitting device including the active layer having a growth surface that is an m-plane was fabricated. In this state, no reflector 120 is provided. The measured wavelength of light emitted from the semiconductor light-emitting device at an operating current of 10 mA was 445 nm. The polarization direction of the emitted light is along the a-axis, and the degree of polarization of light measured along the m-axis corresponding to the normal line direction was 0.68. Such a semiconductor light-emitting device that does not include a reflector 120 corresponds to a semiconductor light-emitting device according to a first comparative example.

were each adhered to the mounting substrate 101 on which one of the semiconductor light-emitting chips 100 was mounted, thereby fabricating four types of semiconductor light-emitting devices according to the first example each including one of the four circular aluminum reflectors C1-C4.

Table 1 provides the range of azimuth angles χ of light reflected off a reflective surface 125 of each of the circular reflectors C1-C4, the angle θ1 between the reflective surface 125 and the normal direction, the normalized degree of polarization of the light in the normal direction, and the normalized intensity of the light in the normal direction. Table 1 also provides the properties of the semiconductor light-emitting device that does not include a reflector 120 according to the first comparative example. Here, the range of azimuth angles χ of light reflected off a reflective surface 125 of each of the circular reflectors C1-C4 and the angle θ1 between the reflective surface 125 and the normal direction are designed values for the reflectors 120. The normalized degree of polarization of the light in the normal direction, and the normalized intensity of the light in the normal direction are values obtained by measuring the actually fabricated semiconductor light-emitting devices, and are values normalized with respect to the properties of the semiconductor light-emitting device that does not include a reflector 125 according to the first comparative example.

TABLE 1

| Circular Reflector | Range [°] of Azimuth Angles χ of Light Reflected Off Reflective Surface | Angle θ1 [°] Between Reflective Surface And Normal Line Direction | Degree of Polarization of Light In Normal Line Direction | Normalized Degree of Polarization of Light In Normal Line Direction | Normalized Light Intensity In Normal Line Direction |
|---|---|---|---|---|---|
| C1 | 42.5-78.7 | 28.6 | 0.25 | 0.37 | 8.9 |
| C2 | 33.7-78.7 | 15.3 | 0.31 | 0.46 | 6.8 |
| C3 | 53.1-84.3 | 28.6 | 0.18 | 0.26 | 12.5 |
| C4 | 66.3-76.0 | 29.2 | 0.45 | 0.66 | 2.4 |
| Without Reflector (1st compar. ex.) | — | — | 0.68 | 1 | 1 |

Separately from the semiconductor light-emitting chip 100, four circular reflectors C1, C2, C3, and C4 made of aluminum and each having a circular reflective surface 125 when viewed in plan was fabricated by press molding. The fabricated circular reflectors C1-C4 each have a portion of the reflective surface 125 having a height of 100 μm from the top surface of the mounting substrate 101 and having an angle θ1 of 0°.

Figure 23:
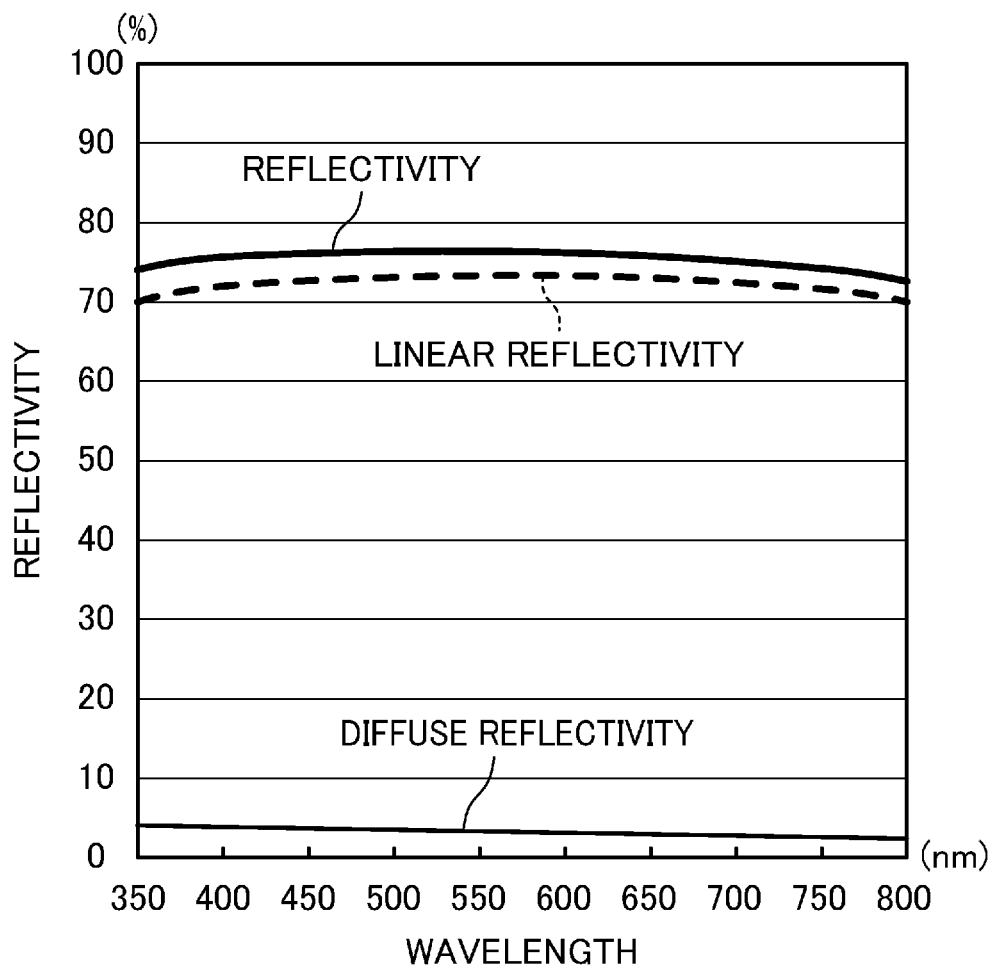
FIG. 23 is a graph illustrating the reflectivities of a reflective surface of the aluminum reflector according to the example.

FIG. 23 illustrates results of measuring the reflectivities of one of the reflective surfaces 125 of the circular reflectors C1-C4. In the measurement of the reflectivities, light having a wavelength within the range of wavelengths from 350 nm to 800 nm was measured using a spectrophotometer (UV-VIS) made by JASCO Corporation. In the measurement, the linear reflectivity and the diffuse reflectivity of the light were measured, and the sum of the linear reflectivity and the diffuse reflectivity was defined as the total reflectivity. FIG. 23 shows that the total reflectivity of a reflective surface of the fabricated reflector 120 made of aluminum is greater than or equal to 73%, and the proportion of the liner reflectivity to the total reflectivity is greater than or equal to 95%. This shows that the square reflector S1 is a reflector having high linear reflectivity.

As such, the circular reflectors C1-C4 made of aluminum and fabricated separately from the mounting substrate 101

The circular reflectors C1 and C3 are designed such that a value twice as large as the angle θ1 is included in the range of the azimuth angle χ of light reflected off the reflective surface 125. That is, the circular reflectors C1 and C3 are designed such that light emitted from the semiconductor light-emitting chip 100 in a direction in which the azimuth angle χ is twice as large as θ1 is reflected off the reflective surface 125 in the normal line direction.

The circular reflectors C2 and C4 are structured such that light emitted from the semiconductor light-emitting chip 100 in a direction in which the azimuth angle χ is twice as large as θ1 is reflected off the portion of the reflective surface 125 formed near a connection portion of the reflective surface 125 to the mounting substrate 101 and having an angle θ1 of 0°. Thus, the design of the circular reflectors C2 and C4 results in a deviation from an optimum value.

Figure 24A:
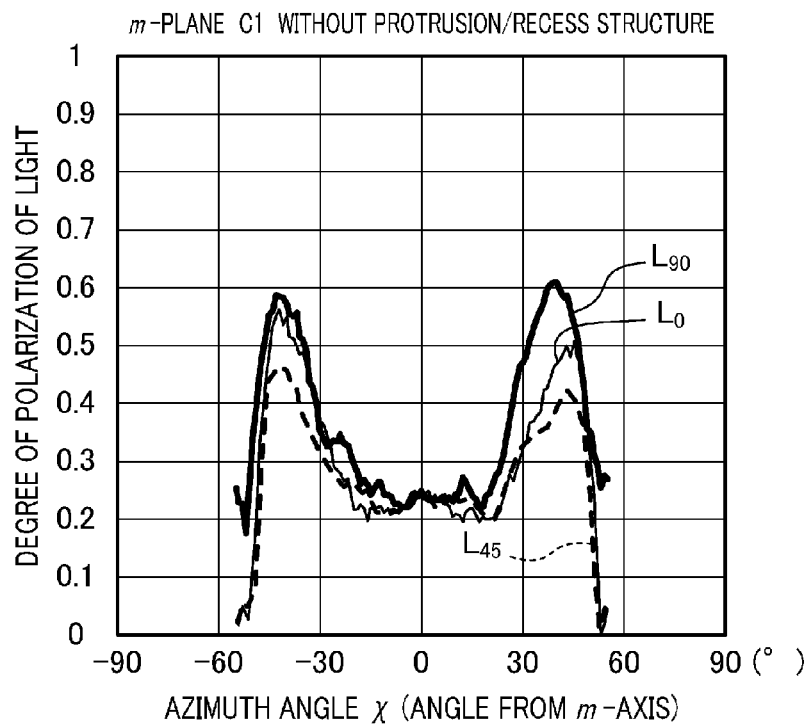
FIG. 24A is a graph illustrating the degree of polarization of the semiconductor light-emitting device including the circular reflector C1 according to a first example.
Figure 24B:
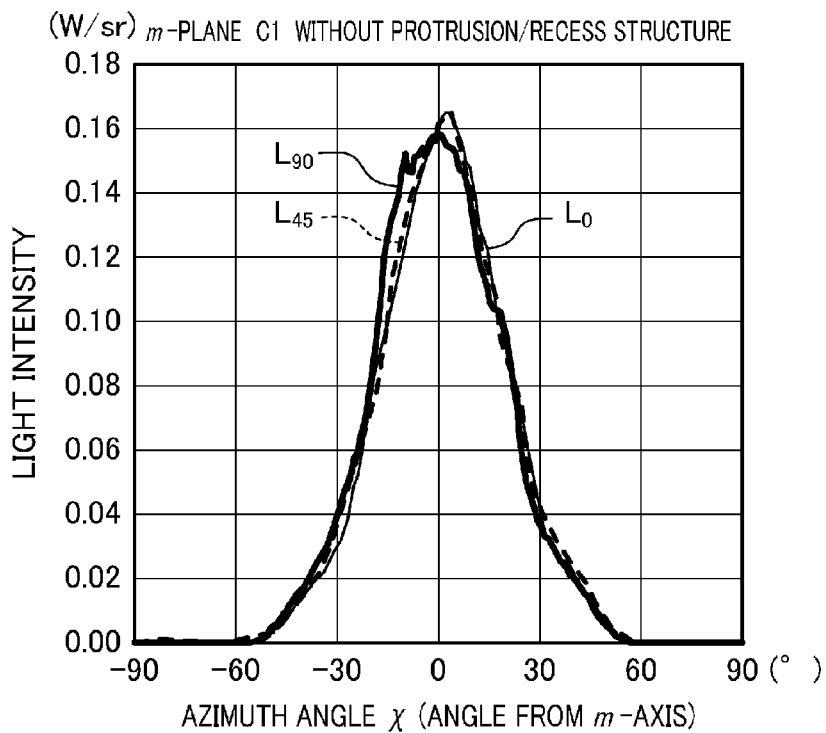
FIG. 24B is a graph illustrating the luminous intensity distribution of the semiconductor light-emitting device including the circular reflector C1 according to the first example.

FIGS. 24A and 24B show the degree of polarization and the luminous intensity distribution of a semiconductor light-emitting device provided with the circular reflector C1. The thin solid line in these figures illustrates the properties in the plane $L_0$, the broken line therein illustrates the properties in the plane $L_{45}$, and the thick solid line therein illustrates the properties in the plane $L_{90}$. From the degree of polarization shown in FIG. 24A, it can be seen that when the azimuth angle $\chi$ is in the range from $-20°$ to $+20°$, the degree of polarization is substantially constant, where the degree of polarization is approximately form 0.21 to 0.25, and that the degree of polarization is reduced, compared to 0.68 obtained in the case where the reflector is not provided. The luminous intensity distribution illustrated in FIG. 24B shows that the light distribution angle in the plane $L_0$ is 39.0°, and the light distribution angle in the plane $L_{90}$ is 42.5°. Here, the light distribution angle is a full width at half maximum, and corresponds to the angle range within which when the light intensity in the normal direction is 100, the light intensity is 50. The light distribution angle is referred to also as the angle of beam spread or the divergence angle of light.

From the results, it can be seen that the angle range in which the degree of polarization of light can be reduced substantially corresponds to the range of the light distribution angle, and that the degree of polarization of major portions of light emitted from the semiconductor light-emitting chip 100 is reduced. In the plane $L_{90}$ and the plane $L_{45}$ of the semiconductor light-emitting device in which the reflector is not provided, the light intensity has characteristically high peaks when the azimuth angle $\chi$ is about ±60°. However, such high peaks are not observed in the semiconductor light-emitting device provided with the circular reference C1.

As described above, in the semiconductor light-emitting device provided with the circular reflector C1 designed to reflect light emitted at an azimuth angle $\chi$ within the range from about 40° to about 80°, the degree of polarization of light can be reduced and the light distribution angle can be reduced while the asymmetry of the luminous intensity distribution is reduced.

Figure 25A:
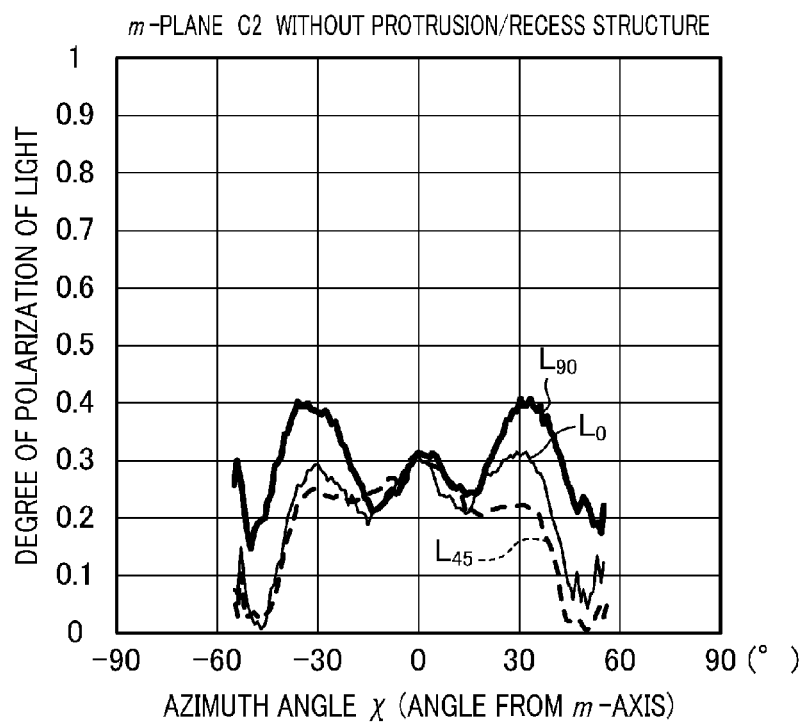
FIG. 25A is a graph illustrating the degree of polarization of the semiconductor light-emitting device including the circular reflector C2 according to the first example.
Figure 25B:
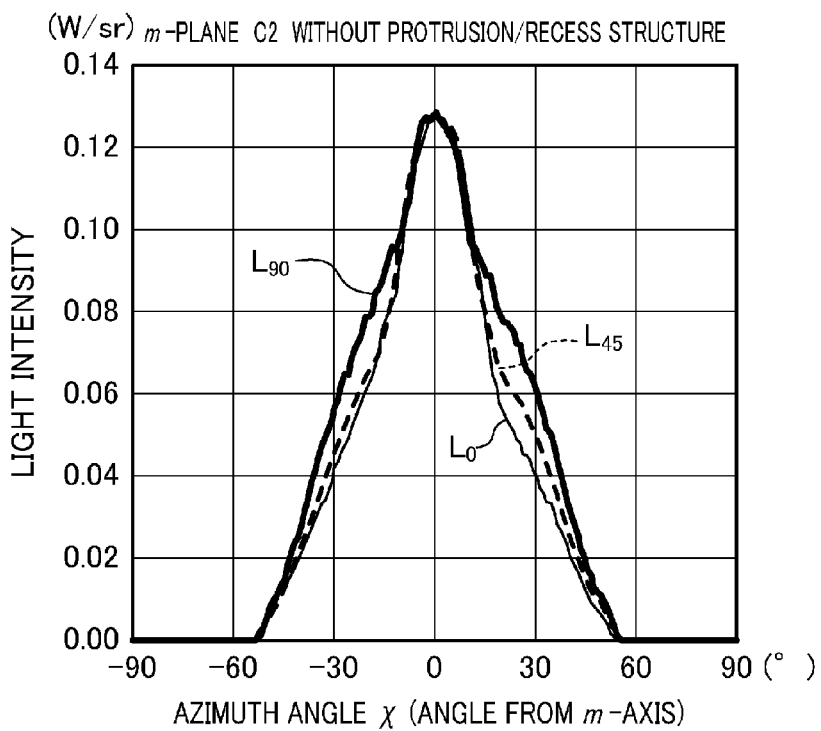
FIG. 25B is a graph illustrating the luminous intensity distribution of the semiconductor light-emitting device including the circular reflector C2 according to the first example.

FIGS. 25A and 25B show the degree of polarization and the luminous intensity distribution of a semiconductor light-emitting device provided with the circular reflector C2. The thin solid line in these figures illustrates the properties in the plane $L_0$, the broken line therein illustrates the properties in the plane $L_{45}$, and the thick solid line therein illustrates the properties in the plane $L_{90}$. From the degree of polarization shown in FIG. 25A, it can be seen that the degree of polarization of light in the normal line direction is 0.31, and that the degree of polarization is reduced, compared to 0.68 obtained in the case where the reflector is not provided. Moreover, the degree of polarization shows a minimum value at an azimuth angle $\chi$ of ±15°. The luminous intensity distribution illustrated in FIG. 25B shows that the light distribution angle in the plane $L_0$ is 37.0°, and the light distribution angle in the plane $L_{90}$ is 59.5°, and thus the difference between the angles is large. In the plane $L_{90}$ and the plane $L_{45}$ of the semiconductor light-emitting device in which the reflector is not provided, the light intensity has characteristically high peaks when the azimuth angle $\chi$ is about ±60°. However, such high peaks are not observed in the luminous intensity distribution of the semiconductor light-emitting device provided with the circular reference C2, and thus the degree of polarization of light is reduced.

As described above, since the design value of the reflective surface 125 of the circular reflector C2 deviates from the optimal value, a direction in which the degree of polarization of light is minimum deviates from the normal line direction. Moreover, the difference between the angle of light distribution in the plane $L_o$ and the light distribution angle in the plane $L_{90}$ becomes significant.

Figure 26A:
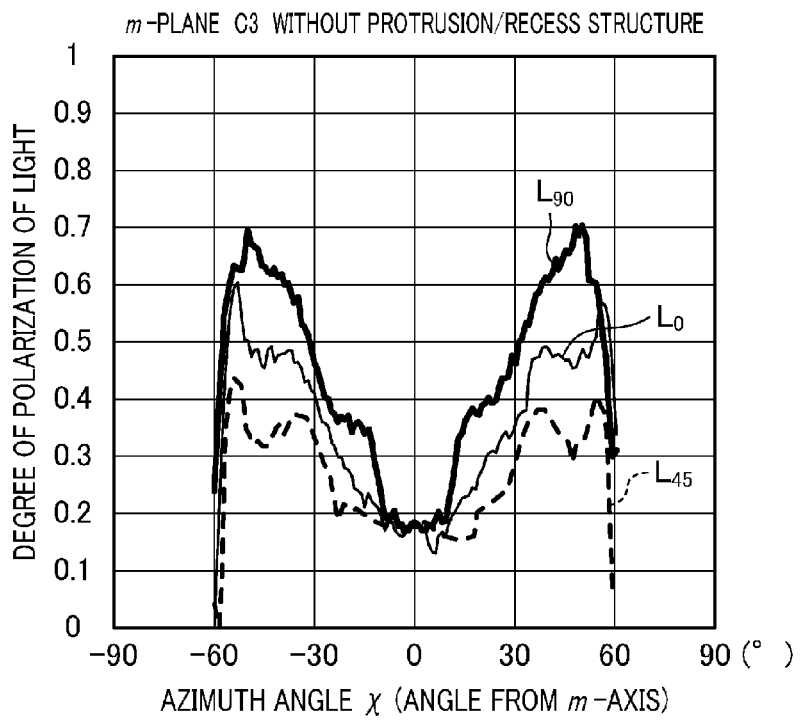
FIG. 26A is a graph illustrating the degree of polarization of the semiconductor light-emitting device including the circular reflector C3 according to the first example.
Figure 26B:
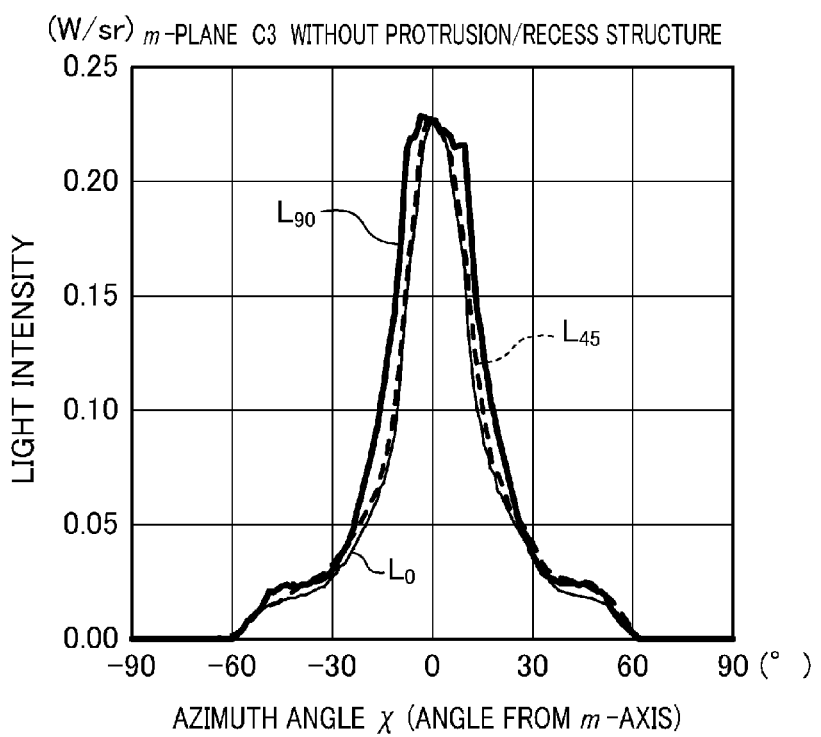
FIG. 26B is a graph illustrating the luminous intensity distribution of the semiconductor light-emitting device including the circular reflector C3 according to the first example.

FIGS. 26A and 26B show the degree of polarization and the luminous intensity distribution of a semiconductor light-emitting device provided with the circular reflector C3. The thin solid line in these figures illustrates the properties in the plane $L_0$, the broken line therein illustrates the properties in the plane $L_{45}$, and the thick solid line therein illustrates the properties in the plane $L_{90}$. From the degree of polarization shown in FIG. 26A, it can be seen that when the azimuth angle $\chi$ is in the range from $-10°$ to $+10°$, the degree of polarization of light is substantially constant and is 0.18, and that the degree of polarization is reduced, compared to 0.68 obtained in the case where the reflector is not provided. The luminous intensity distribution illustrated in FIG. 26B shows that the light distribution angle in the plane $L_0$ is 22.0°, and the light distribution angle in the plane $L_{90}$ is 32.0°. From the results, it can be seen that the angle range in which the degree of polarization of light is reduced substantially corresponds to the range of the light distribution angle, and that the degree of polarization of major portions of light emitted from the semiconductor light-emitting chip 100 is reduced. In the plane $L_{90}$ and the plane $L_{45}$ of the semiconductor light-emitting device in which the reflector is not provided, the light intensity has characteristically high peaks when the azimuth angle $\chi$ is about ±60°. However, such high peaks are not observed in semiconductor light-emitting device provided with the circular reference C3.

As described above, in the circular reflector C3 designed to reflect light emitted at an azimuth angle $\chi$ within the range from about 50° to about 80°, the degree of polarization of light can be reduced and the light distribution angle can be reduced while the asymmetry of the luminous intensity distribution is reduced. The effect of reducing the degree of polarization of light is more significant than that in the case of using the circular reflector C1.

FIGS. 27A and 27B show the degree of polarization and the luminous intensity distribution of a semiconductor light-emitting device provided with the circular reflector C4. The thin solid line in these figures illustrates the properties in the plane $L_0$, the broken line therein illustrates the properties in the plane $L_{45}$, and the thick solid line therein illustrates the properties in the plane $L_{90}$. From the degree of polarization shown in FIG. 27A, it can be seen that the degree of polarization of light in the normal line direction is 0.35, and that the degree of polarization of light is reduced, compared to 0.68 obtained in the case where the reflector is not provided. Moreover, the degree of polarization of light shows a minimum value at an azimuth angle $\chi$ of ±13°. The luminous intensity distribution illustrated in FIG. 27B shows that the light distribution angle in the plane $L_0$ is 35.2°, and the light distribution angle in the plane $L_{90}$ is 46.5°. Two characteristically high peaks of light intensity are observed from the luminous intensity distribution because the effect of the reflective surface 125 is insufficient in the plane $L_{90}$. As described above, since the design value of the reflective surface 125 of the circular reflector C4 deviates from the optimal value, a direction in which the degree of polarization of light is minimum deviates from the normal line direction. Moreover, the difference between the light distribution angle in the plane $L_0$ and the light distribution angle in the plane $L_{90}$ becomes significant.

The circular reflector C4 designed to have a narrow range of the azimuth angle $\chi$ of light reflected off the reflective surface 125 and a value of the angle θ1 which deviates from the optimal value is least effective in reducing the normalized degree of polarization in the normal line direction. As can be seen from Table 1, in the configuration provided with the circular reflector C4, the normalized intensity of light in the normal line direction is a low value of 2.4. That is, the effect of concentrating light in the normal line direction of the upper surface of the semiconductor light-emitting chip 100 is small, and consequently, the effect of reducing the degree of polarization of light is also small.

After the circular reflector C4, the circular reflector C2 designed to have the largest range of the azimuth angle χ of light reflected off the reflective surface 125 and an angle θ1 whose value deviates from the optimal value is second least effective in reducing the normalized degree of polarization in the normal line direction.

Figure 28:
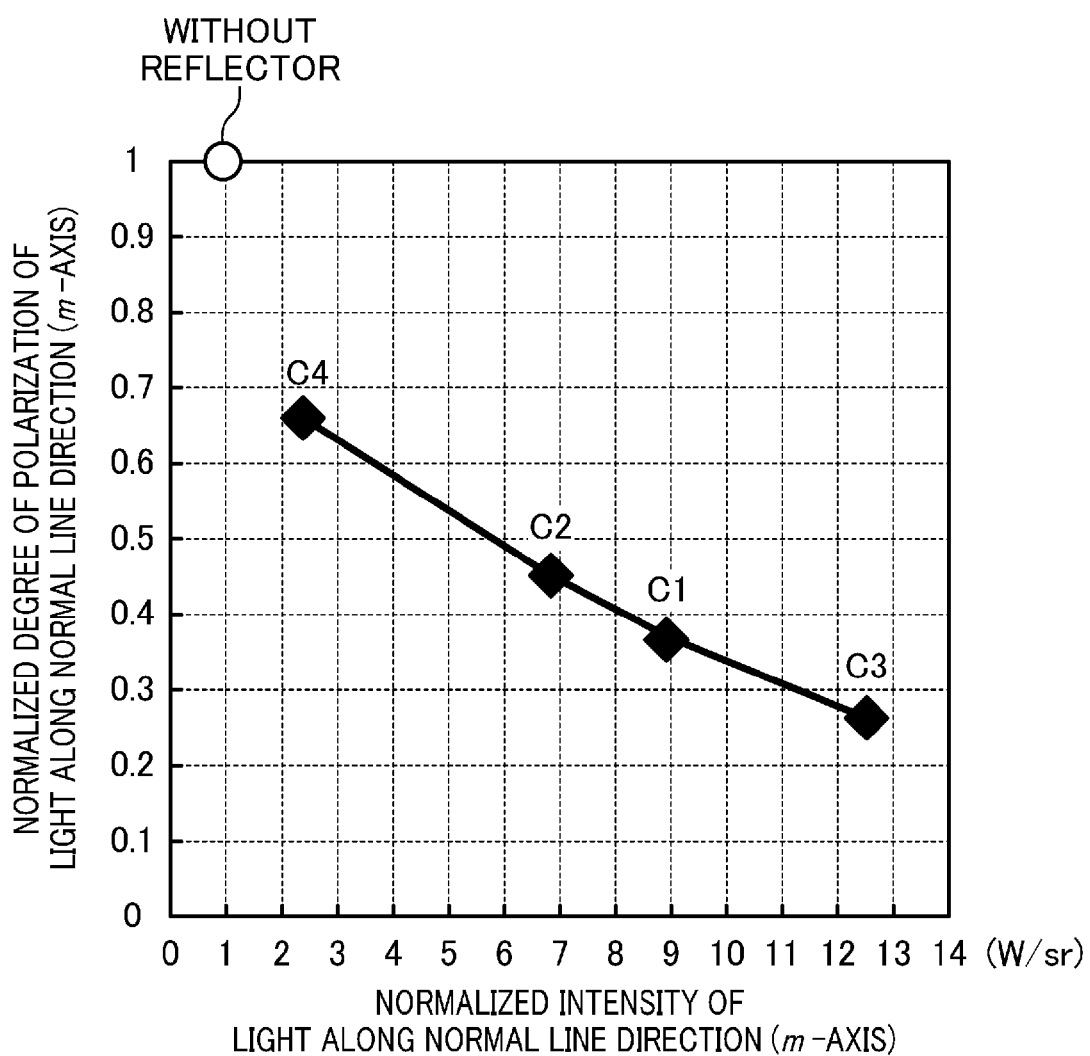
FIG. 28 is a graph illustrating the relationship between normalized intensity of light in a normal line direction and normalized degree of polarization in the normal line direction according to the first example.

FIG. 28 shows the normalized light intensity in the normal line direction, and the normalized degree of polarization in the normal line direction in the semiconductor light-emitting devices provided with the circular reflectors C1, C2, C3, and C4. As can be seen from FIG. 28, the semiconductor light-emitting devices provided with the circular reflectors C2 and C4 in which the design value of the reflective surface 125 deviates from an optimal value exhibit small values of the normalized light intensity in the normal line direction. Consequently, the value of the normalized degree of polarization increases. On the other hand, the semiconductor light-emitting devices provided with the circular reflectors C1 and C3 in which the design value of the reflective surface 125 is in the range of optimal values exhibit large values of the normalized light intensity in the normal line direction, and small values of the normalized degree of polarization. It can be seen from FIG. 28 that as long as the reflective surface 125 is designed to increase the light intensity in the normal line direction by a factor of about five or more, the degree of polarization of light in the normal line direction can be reduced to about one half or less.

Second Example

A semiconductor light-emitting device according to a second example will be described hereinafter with reference to FIGS. 22A-22D, and FIGS. 11A and 11B.

The second example is different from the first example in that the protrusion/recess structure 130 as illustrated in FIGS. 11A and 11B is formed on a light extraction surface of a semiconductor light-emitting chip 100 of the second example. The formed protrusion/recess structure 130 is composed of two-dimensionally arranged hemispherical raised portions having a radius of about 5 μm. To form the protrusion/recess structure 130, a patterned resist mask was formed on a wafer-level substrate 104 provided with light-emitting structure, and then dry etching using a chlorine-based gas was performed. After the formation of the protrusion/recess structure 130, the wafer-level substrate 104 was singulated into semiconductor light-emitting chips 100, and one of the semiconductor light-emitting chips 100 was mounted on a mounting substrate 101. The second example is the same as the first example except for the formation of the protrusion/recess structure 130. As such, a semiconductor light-emitting device including the active layer having a growth surface that is an m-plane and the protrusion/recess structure formed on the light extraction surface was fabricated. In this state, no reflector 120 is provided. The measured wavelength of light emitted from the semiconductor light-emitting device at an operating current of 10 mA was 445 nm. The polarization direction is along the a-axis, and the degree of polarization of light measured along the m-axis corresponding to the normal line direction was 0.29. Such a semiconductor light-emitting device that does not include a reflector 120 corresponds to a semiconductor light-emitting device according to a second comparative example. The protrusion/recess structure 130 formed on the light extraction surface of the semiconductor light-emitting chip 100 scatters outgoing light, thereby reducing the degree of polarization of the light in the normal line direction compared to the first example.

Similar to the first example, the circular reflectors C1-C4 made of aluminum and fabricated separately from the mounting substrate 101 were each adhered to the mounting substrate 101 on which one of the semiconductor light-emitting chips 100 was mounted, thereby fabricating four types of semiconductor light-emitting devices according to the second example each including one of the four circular aluminum reflectors C1-C4.

Table 2 provides the range of azimuth angles χ of light reflected off a reflective surface 125 of each of the circular reflectors C1-C4, the angle θ1 between the reflective surface 125 and the normal direction, the normalized degree of polarization of the light in the normal direction, and the normalized intensity of the light in the normal direction. Table 2 also provides the properties of the semiconductor light-emitting device that does not include a reflector 120 according to the second comparative example.

TABLE 2

(with protrusion/recess structure)

| Circular Reflector | Range [°] of Azimuth Angles χ of Light Reflected Off Reflective Surface | Angle θ1 [°] Between Reflective Surface And Normal Line Direction | Degree of Polarization of Light In Normal Line Direction | Normalized Degree of Polarization of Light In Normal Line Direction | Normalized Light Intensity In Normal Line Direction |
|---|---|---|---|---|---|
| C1 | 42.5-78.7 | 28.6 | 0.10 | 0.34 | 8.0 |
| C2 | 33.7-78.7 | 15.3 | 0.13 | 0.46 | 5.4 |
| C3 | 53.1-84.3 | 28.6 | 0.07 | 0.24 | 10.1 |
| C4 | 66.3-76.0 | 29.2 | 0.17 | 0.59 | 2.6 |
| Without Reflector (2nd compar. ex.) | — | — | 0.29 | 1 | 1 |

Figure 29:
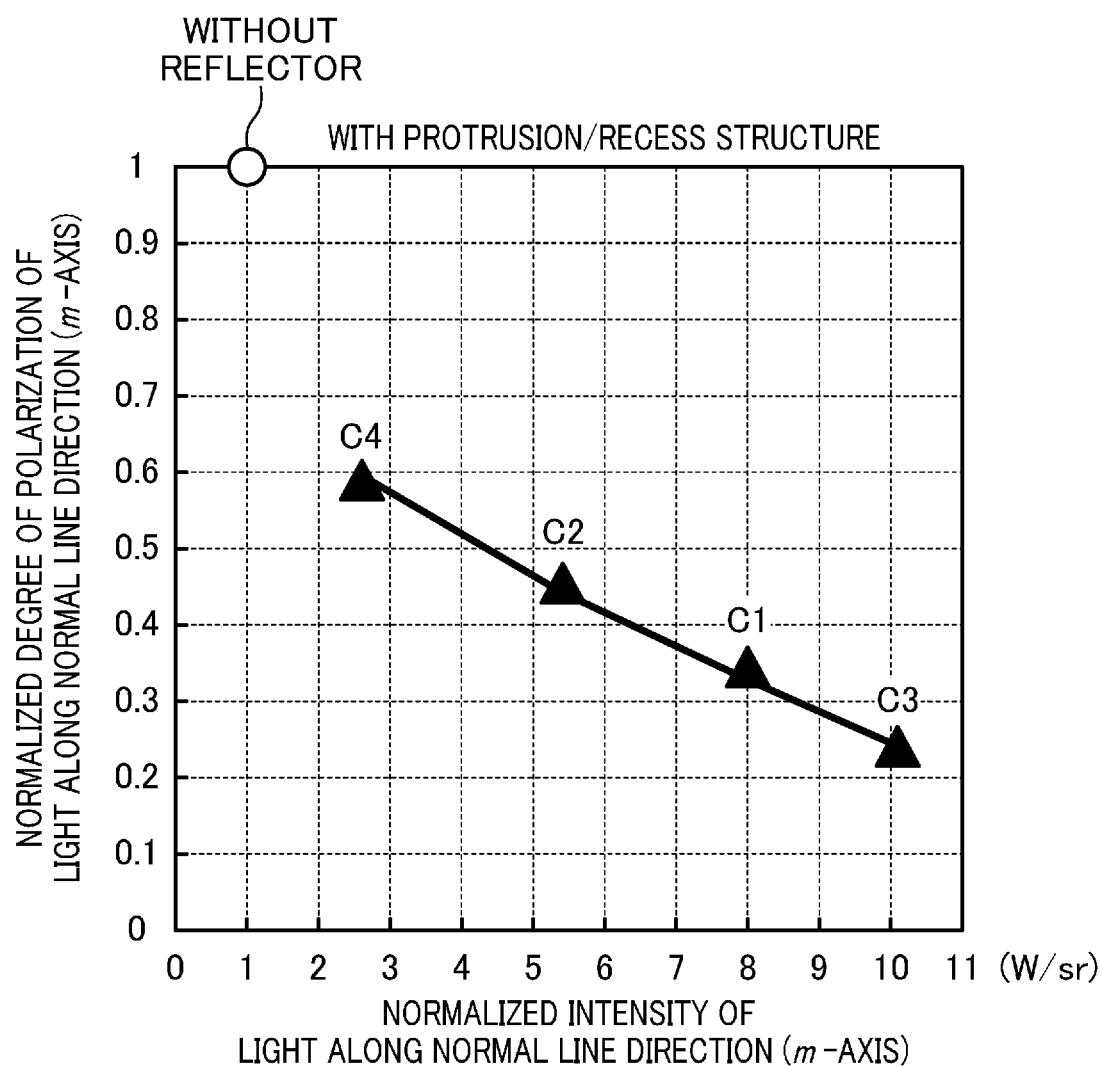
FIG. 29 is a graph illustrating the relationship between normalized intensity of light in a normal line direction and normalized degree of polarization in the normal line direction according to a second example.

FIG. 29 shows the normalized light intensity in the normal line direction, and the normalized degree of polarization in the normal line direction in the semiconductor light-emitting devices provided with the circular reflectors C1, C2, C3, and C4. As can be seen from FIG. 29, the semiconductor light-emitting devices provided with the circular reflectors C2 and C4 in which the design value of the reflective surface 125 deviates from an optimal value exhibit small values of the normalized light intensity in the normal line direction. Consequently, the value of the normalized degree of polarization increases. On the other hand, the semiconductor light-emitting devices provided with the circular reflectors C1 and C3 in which the design value of the reflective surface 125 is in the range of optimal values exhibit large values of the normalized light intensity in the normal line direction, and small values of the normalized degree of polarization.

When FIG. 29 is compared with FIG. 28, the two graphs in FIGS. 29 and 28 substantially match each other. Whether or not the protrusion/recess structure 130 is provided on the light extraction surface of the semiconductor light-emitting chip 100, the relationship between the normalized light intensity in the normal line direction and the normalized degree of polarization in the normal line direction is substantially maintained. Therefore, it can be seen that irrelevant to the state of the light extraction surface, the effect of reducing the degree of polarization of light by the circular reflectors C1-C4 is maintained. It can be seen that as long as the reflective surface 125 is designed to increase the light intensity in the normal line direction by a factor of about five or more, the degree of polarization of light in the normal line direction can be reduced to one half or less.

Third Example

A semiconductor light-emitting device according to a third example will be described hereinafter with reference to FIGS. 22A-22D.

In the semiconductor light-emitting device according to the third example, a growth surface of an active layer of a semiconductor light-emitting chip 100 is a semipolar (20-2-1) plane. A wafer-level n-type GaN substrate having a (20-2-1) plane as its principal surface was used as a substrate of the semiconductor light-emitting chip 100. In a process of singulating the substrate into semiconductor light-emitting chips 100, grooves having a depth of about several tens of μm from the surface of the wafer were formed in the wafer, which is provided with a light-emitting structure, along the [10-14] direction and the [1-210] direction with laser beams. Thereafter, the wafer was broken into semiconductor light-emitting chips 100 having sides each having a length of 450 μm. Other processes are similar to those in the first example. As such, a semiconductor light-emitting chip 100 including an active layer having a growth surface that is a semipolar (20-2-1) plane was fabricated. In this state, no reflector 120 is provided. The measured wavelength of light emitted from the semiconductor light-emitting device at an operating current of 10 mA was 441 nm. The polarization direction of the emitted light is along the [1-210] direction, and the degree of polarization of light measured along the [20-2-1] direction corresponding to the normal line direction was 0.65, which corresponds to a value obtained in a third comparative example in which a reflector 120 is not provided.

Similar to the first example, the circular reflectors C1-C4 made of aluminum and fabricated separately from the mounting substrate 101 were each adhered to the mounting substrate 101 on which one of the semiconductor light-emitting chips 100 was mounted, thereby fabricating four types of semiconductor light-emitting devices according to the third example each including one of the four circular aluminum reflectors C1-C4.

Table 3 provides the range of azimuth angles χ of light reflected off a reflective surface 125 of each of the circular reflectors C1-C4, the angle θ1 between the reflective surface 125 and the normal direction, the normalized degree of polarization of the light in the normal direction, and the normalized intensity of the light in the normal direction. Table 3 also provides the properties of the semiconductor light-emitting device that does not include a reflector 120 according to the third comparative example.

TABLE 3

| Circular Reflector | Range [°] of Azimuth Angles χ of Light Reflected Off Reflective Surface | Angle θ1 [°] Between Reflective Surface And Normal Line Direction | Degree of Polarization of Light In Normal Line Direction | Normalized Degree of Polarization of Light In Normal Line Direction | Normalized Light Intensity In Normal Line Direction |
|---|---|---|---|---|---|
| C1 | 42.5-78.7 | 28.6 | 0.19 | 0.29 | 16.0 |
| C2 | 33.7-78.7 | 15.3 | 0.22 | 0.33 | 12.7 |
| C3 | 53.1-84.3 | 28.6 | 0.14 | 0.21 | 22.8 |
| C4 | 66.3-76.0 | 29.2 | 0.31 | 0.48 | 6.3 |
| Without Reflector (3rd compar. ex.) | — | — | 0.65 | 1 | 1 |

Figure 30:
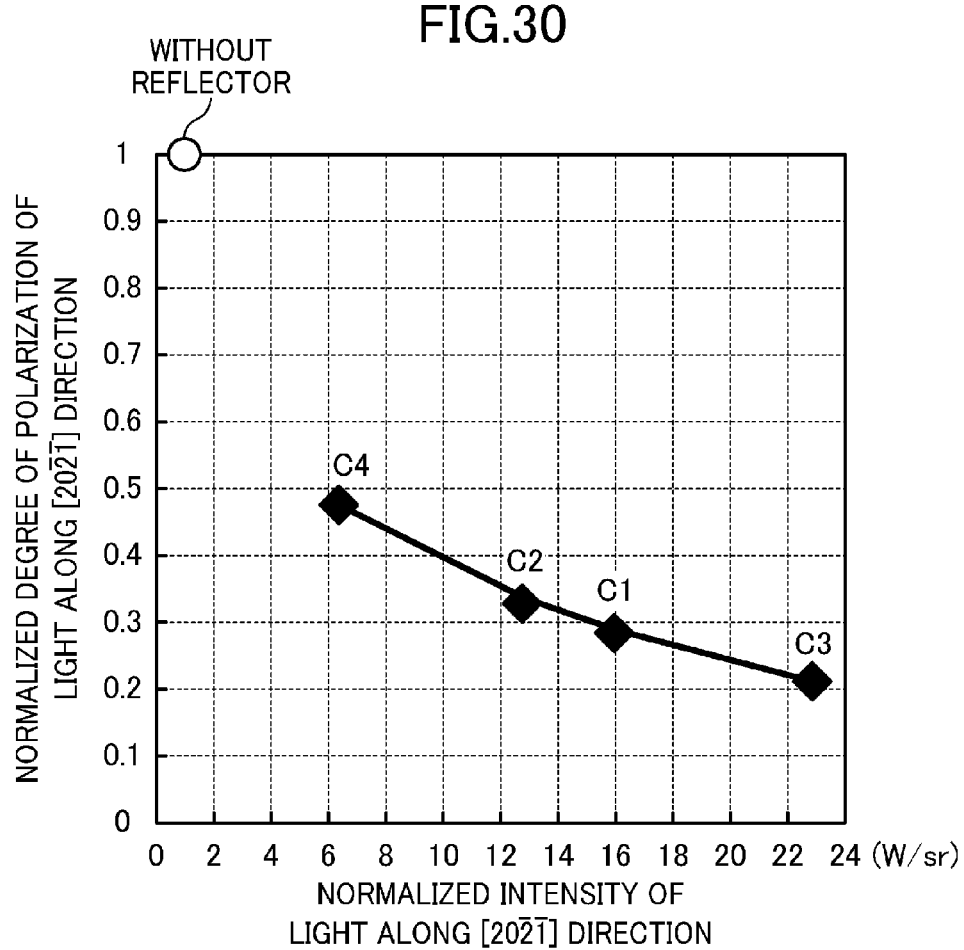
FIG. 30 is a graph illustrating the relationship between normalized intensity of light in a normal line direction and normalized degree of polarization in the normal line direction according to a third example.

FIG. 30 shows the normalized light intensity in the normal line direction, and the normalized degree of polarization in the normal line direction in the semiconductor light-emitting devices provided with the circular reflectors C1, C2, C3, and C4. As can be seen from FIG. 30, the semiconductor light-emitting devices provided with the circular reflectors C2 and C4 in which the design value of the reflective surface 125 deviates from an optimal value exhibit small values of the normalized light intensity in the normal line direction. Consequently, the value of the normalized degree of polarization increases. On the other hand, the semiconductor light-emitting devices provided with the circular reflectors C1 and C3 in which the design value of the reflective surface 125 is in the range of optimal values exhibit large values of the normalized light intensity in the normal line direction, and small values of the normalized degree of polarization.

When FIG. 28 and FIG. 30 are compared with each other, it can be seen that the two graphs match each other in the tendency that the normalized degree of polarization in the normal line direction decreases as the normalized light intensity in the normal line direction increases. That is, it is shown that the degree of polarization of light of the semiconductor light-emitting chip configured to emit polarized light can be reduced by the circular reflectors C1-C4. It can be seen that as long as the reflective surface 125 is designed to increase the light intensity in the normal line direction by a factor of about six or more, the degree of polarization of light in the normal line direction can be reduced to one half or less.

Fourth Example

Figure 31:
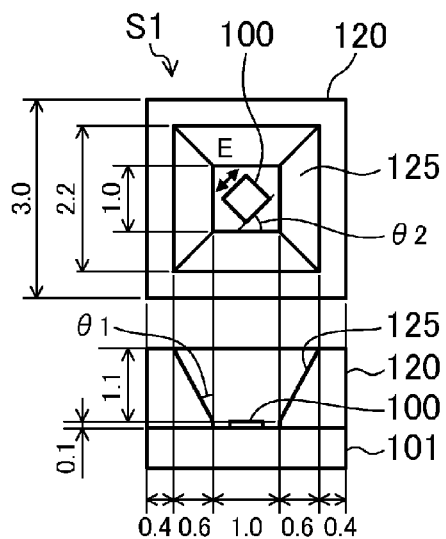
FIG. 31 shows a plan view and a cross-sectional view illustrating a semiconductor light-emitting device including a reflector S1 according to a fourth example.

A semiconductor light-emitting device according to a fourth example will be described hereinafter with reference to FIG. 31. The dimensions in FIG. 31 are expressed in units of millimeters (mm). As illustrated in FIG. 31, a semiconductor light-emitting chip 100 including an active layer having an m-plane as a growth surface was formed in a method similar to that in the first example, and the formed semiconductor light-emitting chip 100 was mounted on a mounting substrate 101. Here, a protrusion/recess structure was not formed on a light extraction surface of the semiconductor light-emitting chip 100. In this state, the measured wavelength of light emitted from the semiconductor light-emitting device at an operating current of 10 mA was 445 nm. The polarization direction of the emitted light is along the a-axis, and the degree of polarization of light measured along the m-axis corresponding to the normal line direction was 0.68.

An aluminum reflector S1 was formed by press molding separately from the semiconductor light-emitting chip 100, where the aluminum reflector S1 includes four reflective surfaces 125 arranged such that a shape formed by the four reflective surfaces 125 when viewed in plan is square. The azimuth angle $\chi$ of light reflected off each reflective surface 125 of the square reflector S1 was in the range from 42.5° to 78.7°. The angle θ1 between each reflective surface 125 and the normal line direction was 28.6°. The cross-sectional structure of the reflective surface 125 of the square reflector S1 was similar to that of the circular reflector C1.

The square reflector S1 made of aluminum and fabricated separately from a mounting substrate 101 was bonded onto the mounting substrate 101 provided with the semiconductor light-emitting chip 100. A plurality of semiconductor light-emitting devices in which the angles θ2 are 0°, 6°, 8°, 12°, 13°, 18°, 25°, 30°, 40°, and 45° were fabricated, where θ2 represents an angle between the polarization direction of light from the semiconductor light-emitting chip 100 and a side of the square formed by the reflective surfaces 125 when viewed in plan.

Here, when the reflective surfaces 125 are arranged such that the shape formed by the reflective surfaces 125 when viewed in plan is square, the square has high symmetry when viewed in plan; therefore, when the angle θ2 is greater than 45°, the properties of such a semiconductor light-emitting device are equivalent to those obtained when the angle θ2 is equal to the angle θ2 subtracted from 90°. For this reason, the properties of semiconductor light-emitting devices in which the angles θ2 are within the range from 0° to 45° merely needs to be examined.

Figure 32A:
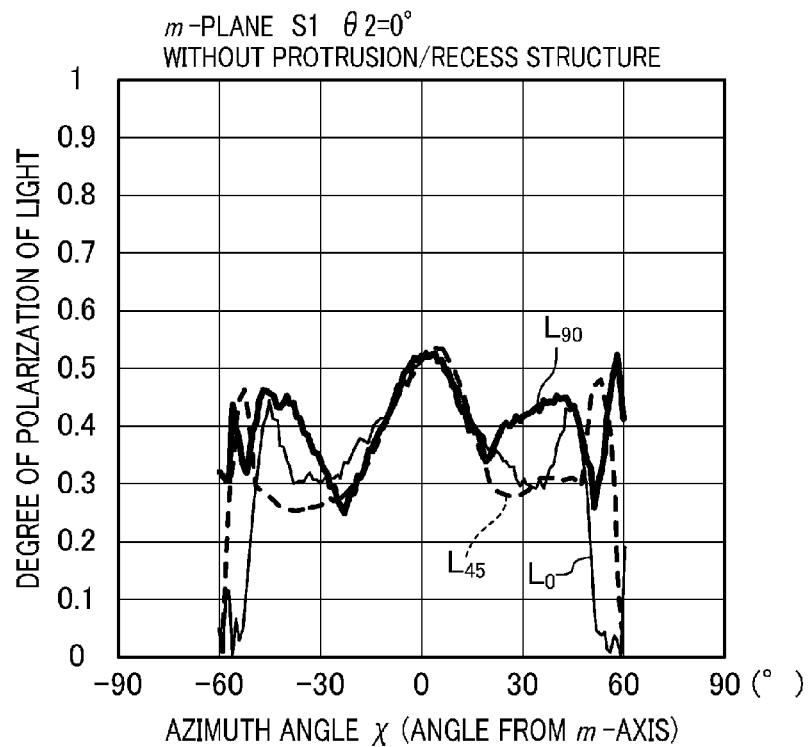
FIG. 32A is a graph illustrating the degree of polarization of light from a semiconductor light-emitting device including a reflector S1 in which the angle $\theta 2$ is 0°.
Figure 32B:
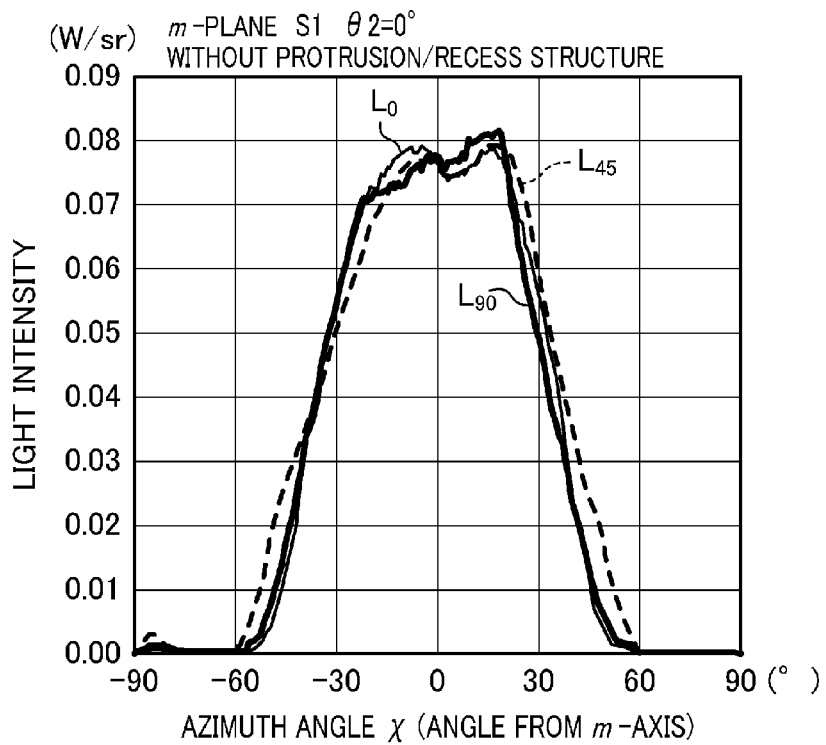
FIG. 32B is a graph illustrating the luminous intensity distribution of the semiconductor light-emitting device including the reflector S1 in which the angle $\theta 2$ is 0°.

FIGS. 32A and 32B illustrate the degree of polarization of light from and the luminous intensity distribution of a semiconductor light-emitting device including a reflector S1 in which the angle between the direction of polarization of polarized light and a side of the square formed by reflective surfaces 125 is set at 0°. The thin solid line in these figures illustrates the properties in the plane $L_0$, the broken line therein illustrates the properties in the plane $L_{45}$, and the thick solid line therein illustrates the properties in the plane $L_{90}$. As illustrated in FIG. 32A, the degree of polarization of light in the normal direction ($\chi=0°$) is 0.53, and the degree of polarization of light in the normal direction is kept higher than when a circular reflector is used. The luminous intensity distribution illustrated in FIG. 32B shows that the light distribution angle is 73.0° in the plane $L_0$, and is 69.1° in the plane $L_{90}$.

Figure 33A:
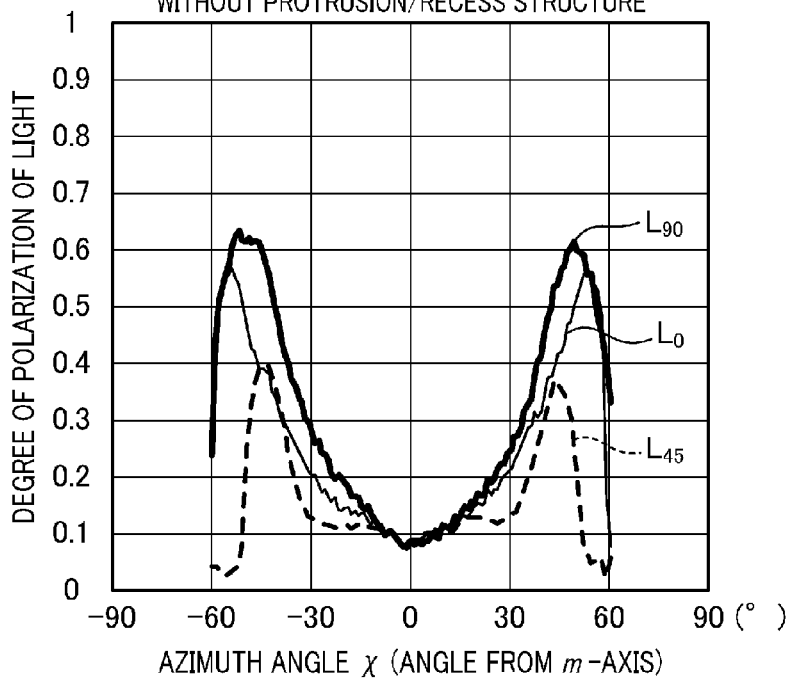
FIG. 33A is a graph illustrating the degree of polarization of light from a semiconductor light-emitting device including the reflector S1 in which the angle $\theta 2$ is 45°.
Figure 33B:
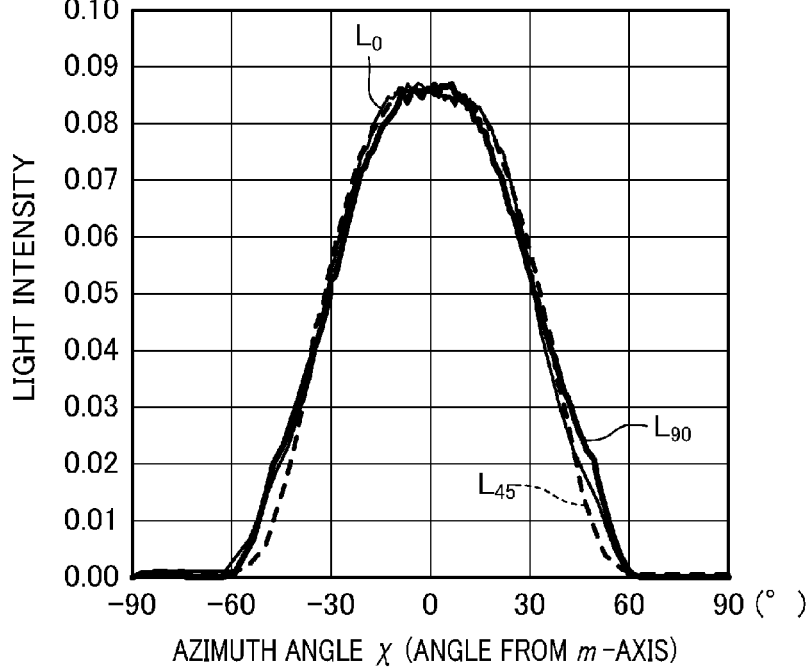
FIG. 33B is a graph illustrating the luminous intensity distribution of the semiconductor light-emitting device including the reflector S1 in which the angle $\theta 2$ is 45°.

FIGS. 33A and 33B illustrate the degree of polarization of light from and the luminous intensity distribution of a semiconductor light-emitting device including a reflector S1 in which the angle θ2 is set at 45°. The thin solid line in these figures illustrates the properties in the plane $L_0$, the broken line therein illustrates the properties in the plane $L_{45}$, and the thick solid line therein illustrates the properties in the plane $L_{90}$. As illustrated in FIG. 33A, the degree of polarization of light in the normal direction ($\chi=0°$) is 0.07, and the degree of polarization of light in the normal direction is much lower than when the angle θ2 is 0°. Furthermore, the degree of polarization of light in the normal direction is lower than when a circular reflector is used. The luminous intensity distribution illustrated in FIG. 33B shows that the light distribution angle is 70.6° in the plane $L_0$, and is 71.4° in plane $L_{90}$.

Figure 34:
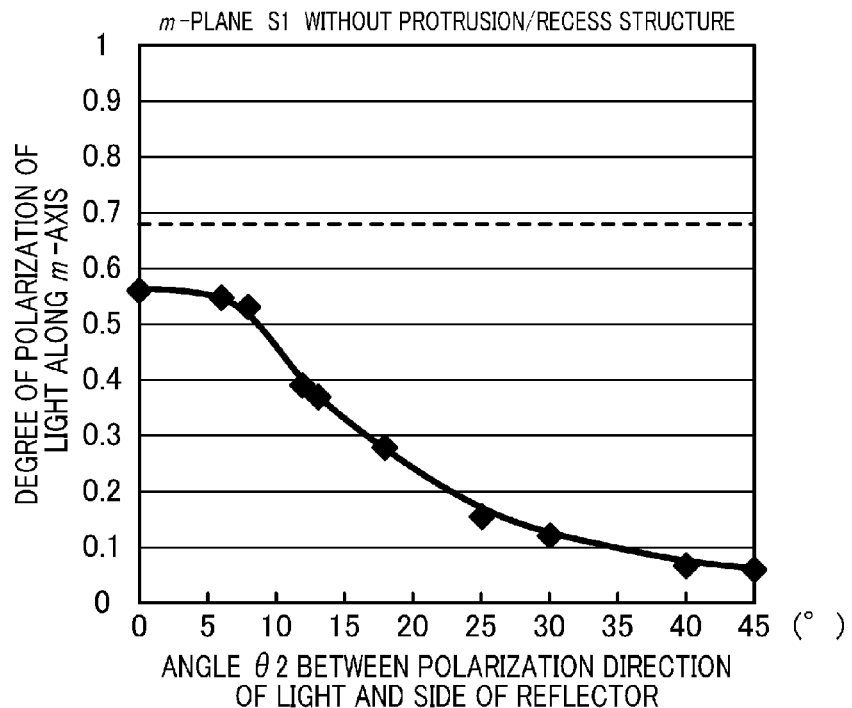
FIG. 34 is a graph illustrating the relationship between the angle $\theta 2$ and the degree of polarization of light in the normal line direction according to the fourth example.

FIG. 34 illustrates the relationship between the angle θ2 and the degree of polarization of light in the normal direction. The broken line in this figure illustrates 0.68, i.e., the degree of polarization of light from a semiconductor light-emitting device that does not include a reflector according to a first comparative example in the normal direction. When the angle θ2 is greater than 10°, the degree of polarization of light in the normal direction sharply decreases.

Figure 35:
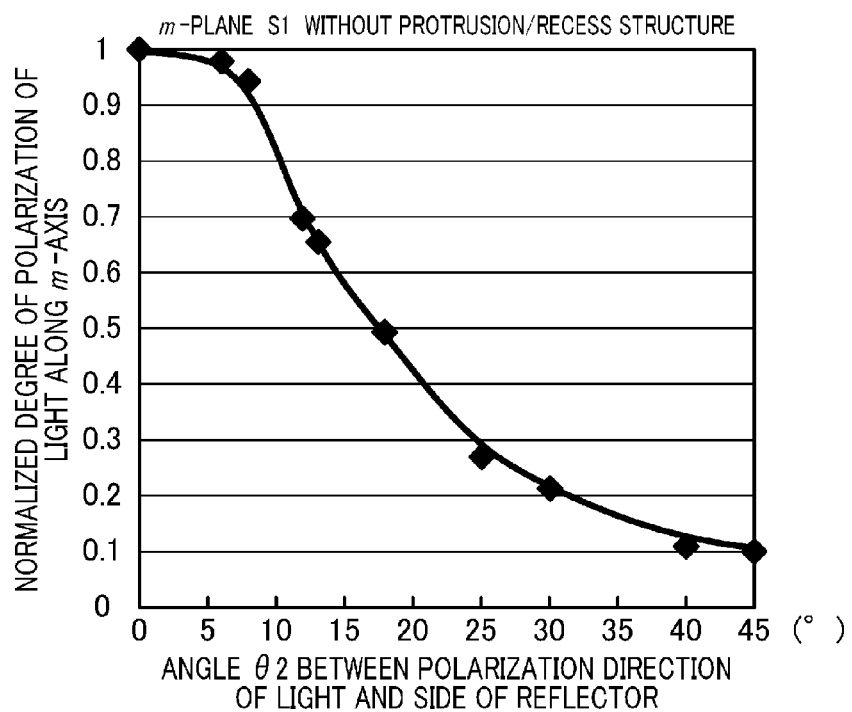
FIG. 35 is a graph illustrating the relationship between the angle $\theta 2$ and the normalized degree of polarization in the normal direction according to the fourth example.

FIG. 35 illustrates the relationship between the angle θ2 and the normalized degree of polarization of light in the normal direction. Here, the normalized degree of polarization of light is a value normalized by the degree of polarization of light in the normal direction where the angle θ2 is 0°. FIG. 35 shows that the angle θ2 of not less than 17° and not more than 73° allows the normalized degree of polarization to be reduced to substantially one half or less. The angle θ2 of not less than 30° and not more than 60° allows the normalized degree of polarization to be reduced to substantially one fifth or less. The angle θ2 of 45° allows the normalized degree of polarization to be reduced to substantially one tenth.

Fifth Example

A semiconductor light-emitting device according to a fifth example will be described below. In a semiconductor light-emitting device having a configuration similar to that of the second example, a protrusion/recess structure 130 including two-dimensionally arranged hemispherical raised portions having a radius of about 5 μm was formed on a light extraction surface of a semiconductor light-emitting chip 100 including an active layer having an m-plane as a growth surface.

In this state, the measured wavelength of light emitted from the semiconductor light-emitting device at an operating current of 10 mA was 445 nm. The polarization direction of the emitted light is along the a-axis, and the degree of polarization of light measured along the m-axis corresponding to the normal line direction was 0.29.

A square reflector S1 having a configuration similar to that of the fourth example was bonded onto a mounting substrate 101 provided with the semiconductor light-emitting chip 100. The azimuth angle $\chi$ of light reflected off each reflective surface 125 of the square reflector S1 is in the range from 42.5° to 78.7°. Moreover, the angle θ1 between each reflective surface 125 and the normal line direction is 28.6°. A plurality of semiconductor light-emitting devices in which the angles θ2 are 0°, 9°, 12°, 15°, 16°, 21°, 30°, 41°, and 45° were fabricated, where $\theta_2$ represents an angle between the polarization direction of light from the semiconductor light-emitting chip 100 and a side of the square formed by the reflective surfaces 125 when viewed in plan.

Here, when the plurality of reflective surfaces 125 are arranged such that a shape formed by the reflective surfaces 125 when viewed in plan is square, the square has high symmetry when viewed in plan. For this reason, the properties of semiconductor light-emitting devices in which the angles $\theta_2$ are within the range from 0° to 45° merely needs to be examined.

Figure 36:
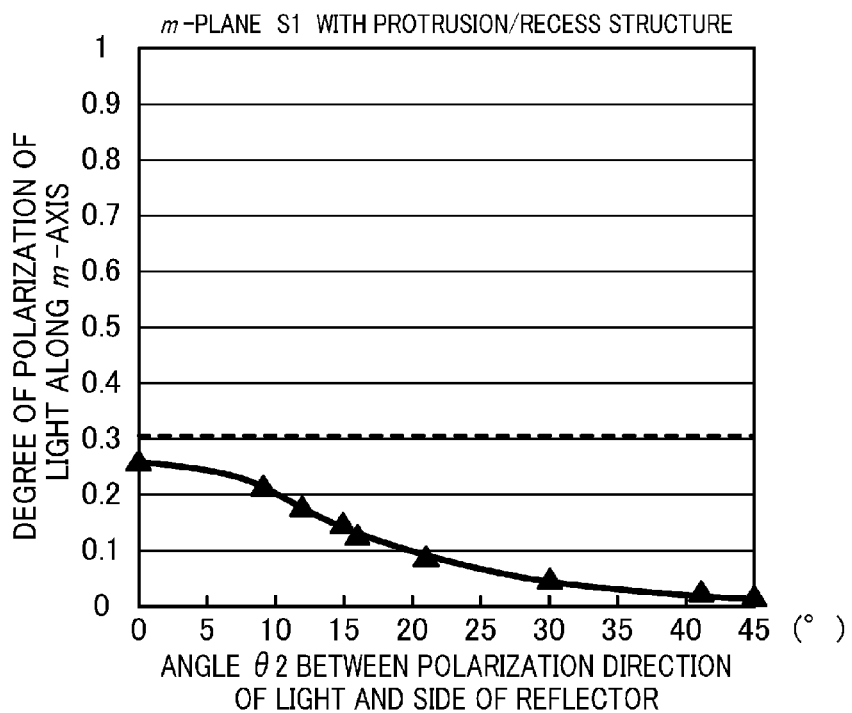
FIG. 36 is a graph illustrating the relationship between the angle $\theta 2$ and the degree of polarization of light in the normal line direction according to a fifth example.

FIG. 36 illustrates the relationship between the angle θ2 and the degree of polarization of light in the normal line direction. The broken line in this figure illustrates 0.30, i.e., the degree of polarization of light in the normal line direction from the semiconductor light-emitting device that does not include a reflector according to the second comparative example. When FIG. 36 is compared with FIG. 34, it can be seen that providing the protrusion/recess structure 130 on the light extraction surface can reduce the degree of polarization of light as a whole.

Figure 37:
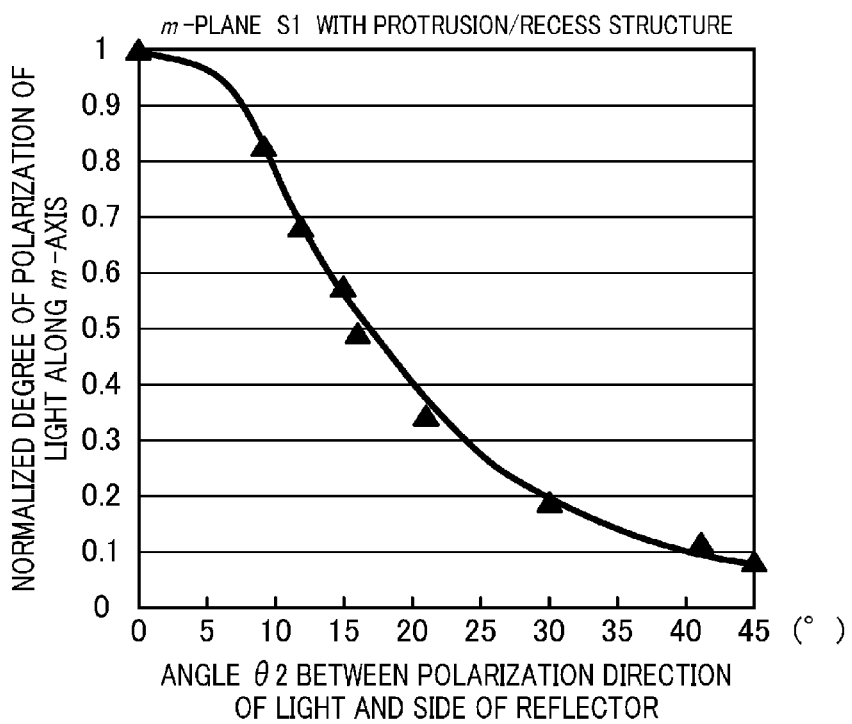
FIG. 37 is a graph illustrating the relationship between the angle $\theta 2$ and the normalized degree of polarization in the normal line direction according to the fifth example.

FIG. 37 shows the relationship between the angle θ2 and the normalized degree of polarization in the normal line direction. Here, the normalized degree of polarization is obtained by normalization using the degree of polarization of light in the normal line direction where the angle θ2 is 0°. When FIG. 37 is compared with FIG. 35, the two graphs substantially match each other. Whether or not the protrusion/recess structure 130 is provided on the light extraction surface of the semiconductor light-emitting chip 100, the relationship between the angle θ2 and the normalized degree of polarization is substantially maintained. Therefore, it can be seen that irrelevant to the state of the light extraction surface, the effect of reducing the degree of polarization of light by the square reflector is maintained.

FIG. 37 shows that the angle θ2 of not less than 17° and not more than 73° allows the normalized degree of polarization to be reduced to substantially one half or less. The angle θ2 of not less than 30° and not more than 60° allows the normalized degree of polarization to be reduced to one fifth or less. The angle θ2 of 45° allows the normalized degree of polarization to be reduced to substantially one tenth.

Sixth Example

A semiconductor light-emitting device according to a sixth example will be described below. In the sixth example, a semiconductor light-emitting chip 100 including an active layer having a semipolar (20-2-1) plane as a growth surface was formed in a manner similar to that of the third example, and mounted on a mounting substrate 101. In this state, the measured wavelength of light emitted from the semiconductor light-emitting device at an operating current of 10 mA was 441 nm. The polarization direction of the emitted light is along the [1-210] direction, and the degree of polarization of light measured along the [20-2-1] direction corresponding to the normal line direction was 0.65.

A square reflector S1 having a configuration similar to that of the fourth example was bonded onto a mounting substrate 101 provided with the semiconductor light-emitting chip 100. The azimuth angle χ of light reflected off each reflective surface 125 of the square reflector S1 is in the range from 42.5° to 78.7°. Moreover, the angle θ1 between each reflective surface 125 and the normal line direction is 28.6°. A plurality of semiconductor light-emitting devices in which the angles θ2 are 0°, 9°, 12°, 15°, 16°, 21°, 30°, 41°, and 45° were fabricated, where θ2 represents an angle between the polarization direction of light from the semiconductor light-emitting chip 100 and a side of the square formed by the reflective surfaces 125 when viewed in plan.

Here, when the plurality of reflective surfaces 125 are arranged such that a shape formed by the reflective surfaces 125 when viewed in plan is square, the square has high symmetry when viewed in plan. For this reason, the properties of semiconductor light-emitting devices in which the angles θ2 are within the range from 0° to 45° merely needs to be examined.

Figure 38:
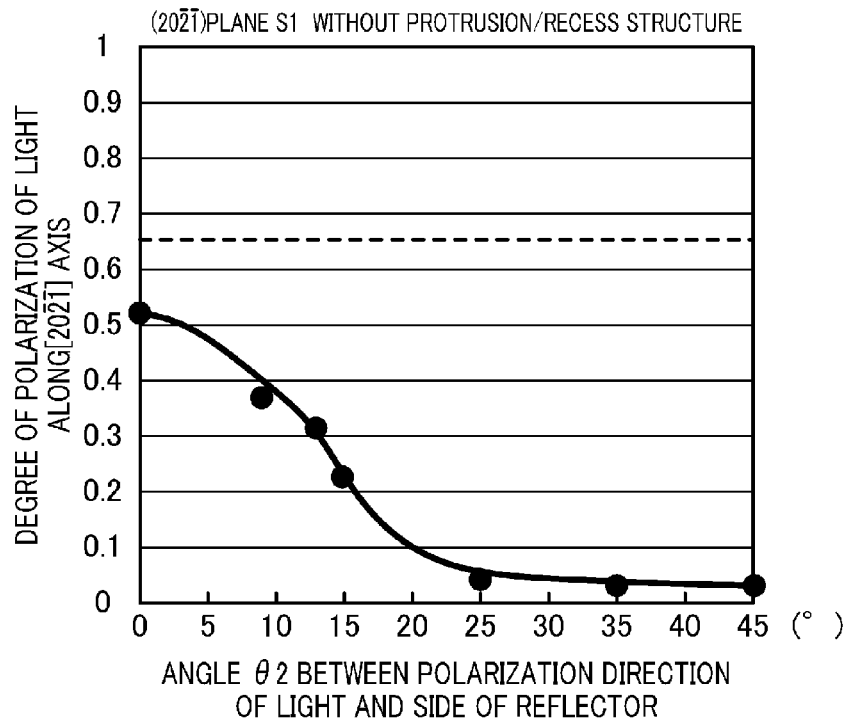
FIG. 38 is a graph illustrating the relationship between the angle $\theta 2$ and the degree of polarization of light in the normal line direction according to a sixth example.

FIG. 38 illustrates the relationship between the angle θ2 and the degree of polarization of light in the normal line direction. The broken line in this figure illustrates 0.65, i.e., the degree of polarization of light in the normal line direction from the semiconductor light-emitting device that does not include a reflector according to the third comparative example.

Figure 39:
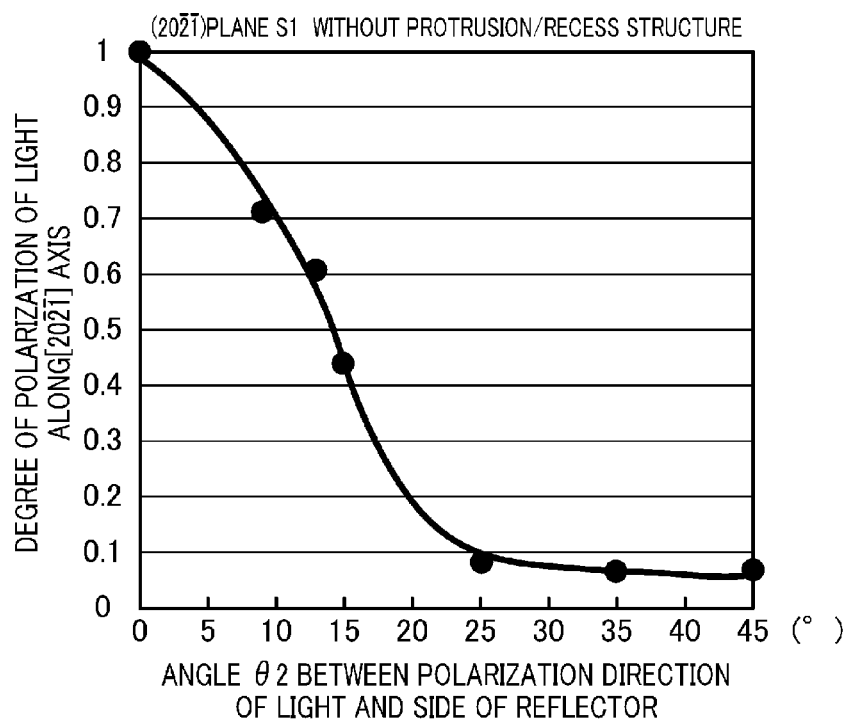
FIG. 39 is a graph illustrating the relationship between the angle $\theta 2$ and the normalized degree of polarization in the normal line direction according to the sixth example.

FIG. 39 illustrates the relationship between the angle θ2 and the normalized degree of polarization of light in the normal line direction. Here, the normalized degree of polarization of light is a value obtained by normalizing the degree of polarization of light relative to the degree of polarization of light in the normal line direction from a semiconductor light-emitting device in which the angle θ2 is 0°. When FIG. 39 is compared with FIGS. 35 and 37, these three graphs have substantially the same shape. Thus, it is shown that the semiconductor light-emitting devices according to the fourth through sixth examples, i.e., according to the second embodiment can reduce the degree of polarization of light irrelevant to the direction of the growth surface of the active layer.

FIG. 39 shows that the angle θ2 of not less than 15° and not more than 75° allows the normalized degree of polarization to be reduced to one half or less. The angle θ2 of not less than 20° and not more than 80° allows the normalized degree of polarization to be reduced to one fifth or less. The angle θ2 of not less than 25° and not more than 65° allows the normalized degree of polarization to be reduced to one tenth.

Seventh Example

Figure 40:
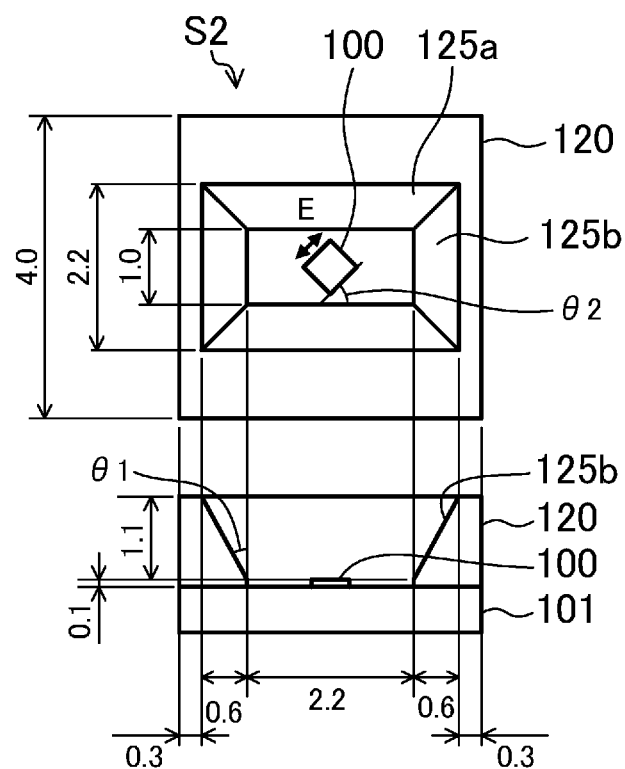
FIG. 40 shows a plan view and a cross-sectional view illustrating a semiconductor light-emitting device including a rectangular reflector S2 according to a seventh example.

A semiconductor light-emitting device according to a seventh example will be described hereinafter with reference to FIG. 40. As illustrated in FIG. 40, a semiconductor light-emitting chip 100 including an active layer having an m-plane as a growth surface was fabricated in a manner similar to that in the first example, and was mounted on a mounting substrate 101. A protrusion/recess structure was not formed on the light extraction surface of the semiconductor light-emitting chip 100. In this state, the measured wavelength of light emitted from the semiconductor light-emitting device at an operating current of 10 mA was 445 nm. The direction of polarization of the emitted light is along the a-axis, and the measured degree of polarization of light emitted along the m-axis corresponding to the normal direction was 0.68.

Similarly to the first example, a rectangular reflector S2 made of aluminum and having a plurality of reflective surfaces 125 arranged such that a shape formed by the reflective surfaces when viewed in plan is rectangle was fabricated by press molding. The azimuth angle χ of light reflected off reflective surfaces 125a corresponding to the long sides of the rectangle among the reflective surfaces 125 of the rectangular reflector S2 is within the range from 42.5° to 78.7°, and the azimuth angle χ of light reflected off reflective surfaces 125b corresponding to the short sides of the rectangle is within the angle range from 57.1° to 84.8°. The angle θ1 between each of the reflective surfaces 125a and 125b and the normal line direction is 28.6°. The rectangular reflector S2 was bonded onto a mounting substrate 101 on which the semiconductor light-emitting chip 100 was previously mounted. A plurality of semiconductor light-emitting devices in which the angles θ2 are 0°, 10°, 28°, 30°, 34°, 45°, 49°, 52°, 60°, 68°, 79°, 84°, and 90° were fabricated, where θ2 represents an angle between the polarization direction of light from the semiconductor light-emitting chip 100 and each of the long sides of the rectangle formed by the reflective surfaces 125 when viewed in plan.

Figure 41A:
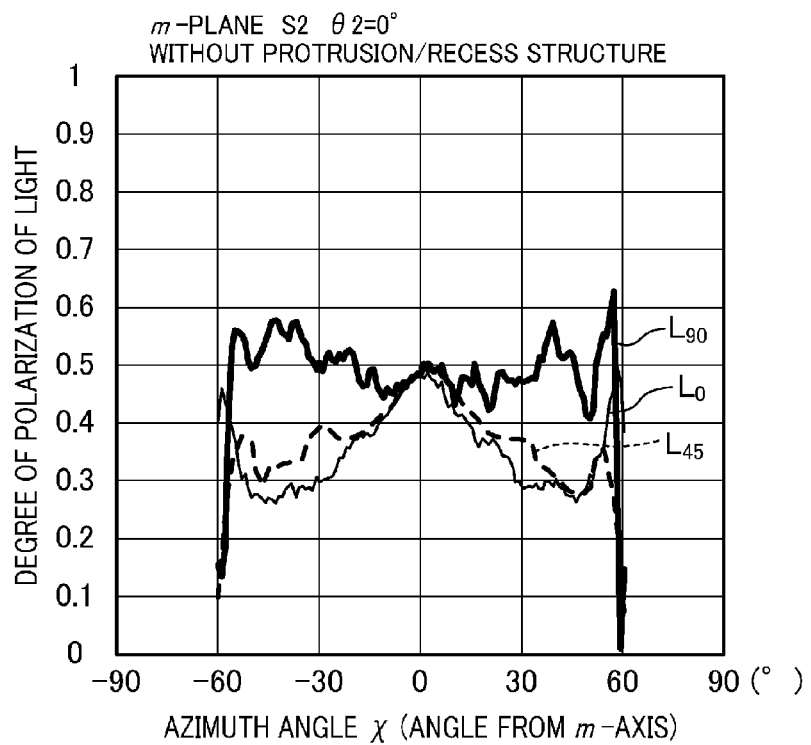
FIG. 41A is a graph illustrating the degree of polarization of light from the semiconductor light-emitting device including a rectangular reflector S2 in which the angle $\theta 2$ is 0°.
Figure 41B:
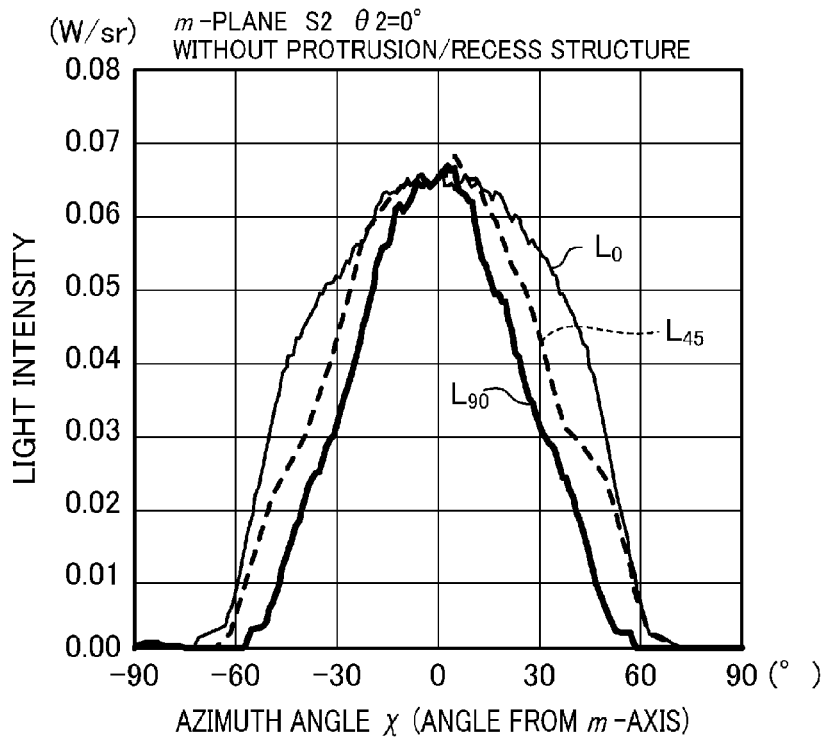
FIG. 41B is a graph illustrating the luminous intensity distribution of the semiconductor light-emitting device including the rectangular reflector S2 in which the angle $\theta 2$ is 0°.

FIGS. 41A and 41B illustrate the degree of polarization of light from a semiconductor light-emitting device including a rectangular reflector S2 in which the angle θ2 is set at 0°, and the luminous intensity distribution of the semiconductor light-emitting device, respectively. The thin solid line in each of these figures illustrates the corresponding property in the plane $L_0$, the broken line therein illustrates the corresponding property in the plane $L_{45}$, and the thick solid line therein illustrates the corresponding property in the plane $L_{90}$. As illustrated in FIG. 41A, the degree of polarization of light in the normal line direction ($\chi=0°$) is 0.50, and the degree of polarization of light in the normal line direction is kept higher than when any one of the circular reflectors is used.

Figure 42A:
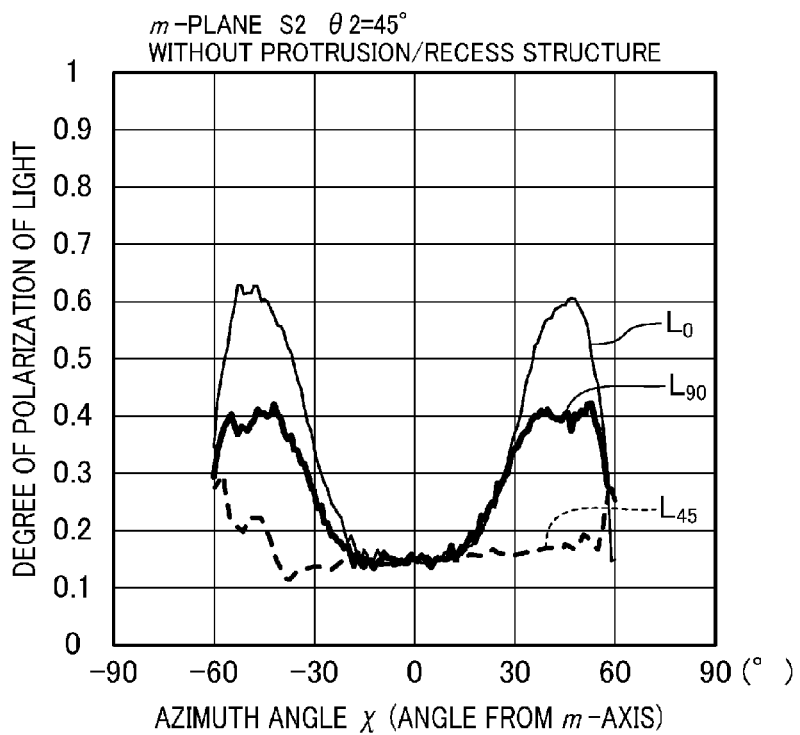
FIG. 42A is a graph illustrating the degree of polarization of light from the semiconductor light-emitting device including the rectangular reflector S2 in which the angle $\theta 2$ is 45°.
Figure 42B:
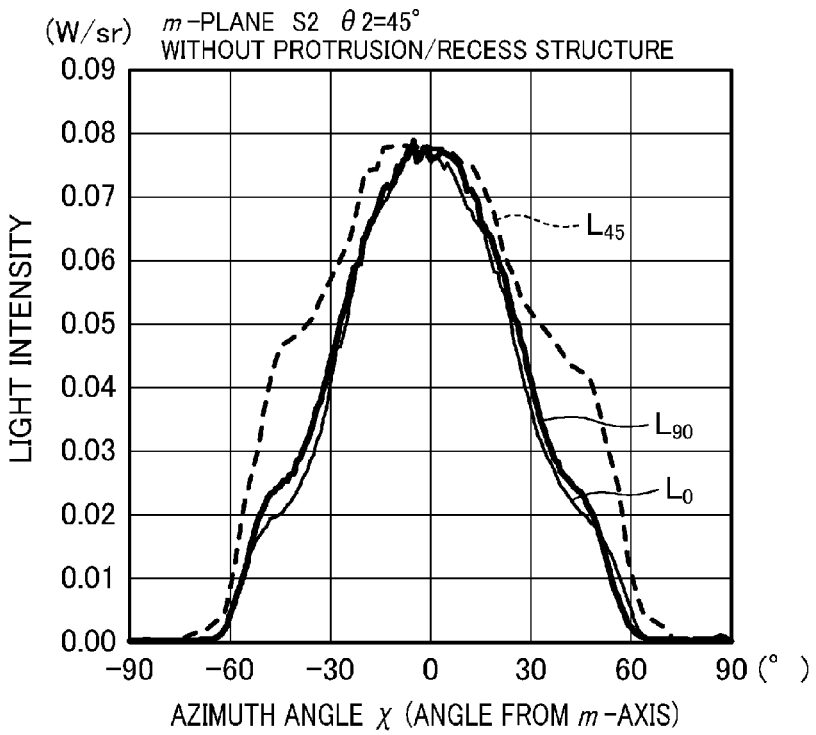
FIG. 42B is a graph illustrating the luminous intensity distribution of the semiconductor light-emitting device including the rectangular reflector S2 in which the angle $\theta 2$ is 45°.

FIGS. 42A and 42B illustrate the degree of polarization of light from a semiconductor light-emitting device including a rectangular reflector S2 in which the angle θ2 is set at 45°, and the luminous intensity distribution of the semiconductor light-emitting device, respectively. The thin solid line in each of these figures illustrates the corresponding property in the plane $L_0$, the broken line therein illustrates the corresponding property in the plane $L_{45}$, and the thick solid line therein illustrates the corresponding property in the plane $L_{90}$. As illustrated in FIG. 42A, the degree of polarization of light in the normal line direction ($\chi=0°$) is 0.16, which is much lower than when the angle θ2 is 0°. Furthermore, the degree of polarization of light in the normal line direction is lower than when any one of the circular reflectors is used.

FIGS. 43A and 43B illustrate the degree of polarization of light from a semiconductor light-emitting device including a rectangular reflector S2 in which the angle θ2 is set at 90°, and the luminous intensity distribution of the semiconductor light-emitting device, respectively. The thin solid line in each of these figures illustrates the corresponding property in the plane $L_0$, the broken line therein illustrates the corresponding property in the plane $L_{45}$, and the thick solid line therein illustrates the corresponding property in the plane $L_{90}$. As illustrated in FIG. 43A, the degree of polarization of light in the normal line direction ($\chi=0°$) is 0.44, and the degree of polarization of light in the normal line direction is kept higher than when any one of the circular reflectors is used.

Figure 44:
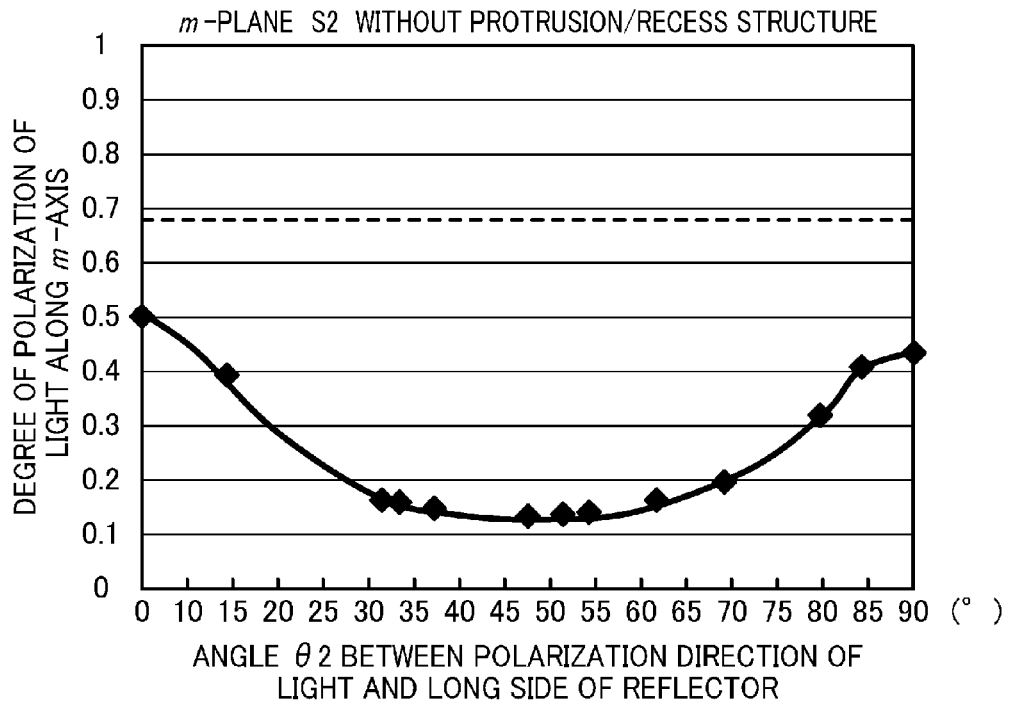
FIG. 44 is a graph illustrating the relationship between the angle $\theta 2$ and the degree of polarization in the normal line direction according to the seventh example.

FIG. 44 illustrates the relationship between the angle θ2 and the degree of polarization of light in the normal line direction. The broken line in this figure illustrates 0.68, i.e., the degree of polarization of light in the normal line direction from the semiconductor light-emitting device that does not include a reflector according to the first comparative example. When the angle θ2 is 45°, the degree of polarization of light is lowest. Unlike the square reflector S1 according to the fourth example, the rectangular reflector S2 has low symmetry when viewed in plan. Thus, the degree of polarization of light varies between when the angle θ2 is 0° and when the angle θ2 is 90°. When the angle θ2 is 0°, i.e., when the angle between the polarization direction of light from the semiconductor light-emitting chip 100 and the long side of the rectangle formed by the reflective surfaces 125 is 0°, the degree of polarization of light is kept higher than when the angle θ2 is 90°.

Figure 45:
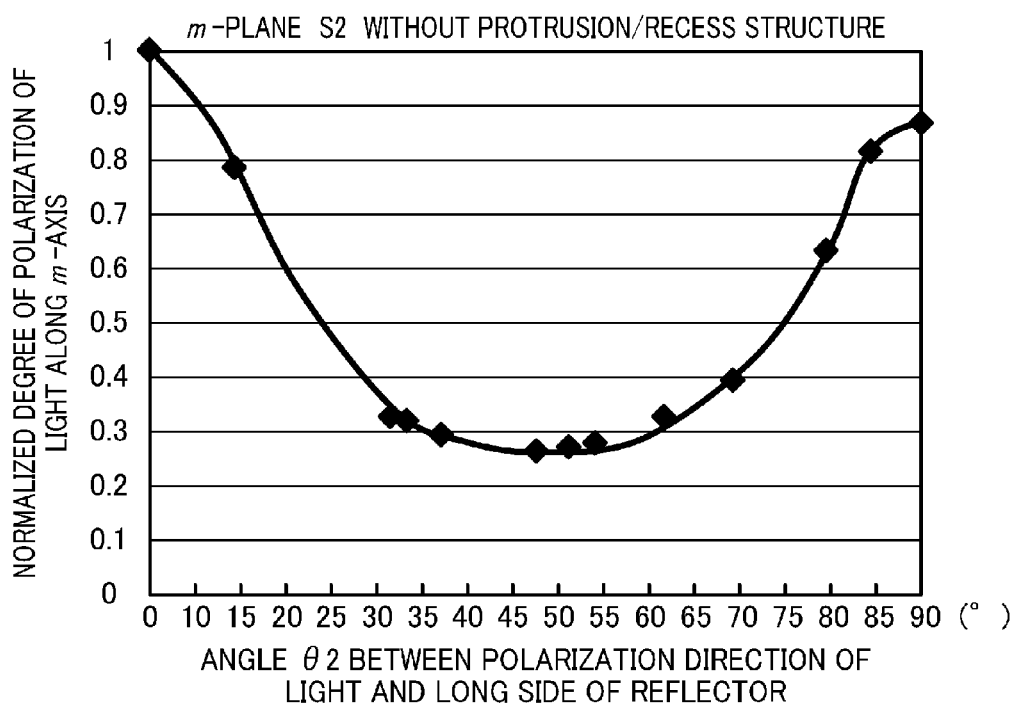
FIG. 45 is a graph illustrating the relationship between the angle $\theta 2$ and the normalized degree of polarization in the normal direction according to the seventh example.

FIG. 45 illustrates the relationship between the angle θ2 and the normalized degree of polarization of light in the normal line direction. Here, the normalized degree of polarization of light is a value obtained by normalizing the degree of polarization of light relative to the degree of polarization of light in the normal line direction from a semiconductor light-emitting device in which the angle θ2 is 0°. FIG. 45 shows that when the angle θ2 is not less than 20° and not more than 70°, the normalized degree of polarization of light can be reduced to one half or less. Furthermore, when the angle θ2 is not less than 35° and not more than 55°, the normalized degree of polarization of light can be reduced to one third or less.

First Comparative Example

The semiconductor light-emitting device according to the first comparative example will be described hereinafter with reference to FIGS. 46A and 46B.

Figure 46A:
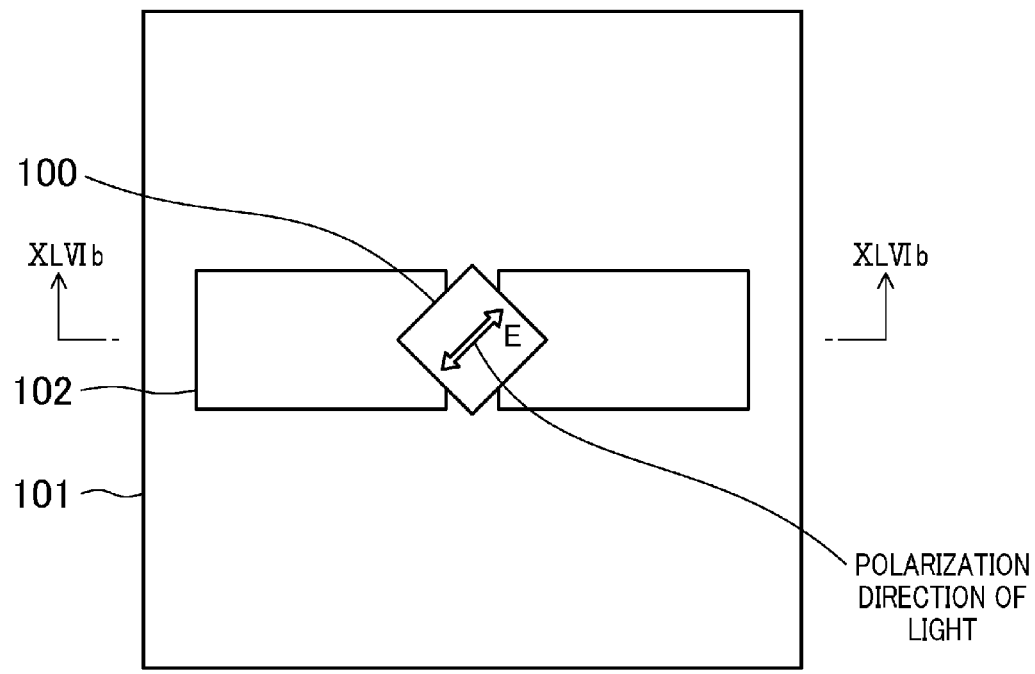
FIG. 46A is a schematic plan view illustrating a semiconductor light-emitting device according to a comparative example.
Figure 46B:
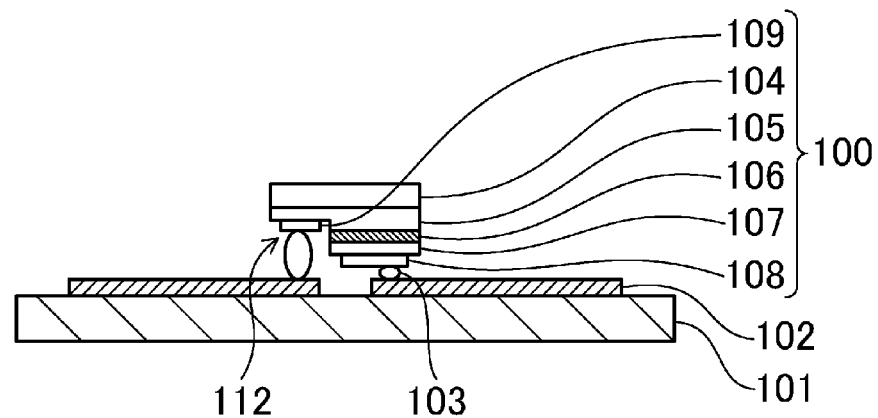
FIG. 46B is a cross-sectional view taken along the line XLVIb-XLVIb in FIG. 46A.

As illustrated in FIGS. 46A and 46B, the semiconductor light-emitting device according to the first comparative example has a configuration in which a semiconductor light-emitting chip 100 including an active layer having an m-plane as a growth surface is provided but a reflector 120 is not provided. A protrusion/recess structure is not formed on a light extraction surface of the semiconductor light-emitting chip 100.

A semiconductor light-emitting chip 100 including an active layer having a growth surface that is an m-plane was fabricated in a manner similar to that in the first example, and was mounted on a mounting substrate 101. In this state, the measured wavelength of light emitted from the semiconductor light-emitting device at an operating current of 10 mA was 445 nm. The degree of polarization of light emitted along the normal line direction was 0.68.

Figure 47A:
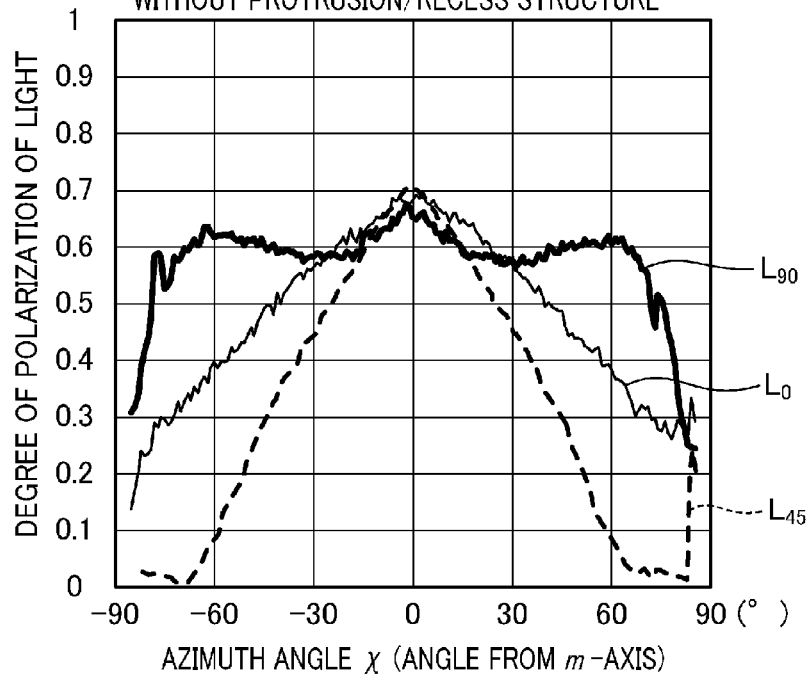
FIG. 47A is a graph illustrating the degree of polarization of light from a semiconductor light-emitting device according to a first comparative example.
Figure 47B:
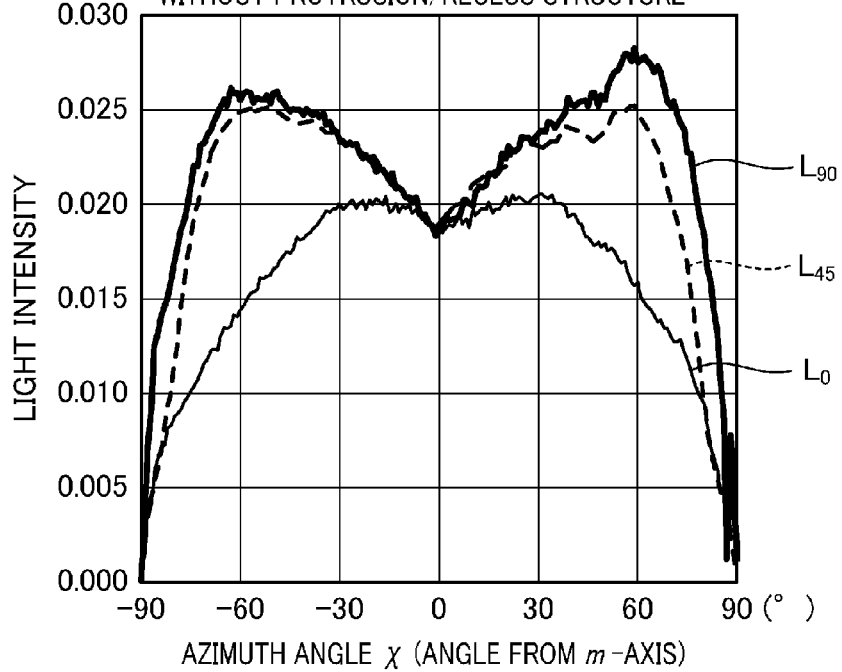
FIG. 47B is a graph illustrating the luminous intensity distribution of the semiconductor light-emitting device according to the first comparative example.

FIGS. 47A and 47B illustrate the degree of polarization of light from the semiconductor light-emitting device according to the first comparative example, and the luminous intensity distribution of the semiconductor light-emitting device, respectively. The thin solid line in each of these figures illustrates the corresponding property in the plane $L_0$, the broken line therein illustrates the corresponding property in the plane $L_{45}$, and the thick solid line therein illustrates the corresponding property in the plane $L_{90}$.

First, also when the azimuth angle $\chi$ is within the range from −80° to +80°, the degree of polarization of light in the plane $L_{90}$ is kept high as illustrated in FIG. 47A. When the azimuth angle $\chi$ is 0°, the degree of polarization of light in the plane $L_0$ is highest, and with increasing absolute value of the azimuth angle $\chi$, the degree of polarization of light in the plane $L_0$ gently decreases. The degree of polarization of light in the plane $L_{45}$ is similar to that in the plane $L_0$ in that when the azimuth angle $\chi$ is 0°, the degree of polarization of light is highest; however, with increasing absolute value of the azimuth angle $\chi$, the degree of polarization of light in the plane $L_{45}$ significantly decreases. Specifically, when the azimuth angle $\chi$ is not less than 40°, the degree of polarization of light is reduced to one half or less of the degree of polarization of light obtained when the azimuth angle $\chi$ is 0°. Furthermore, when the azimuth angle $\chi$ is not less than 50°, the degree of polarization of light is reduced to one third or less of the degree of polarization of light obtained when the azimuth angle $\chi$ is 0°. As such, the degree of polarization of light from a semiconductor light-emitting chip emitting polarized light varies among the planes $L_0$, $L_{45}$, and $L_{90}$.

In contrast, the luminous intensity distribution in the plane $L_{45}$ is similar to that in the plane $L_{90}$ as illustrated in FIG. 47B, and when the azimuth angle $\chi$ is about ±60°, both of the luminous intensity distributions characteristically have a peak. When the azimuth angle $\chi$ is within the range from 10° to 80°, the light intensity is higher than that obtained when the azimuth angle $\chi$ is equal to 0°, i.e., that in the normal line direction. The luminous intensity distribution characteristic in the plane $L_0$ has high light intensities when the azimuth angle $\chi$ is within the range from −30° to +30°, and the light intensity monotonously decreases when the absolute value of the azimuth angle $\chi$ is greater than 30. As such, the luminous intensity distribution of a semiconductor light-emitting chip 100 emitting polarized light in the plane $L_0$ is different from the luminous intensity distribution in each of the planes $L_{45}$ and $L_{90}$.

Second Comparative Example

The semiconductor light-emitting device according to the second comparative example will be described below.

The semiconductor light-emitting device according to the second comparative example includes a protrusion/recess structure provided on a light extraction surface of the semiconductor light-emitting chip 100 of the semiconductor light-emitting device without the reflector illustrated in FIGS. 46A and 46B. The protrusion/recess structure includes two-dimensionally arranged hemispheric raised portions having a radius of about 5 μm. Here, the protrusion/recess structure is not illustrated in the figure.

A semiconductor light-emitting chip 100 including an active layer having a growth surface that is an m-plane was fabricated in a manner similar to that in the second example, and was mounted on a mounting substrate 101. In this state, the measured wavelength of light emitted from the semiconductor light-emitting device at an operating current of 10 mA was 445 nm. The degree of polarization of light emitted along the normal line direction was 0.42.

Figure 48A:
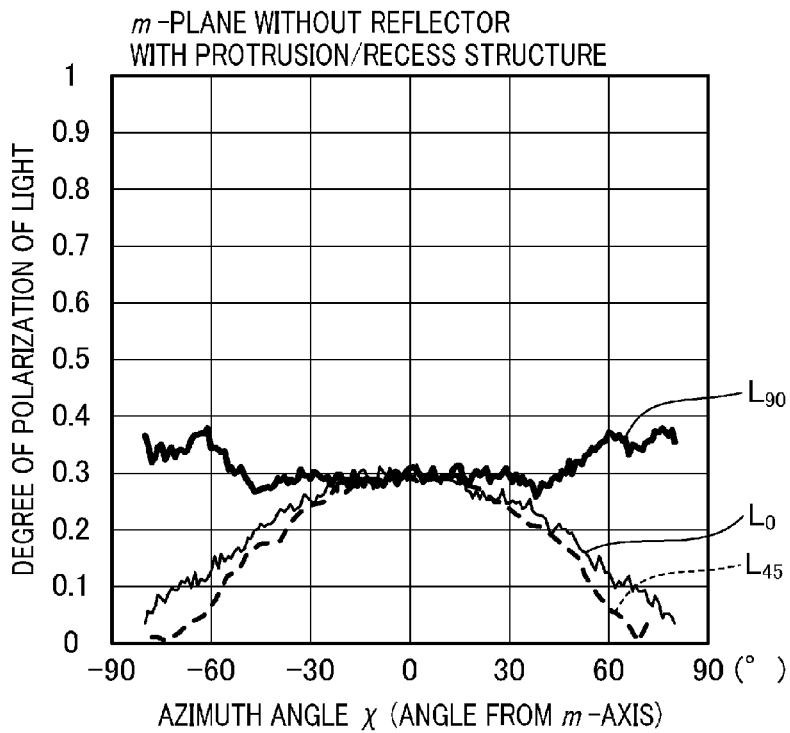
FIG. 48A is a graph illustrating the degree of polarization of light from a semiconductor light-emitting device according to a second comparative example.
Figure 48B:
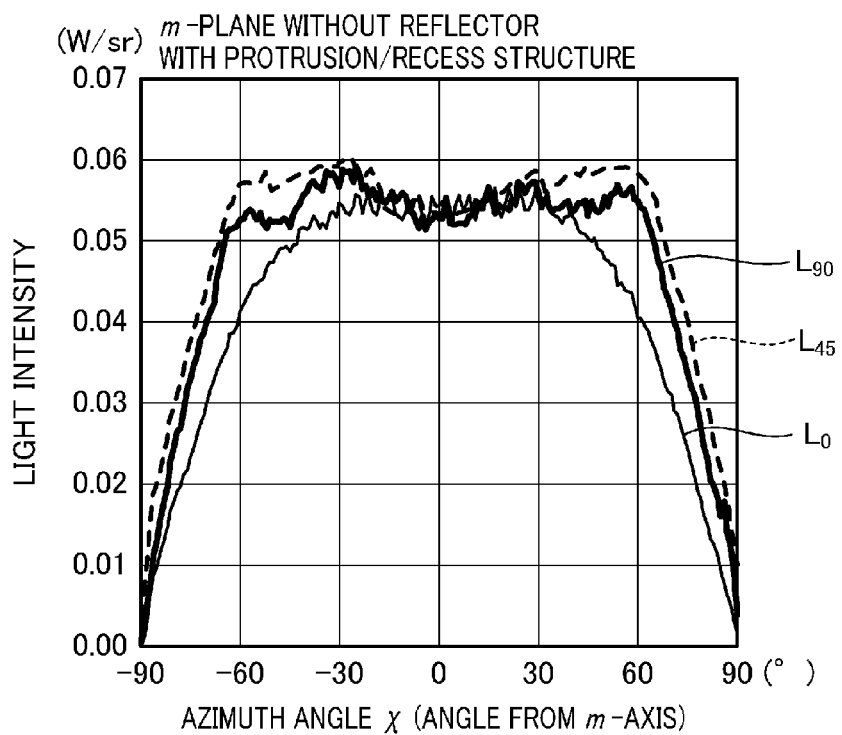
FIG. 48B is a graph illustrating the luminous intensity distribution of the semiconductor light-emitting device according to the second comparative example.

FIGS. 48A and 48B illustrate the degree of polarization of light from the semiconductor light-emitting device according to the second comparative example, and the luminous intensity distribution of the semiconductor light-emitting device, respectively. The thin solid line in each of these figures illustrates the corresponding property in the plane $L_0$, the broken line therein illustrates the corresponding property in the plane $L_{45}$, and the thick solid line therein illustrates the corresponding property in the plane $L_{90}$.

First, also when the azimuth angle χ is within the range from −80° to +80°, the degree of polarization of light in the plane $L_{90}$ is kept substantially constant as illustrated in FIG. 48A. When the azimuth angle χ is 0°, the degree of polarization of light in the plane $L_0$ is highest, and with increasing absolute value of the azimuth angle χ, the degree of polarization of light in the plane $L_0$ gently decreases. The degree of polarization of light in the plane $L_{45}$ is similar to that in the plane $L_0$ in that when the azimuth angle χ is 0°, the degree of polarization of light is highest; however, with increasing absolute value of the azimuth angle χ, the degree of polarization of light in the plane $L_{45}$ significantly decreases. Specifically, when the azimuth angle χ is not less than 45°, the degree of polarization of light is reduced to substantially one half or less of the degree of polarization of light obtained when the azimuth angle χ is 0°. Furthermore, when the azimuth angle χ is not less than 50°, the degree of polarization of light is reduced to substantially one third or less of the degree of polarization of light obtained when the azimuth angle χ is 0°. As such, the degree of polarization of light from a semiconductor light-emitting chip emitting polarized light varies among the planes $L_0$, $L_{45}$, and $L_{90}$.

In contrast, the luminous intensity distribution in the plane $L_{45}$ is similar to that in the plane $L_{90}$ as illustrated in FIG. 48B, and when the azimuth angle χ is about ±60°, both of the luminous intensity distributions characteristically have a peak. When the azimuth angle χ is within the range from 10° to 80°, the light intensity is higher than that obtained when the azimuth angle χ is equal to 0°, i.e., that in the normal line direction. The luminous intensity distribution characteristic in the plane $L_0$ has high light intensities when the azimuth angle χ is within the range from −30° to +30°, and the light intensity monotonously decreases when the absolute value of the azimuth angle χ is greater than 30. As such, the luminous intensity distribution of a semiconductor light-emitting chip emitting polarized light in the plane $L_0$ is different from the luminous intensity distribution in each of the planes $L_{45}$ and $L_{90}$.

Third Comparative Example

The semiconductor light-emitting device according to the third comparative example will be described below.

The semiconductor light-emitting device according to the third comparative example is a semiconductor light-emitting device which includes an active layer having a semipolar (20-2-1) plane as a growth surface and in which a reflector is not provided. Note that in the present comparative example, a protrusion/recess structure is not provided on a light extraction surface of the semiconductor light-emitting chip 100.

A semiconductor light-emitting chip 100 including an active layer having a growth surface that is a (20-2-1) plane was fabricated in a manner similar to that in the third example, and was mounted on a mounting substrate 101. This provides a semiconductor light-emitting device having a configuration similar to that of the semiconductor light-emitting device illustrated in FIGS. 46A and 46B. In this state, the measured wavelength of light emitted from the semiconductor light-emitting device at an operating current of 10 mA was 441 nm. The degree of polarization of light emitted along the normal line direction was 0.68.

FIGS. 49A and 49B illustrate the degree of polarization of light from the semiconductor light-emitting device according to the third comparative example, and the luminous intensity distribution of the semiconductor light-emitting device, respectively. The thin solid line in each of these figures illustrates the corresponding property in the plane $L_0$, the broken line therein illustrates the corresponding property in the plane $L_{45}$, and the thick solid line therein illustrates the corresponding property in the plane $L_{90}$.

First, also when the azimuth angle χ is within the range from −80° to +80°, the degree of polarization of light in the plane $L_{90}$ is kept high as illustrated in FIG. 49A. When the azimuth angle χ is 0°, the degree of polarization of light in the plane $L_0$ is highest, and with increasing absolute value of the azimuth angle χ, the degree of polarization of light in the plane $L_0$ gently decreases. The degree of polarization of light in the plane $L_{45}$ is similar to that in the plane $L_0$ in that when the azimuth angle χ is 0°, the degree of polarization of light is highest; however, with increasing absolute value of the azimuth angle χ, the degree of polarization of light in the plane $L_{45}$ significantly decreases. Specifically, when the azimuth angle χ is not less than 40°, the degree of polarization of light is reduced to substantially one half or less of the degree of polarization of light obtained when the azimuth angle χ is 0°. Furthermore, when the azimuth angle χ is not less than 60°, the degree of polarization of light is reduced to one third or less of the degree of polarization of light obtained when the azimuth angle χ is 0°. As such, the degree of polarization of light from a semiconductor light-emitting chip emitting polarized light varies among the planes $L_0$, $L_{45}$, and $L_{90}$.

In contrast, the luminous intensity distribution in the plane $L_{45}$ is similar to that in the plane $L_{90}$ as illustrated in FIG. 49B, and when the azimuth angle χ is about ±60°, both of the luminous intensity distributions characteristically have a peak. When the azimuth angle χ is within the range from 10° to 80°, the light intensity is higher than that obtained when the azimuth angle χ is equal to 0°, i.e., that in the normal line direction. Meanwhile, when the azimuth angle χ is about ±40°, the luminous intensity distribution in the plane $L_0$ characteristically has a peak. As such, the luminous intensity distribution of a semiconductor light-emitting chip emitting polarized light in the plane $L_0$ is different from the luminous intensity distribution in each of the planes $L_{45}$ and $L_{90}$.

Note that each embodiment and each variation described above can be accordingly combined with the configuration of another one of the embodiments or the variations thereof. Although in the embodiments and the variations described above, specific shapes of the reflector in plan view have been used as examples, the shape of the reflector is not limited to those described above. For example, the reflector may have another polygonal shape, or a shape other than a polygonal shape in plan view. The shape of the reflective surface in plan view is not limited to those described in the embodiments and the variations, but the reflective surface may have another polygonal shape, or a shape other than a polygonal shape.

A semiconductor light-emitting device according to an aspect of the present disclosure is applicable to, for example, lighting equipment, a headlamp of a vehicle, or a spot lamp.

The invention claimed is:

1. A semiconductor light-emitting device comprising:
   a semiconductor light-emitting chip having a growth surface that is a nonpolar or semipolar plane, and emitting polarized light; and
   a reflection member having a reflective surface off which the polarized light is reflected, wherein
   the reflective surface reflects at least a part of light in a plane $L_{45}$ in a normal line direction of the growth surface of the semiconductor light-emitting chip, where the plane $L_{45}$ represents a plane oriented at an angle of 45° to a polarization direction of the polarized light;
   the reflective surface of the reflection member includes a plurality of reflective surfaces;
   the plurality of reflective surfaces are arranged such that a shape formed by the reflective surfaces when viewed in plan is square;
   an angle $\theta 2$ is not less than 17° and not more than 73°, where the angle $\theta 2$ is an angle between the direction of polarization of the polarized light and a side of the shape formed by the reflective surfaces;
   the semiconductor light-emitting chip includes at least four semiconductor light-emitting chips;
   the at least four semiconductor light-emitting chips are arranged in a matrix such that directions of polarization of light from the at least four semiconductor light-emitting chips are identical; and
   D2 is less than D1, where D1 represents a distance between adjacent two of the at least four semiconductor light-emitting chips arranged in a direction perpendicular to the directions of polarization of the light, and D2 represents a distance between adjacent two of the at least four semiconductor light-emitting chips arranged in a direction parallel to the directions of polarization of the light.

2. The semiconductor light-emitting device of claim 1, wherein
   the angle $\theta 2$ is not less than 30° and not more than 60°.

3. The semiconductor light-emitting device of claim 1, wherein
   the cross section of the reflective surface taken along a direction perpendicular to the growth surface of the semiconductor light-emitting chip includes a line, a curve, or a combination thereof, and
   an arithmetic average inclination angle $\Delta\theta 1$ is not less than 20° and not more than 40°, where the arithmetic average inclination angle $\Delta\theta 1$ represents an angle between the reflective surface and the direction of the normal line to the growth surface of the semiconductor light-emitting chip when the reflective surface is viewed in cross section.

4. The semiconductor light-emitting device of claim 1, corner portions of the shape formed by the reflective surfaces when viewed in plan has a curved surface, and
   a curvature R of the curved surface is less than a length of each of sides of the semiconductor light-emitting chip.

5. The semiconductor light-emitting device of claim 1, wherein
   a protrusion/recess structure is formed on a light extraction surface of the semiconductor light-emitting chip.

6. The semiconductor light-emitting device of claim 1, further comprising:
   a light-transmissive member covering the semiconductor light-emitting chip.

7. The semiconductor light-emitting device of claim 1, further comprising:
   a wavelength conversion member covering the semiconductor light-emitting chip.

8. The semiconductor light-emitting device of claim 1, wherein
   a linear reflectivity of the reflective surface is higher than a diffuse reflectivity of the reflective surface.

9. The semiconductor light-emitting device of claim 1, wherein
   a surface roughness of the reflective surface is not more than 100 nm.

10. A semiconductor light-emitting device comprising:
    a semiconductor light-emitting chip having a growth surface that is a nonpolar or semipolar plane, and emitting polarized light; and
    a reflection member having a reflective surface off which the polarized light is reflected, wherein
    the reflective surface reflects at least a part of light in a plane $L_{45}$ in a normal line direction of the growth surface of the semiconductor light-emitting chip, where the plane $L_{45}$ represents a plane oriented at an angle of 45° to a polarization direction of the polarized light;
    the reflective surface of the reflection member includes a plurality of reflective surfaces;
    the plurality of reflective surfaces are arranged such that a shape formed by the reflective surfaces when viewed in plan is rectangular;
    an angle $\theta 2$ is not less than 20° and not more than 70°, where the angle $\theta 2$ is an angle between the direction of polarization of the polarized light and a long side of the shape formed by the reflective surfaces;
    the semiconductor light-emitting chip includes at least four semiconductor light-emitting chips;
    the at least four semiconductor light-emitting chips are arranged in a matrix such that directions of polarization of light from the at least four semiconductor light-emitting chips are identical; and
    D2 is less than D1, where D1 represents a distance between adjacent two of the at least four semiconductor light-emitting chips arranged in a direction perpendicular to the directions of polarization of the light, and D2 represents a distance between adjacent two of the at least four semiconductor light-emitting chips arranged in a direction parallel to the directions of polarization of the light.

11. The semiconductor light-emitting device of claim 10, wherein
    the angle $\theta 2$ is not less than 35° and not more than 55°.

12. The semiconductor light-emitting device of claim 10, wherein
    the cross section of the reflective surface taken along a direction perpendicular to the growth surface of the semiconductor light-emitting chip includes a line, a curve, or a combination thereof, and
    an arithmetic average inclination angle $\Delta\theta 1$ is not less than 20° and not more than 40°, where the arithmetic average inclination angle $\Delta\theta 1$ represents an angle between the reflective surface and the direction of the normal line to the growth surface of the semiconductor light-emitting chip when the reflective surface is viewed in cross section.

13. The semiconductor light-emitting device of claim 10,
corner portions of the shape formed by the reflective surfaces when viewed in plan may have a curved surface, and
a curvature R of the curved surface is less than a length of each of sides of the semiconductor light-emitting chip.

14. The semiconductor light-emitting device of claim 10, wherein
a protrusion/recess structure is formed on a light extraction surface of the semiconductor light-emitting chip.

15. The semiconductor light-emitting device of claim 10, further comprising:
a light-transmissive member covering the semiconductor light-emitting chip.

16. The semiconductor light-emitting device of claim 10, further comprising:
a wavelength conversion member covering the semiconductor light-emitting chip.

17. The semiconductor light-emitting device of claim 10, wherein
a linear reflectivity of the reflective surface is higher than a diffuse reflectivity of the reflective surface.

18. The semiconductor light-emitting device of claim 10, wherein
a surface roughness of the reflective surface is not more than 100 nm.

* * * * *